(12) United States Patent
Matsushita et al.

(10) Patent No.: US 9,929,348 B2
(45) Date of Patent: Mar. 27, 2018

(54) ORGANIC SEMICONDUCTOR COMPOSITION COMPRISING ORGANIC SEMICONDUCTOR MATERIAL AND POLYMER COMPOUND

(71) Applicant: FUJIFILM Corporation, Tokyo (JP)

(72) Inventors: Yasuaki Matsushita, Kanagawa (JP); Tokihiko Matsumura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/935,573

(22) Filed: Nov. 9, 2015

(65) Prior Publication Data
US 2016/0064674 A1    Mar. 3, 2016

Related U.S. Application Data

(63) Continuation of application No. PCT/JP2014/063609, filed on May 22, 2014.

(30) Foreign Application Priority Data

May 23, 2013  (JP) ................................. 2013-108934
Jul. 31, 2013  (JP) ................................. 2013-159131

(51) Int. Cl.
*H01L 29/08* (2006.01)
*H01L 51/00* (2006.01)
(Continued)

(52) U.S. Cl.
CPC ........ *H01L 51/0043* (2013.01); *H01L 51/004* (2013.01); *H01L 51/0035* (2013.01);
(Continued)

(58) Field of Classification Search
CPC ........................ H01L 51/0043; H01L 51/0035
(Continued)

(56) References Cited

U.S. PATENT DOCUMENTS

| | | | | |
|---|---|---|---|---|
| 7,847,284 | B2 | 12/2010 | Hanna et al. | |
| 8,093,347 | B2 * | 1/2012 | Heuft ..................... | B82Y 10/00 |
| | | | | 252/182.12 |

(Continued)

FOREIGN PATENT DOCUMENTS

| | | |
|---|---|---|
| CN | 1656176 A | 8/2005 |
| CN | 101926017 A | 12/2010 |

(Continued)

OTHER PUBLICATIONS

Translation of the International Preliminary Report on Patentability issued in PCT/JP2014/063609 dated Dec. 3, 2015.
(Continued)

*Primary Examiner* — Caleb Henry
(74) *Attorney, Agent, or Firm* — Studebaker & Brackett PC

(57) ABSTRACT

An object of the present invention is to provide an organic semiconductor composition, which improves the insulation reliability of an organic thin-film transistor without greatly reducing the mobility of the organic thin-film transistor, an organic thin-film transistor which is prepared by using the organic semiconductor composition, and electronic paper and a display device which use the organic thin-film transistor. The organic semiconductor composition of the present invention contains an organic semiconductor material
(Continued)

(A) and a polymer compound (B) containing a repeating unit represented by the following Formula (B).

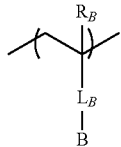

Formula (B)

20 Claims, 1 Drawing Sheet

(51) Int. Cl.
    *H01L 51/05*     (2006.01)
    *C08F 220/14*     (2006.01)
    *C08F 220/20*     (2006.01)

(52) U.S. Cl.
    CPC ........ *H01L 51/0566* (2013.01); *C08F 220/14* (2013.01); *C08F 220/20* (2013.01); *H01L 51/0508* (2013.01); *H01L 51/0545* (2013.01)

(58) Field of Classification Search
    USPC .......................................................... 257/40
    See application file for complete search history.

(56) References Cited

U.S. PATENT DOCUMENTS

| | | | | |
|---|---|---|---|---|
| 8,154,080 | B2* | 4/2012 | Wu | H01L 51/052 |
| | | | | 257/347 |
| 8,178,873 | B2* | 5/2012 | Zhu | H01L 51/052 |
| | | | | 257/40 |
| 8,920,679 | B2* | 12/2014 | Clough | C07F 7/0818 |
| | | | | 252/500 |
| 8,956,555 | B2* | 2/2015 | Caldwell | C07F 7/0818 |
| | | | | 252/500 |
| 2005/0127354 | A1 | 6/2005 | Hanna et al. | |
| 2006/0180199 | A1 | 8/2006 | Lenhard et al. | |
| 2010/0270542 | A1* | 10/2010 | Zhu | H01L 51/0052 |
| | | | | 257/40 |

FOREIGN PATENT DOCUMENTS

| | | |
|---|---|---|
| EP | 1489141 A1 | 12/2004 |
| JP | 2005-005582 A | 1/2005 |
| JP | 2011-508967 A | 3/2011 |
| WO | 2009/079150 A1 | 6/2009 |

OTHER PUBLICATIONS

An Office Action; "Notice of Reasons for Rejection," issued by the Japanese Patent Office dated Oct. 4, 2016, which corresponds to Japanese Patent Application No. 2015-518291 and is related to U.S. Appl. No. 14/935,573; with English language translation.

An Office Action; "Decision of Refusal" issued by the Japanese Patent Office dated Feb. 28, 2017, which corresponds to Japanese Patent Application No. 2015-518291 and is related to U.S. Appl. No. 14/935,573; with English language translation.

International Search Report, PCT/JP2014/063609, dated Jul. 1, 2014.

The extended European search report issued by the European Patent Office dated Aug. 19, 2016, which corresponds to European Patent Application No. 14800286.8-1555 and is related to U.S. Appl. No. 14/935,573.

The partial supplementary European search report issued by the European Patent Office dated Apr. 18, 2016, which corresponds to European Patent Application No. 14800286.8-1555 and is related to U.S. Appl. No. 14/935,573.

The First Office Action issued by the Chinese Patent Office dated Mar. 22, 2017, which corresponds to Chinese Patent Application No. 201480029787.2 and is related to U.S. Appl. No. 14/935,573; with English language translation.

* cited by examiner

ORGANIC SEMICONDUCTOR COMPOSITION COMPRISING ORGANIC SEMICONDUCTOR MATERIAL AND POLYMER COMPOUND

CROSS-REFERENCE TO RELATED APPLICATIONS

This application is a Continuation of PCT International Application No. PCT/JP2014/063609 filed on May 22, 2014, which claims priority under 35 U.S.C. § 119(a) to Japanese Patent Application No. 2013-108934 filed on May 23, 2013 and Japanese Patent Application No. 2013-159131 filed on Jul. 31, 2013. Each of the above applications is hereby expressly incorporated by reference, in its entirety, into the present application.

BACKGROUND OF THE INVENTION

1. Field of the Invention

The present invention relates to an organic semiconductor composition, an organic thin-film transistor, electronic paper, and a display device.

2. Description of the Related Art

In apparatuses using a logical circuit such as a field effect transistor (FET), RF tag (RFID), or memory used in a liquid crystal display or an organic EL display, an organic thin-film transistor (organic TFT) having an organic semiconductor film (organic semiconductor layer) is used, because the use of the organic TFT makes it possible to lighten the weight of the apparatus, reduce the cost, and make the apparatus flexible.

In recent years, as expectations for the organic thin-film transistor have increased, the improvement of mobility (particularly, field effect mobility), stability, and the like have been required for the organic thin-film transistor.

Under these circumstances, JP2005-5582A discloses an organic thin-film transistor in which an organic semiconductor layer is formed of a composition containing an antioxidant so as to reduce the oxidation-induced deterioration of the organic semiconductor layer.

SUMMARY OF THE INVENTION

As a result of preparing an organic thin-film transistor by using the composition disclosed in JP2005-5582A, the inventors of the present invention found that the mobility of the organic thin-film transistor was greatly reduced. Furthermore, as a result of performing a service life test, the inventors found that the insulation reliability between source/drain electrodes did not satisfy the currently required level.

The present invention has been made under the aforementioned current circumstances, and an object thereof is to provide an organic semiconductor composition, which improves the insulation reliability of an organic thin-film transistor without greatly reducing the mobility of the organic thin-film transistor, an organic thin-film transistor which is prepared by using the organic semiconductor composition, and electronic paper and a display device which uses the organic thin-film transistor.

In order to achieve the aforementioned object, the inventors of the present invention conducted an intensive examination. As a result, they obtained knowledge that, by mixing an organic semiconductor material with a polymer compound containing a specific repeating unit, an organic semiconductor composition is obtained which improves the insulation reliability of an organic thin-film transistor without greatly reducing the mobility of the organic thin-film transistor. Based on the knowledge, the inventors accomplished the present invention. That is, the inventors of the present invention found that the aforementioned object can be achieved by the following constitution.

(1) An organic semiconductor composition containing an organic semiconductor material (A) and a polymer compound (B) containing a repeating unit represented by Formula (B) which will be described later.

(2) The organic semiconductor composition described in (1), in which a compound represented by Formula (6) is a compound represented by Formula (22) which will be described later.

(3) The organic semiconductor composition described in (1) or (2), in which a compound represented by Formula (8) is a compound selected from the group consisting of Formulae (23a) to (23d) which will be described later.

(4) The organic semiconductor composition described in any one of (1) to (3), in which a compound represented by Formula (1) is a compound selected from the group consisting of compounds represented by Formulae (1-6) to (1-21) which will be described later.

(5) The organic semiconductor composition described in (1), in which a compound represented by Formula (5) is a compound selected from the group consisting of compounds represented by Formulae (51) to (54) which will be described later.

(6) The organic semiconductor composition described in (1), in which in Formula (B), B is a monovalent group, which is formed as a result of removing one hydrogen atom (here, a hydrogen atom of a hydroxyl group is excluded) from a compound represented by Formula (1) or (6) which will be described later, or a group represented by Formula (25) which will be described later.

(7) The organic semiconductor composition described in any one of (1) to (6), in which a weight average molecular weight of the polymer compound (B) is equal to or greater than 5,000.

(8) The organic semiconductor composition described in any one of (1) to (7), in which a molecular weight of the organic semiconductor material (A) is equal to or less than 2,000.

(9) An organic thin-film transistor prepared by using the organic semiconductor composition described in any one of (1) to (8).

(10) Electronic paper using the organic thin-film transistor described in (9).

(11) A display device using the organic thin-film transistor described in (9).

As will be described below, according to the present invention, it is possible to provide an organic semiconductor composition, which improves the insulation reliability of an organic thin-film transistor without greatly reducing the mobility of the organic thin-film transistor, an organic thin-film transistor which is prepared by using the organic semiconductor composition, and electronic paper and a display device which use the organic thin film transistor.

DESCRIPTION OF THE PREFERRED EMBODIMENTS

Figure 1:
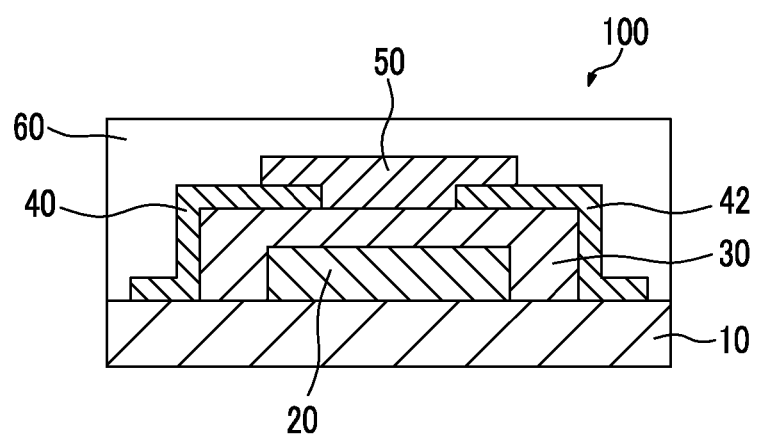
FIG. 1 is a schematic cross-sectional view showing an embodiment of the organic thin-film transistor of the present invention.

[Organic Semiconductor Composition (Composition for an Organic Semiconductor)]

The organic semiconductor composition of the present invention (hereinafter, also referred to as the composition of the present invention) contains an organic semiconductor material (A) and a polymer compound (B) containing a repeating unit represented by Formula (B) which will be described later.

As described above, the composition of the present invention contains the polymer compound containing a specific repeating unit represented by Formula (B) which will be described later. It is considered that, as a result, the composition of the present invention becomes an organic semiconductor composition which improves the insulation reliability of an organic thin-film transistor without greatly reducing the mobility of the organic thin-film transistor.

Presumably, the composition of the present invention may exert the aforementioned effect for the following reason, although the reason is unclear.

In the following section, a case of a bottom contact-type organic thin-film transistor will be specifically described.

When voltage is applied to an organic thin-film transistor, an electrode thereof is ionized due to the action of an electric field, and the ions move (migrate) in an organic semiconductor layer in some cases. If the migration occurs, the insulation properties between source/drain electrodes deteriorate. Particularly, it is considered that in a bottom contact-type organic thin-film transistor, the migration markedly occurs in the vicinity of the interface between an organic semiconductor layer and a gate insulating film.

As will be described later, the polymer compound (B) contained in the composition of the present invention has a specific group, which has an anti-migration site, on a side chain.

It is considered that because the composition of the present invention contains the polymer compound (B), phase separation occurs between the polymer compound (B) and the organic semiconductor material (A) in the organic semiconductor layer, the polymer compound (B) is localized in the interface between the organic semiconductor layer and the gate insulating film, and therefore the migration is effectively inhibited. That is, the polymer compound (B) functions as an excellent migration inhibitor by being localized in a region where migration occurs.

Furthermore, it is considered that because the polymer compound (B) is localized in the interface between the organic semiconductor layer and the gate insulating film as described above, the influence on the mobility of the organic thin-film transistor can be minimized.

Presumably, the aforementioned facts may result from the following mechanism. As shown in Comparative examples 1 and 2 which will be described later, when a specific compound which is considered to have an anti-migration site is mixed alone in the composition without being introduced in a polymer, the aforementioned localization of the compound does not occur, and accordingly, the insulation reliability is improved only to a small extent. Furthermore, because the compound is scattered in the organic semiconductor layer, the organic semiconductor is not sufficiently crystallized, and therefore the mobility is greatly reduced.

Presumably, the aforementioned point may also result from the following mechanism. As shown in Comparative example 3 which will be described later, when a polymer not having an anti-migration site is used, while the aforementioned localization of the polymer occurs, a migration inhibition ability is not obtained. Therefore, the insulation reliability is improved only to a small extent.

In another type of the organic thin-film transistor such as a top contact-type organic thin-film transistor, the same effects as described above are obtained due to the same action as described above.

Hereinafter, each of the components contained in the composition of the present invention will be specifically described.

<(A) Organic Semiconductor Material>

As the organic semiconductor material (A) contained in the composition of the present invention, it is possible to use a known material which is used as an organic semiconductor layer of an organic thin-film transistor (organic semiconductor transistor). Specifically, examples of such a material include pentacenes such as 6,13-bis(triisopropylsilylethynyl)pentacene (TIPS pentacene), tetramethyl pentacene, and perfluoropentacene, anthradithiophenes such as TES-ADT and diF-TES-ADT, benzothienobenzothiophenes such as DPh-BTBT and Cn-BTBT, dinaphthothienothiophenes such as Cn-DNTT, dioxaanthanthrenes such as peri-xanthenoxanthene, rubrenes, fullerenes such as C60 and PCBM, phthalocyanines such as copper phthalocyanine and fluorinated copper phthalocyanine, polythiophenes such as P3RT, PQT, and P3HT, polythienothiophenes such as poly[2,5-bis(3-dodecylthiophen-2-yl)thieno[3,2-b]thiophene] (PBTTT), and the like.

The molecular weight of the organic semiconductor material is not particularly limited. However, in view of the mobility of the organic thin-film transistor, the molecular weight of the organic semiconductor material is preferably equal to or less than 2,000, and more preferably equal to or less than 1,200.

When the organic semiconductor material is a polymer, the molecular weight means a weight average molecular weight.

When the organic semiconductor material is a polymer, the weight average molecular weight thereof is a value that is measured by a gel permeation chromatography (GPC) method and expressed in terms of polystyrene. In the GPC method, the weight average molecular weight is measured by dissolving the organic semiconductor material in tetrahydrofuran and by using high-speed GPC apparatus (HLC-8220GPC) manufactured by TOSOH CORPORATION, TSKgel SuperHZ4000 (manufactured by TOSOH CORPORATION, 4.6 mm I. D.×15 cm) as a column, and tetrahydrofuran (THF) as an eluant.

<(B) Polymer Compound>

The polymer compound (B) contained in the composition of the present invention is a polymer compound containing a repeating unit represented by the following Formula (B). The polymer compound (B) has a specific group (B in Formula (B)), which has an anti-migration site, on a side chain.

The polymer compound (B) may contain a repeating unit other than the repeating unit represented by Formula (B). In the polymer compound (B), the proportion of the repeating unit represented by Formula (B) is preferably equal to or greater than 5% by mass, more preferably equal to or greater than 10% by mass, and even more preferably equal to or greater than 20% by mass.

A plurality of repeating units represented by Formula (B) contained in the polymer compound (B) may be the same as or different from each other.

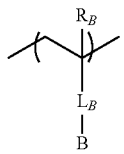

Formula (B)

In Formula (B), RB represents a hydrogen atom or an alkyl group which has 1 to 4 carbon atoms and may have a substituent. Particularly, RB is preferably a hydrogen atom or a methyl group.

LB represents a single bond or a divalent organic group. Examples of the divalent organic group include a linear, branched, or cyclic divalent aliphatic hydrocarbon group (for example, an alkylene group such as a methylene group, an ethylene group, or a propylene group), a linear, branched, or cyclic divalent aromatic hydrocarbon group (for example, a phenylene group), —O—, —S—, —$SO_2$—, —$NR_{222}$—, —CO—, —NH—, —COO—, —$CONR_{222}$—, —O—CO—O—, —$SO_3$—, —NHCOO—, —$SO_2NR_{222}$—, —NH—CO—NH—, a group obtained by combining two or more kinds of these (for example, an alkyleneoxy group, an alkyleneoxycarbonyl group, or an alkylenecarbonyloxy group), and the like. $R_{222}$ represents a hydrogen atom or an alkyl group having 1 to 5 carbon atoms.

Because the motility of the anti-migration site is enhanced, and the migration inhibition ability is further improved, LB is preferably a divalent organic group.

As a preferred embodiment of $L_B$, a divalent organic group represented by the following Formula (B-1) is exemplified.

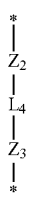

Formula (B-1)

In Formula (B-1), $Z_2$ represents a single bond, an ester group (—COO—), an amide group (—$CONR_{222}$—), or an ether group (—O—). The definition of $R_{222}$ is as described above.

In Formula (B-1), $L_4$ represents a single bond or a divalent organic group. The divalent organic group is preferably a linear, branched, or cyclic divalent aliphatic hydrocarbon group (for example, an alkylene group such as a methylene group, an ethylene group, or a propylene group), a linear, branched, or cyclic divalent aromatic hydrocarbon group (for example, a phenylene group), or a group obtained by combining two or more kinds of these. The group obtained by combining the aforementioned groups may be a group in which the aforementioned groups are combined with each other through an ether group (—O—), an ester group (—COO—), an amide group (—$CONR_{222}$—), a urethane group (—NHCOO—), or a urea group (—NH—CO—NH—). The definition of $R_{222}$ is as described above.

The number of total carbon atoms in $L_4$ is preferably 1 to 15. Herein, the number of total carbon atoms means the number of total carbon atoms contained in $L_4$.

Specific examples of $L_4$ include a methylene group, an ethylene group, a propylene group, a butylene group, a phenylene group, a group formed as a result of substituting these groups with a methoxy group, a hydroxyl group, a chlorine atom, a bromine atom, a fluorine atom, or the like, a group obtained by combining these, and the like.

In Formula (B-1), $Z_3$ represents a single bond, —$CO_2$—, —CO—, —O—CO—O—, —$SO_3$—, —$CONR_{222}$—, —NHCOO—, —O—, —S—, —$SO_2NR_{222}$—, or —$NR_{222}$—. The definition of $R_{222}$ is as described above.

In Formula (B-1), * on the upper side (* adjacent to $Z_2$) represents a position where the divalent organic group is bonded to a carbon atom to which RB in Formula (B) is bonded.

In Formula (B-1), * on the lower side (* adjacent to $Z_3$) represents a position where the divalent organic group is bonded to B in Formula (B).

That is, when $L_B$ is a divalent organic group represented by Formula (B-1), Formula (B) is represented by the following Formula (B-2).

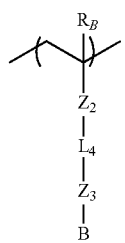

Formula (B-2)

In Formula (B-2), the definition and the preferred embodiment of $R_B$ are the same as those of $R_B$ in Formula (B) described above.

In Formula (B-2), the definition, the specific examples, and the preferred embodiment of each of $Z_2$, $L_4$, and $Z_3$ are the same as those of each of $Z_2$, $L_4$, and $Z_3$ in Formula (B-1) described above.

In Formula (B-2), the definition and the preferred embodiment of B are the same as those of B in Formula (B) which will be described later.

In Formula (B), B represents a monovalent group, which is formed as a result of removing one hydrogen atom (here, a hydrogen atom of a hydroxyl group is excluded) from compounds represented by the following Formulae (1) to (8), or a group represented by the following Formula (25). Herein, the "monovalent group which is formed as a result of removing one hydrogen atom (here, a hydrogen atom of a hydroxyl group is excluded) from compounds represented by Formulae (1) to (8)" means a monovalent group formed as a result of removing any one hydrogen atom, which is other than a hydrogen atom of a hydroxyl group, among hydrogen atoms contained in the compounds represented by Formulae (1) to (8). The group represented by B has an anti-migration site.

(Compound Represented by Formula (1))

First, the compound represented by Formula (1) will be described.

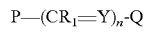

Formula (1)

In Formula (1), each of P and Q independently represents OH, $NR_2R_3$, or $CHR_4R_5$. Here, when n is 0, P and Q do not represent CHR$_4$R$_5$ at the same time, and do not represent OH at the same time. Y represents CR$_6$ or a nitrogen atom.

Each of R$_2$ and R$_3$ independently represents a hydrogen atom or a group which can be substituted with a nitrogen atom.

The group which can be substituted with a nitrogen atom is not particularly limited as long as it can be substituted with a nitrogen atom. Examples of such a group include an alkyl group (including a cycloalkyl group), an alkenyl group (including a cycloalkenyl group and a bicycloalkenyl group), an alkynyl group, an aryl group, a heterocyclic group, alkyl and aryl sulfinyl groups, alkyl and aryl sulfonyl groups, an acyl group, an alkoxycarbonyl group, an aryloxycarbonyl group, a carbamoyl group, a phosphino group, a phosphinyl group, a group obtained by combining these, and the like.

More specifically, preferred examples of such a group include an alkyl group [the alkyl group represents a substituted or unsubstituted linear, branched, or cyclic alkyl group; these also include an alkyl group (preferably an alkyl group having 1 to 30 carbon atoms, for example, methyl, ethyl, n-propyl, isopropyl, t-butyl, n-octyl, eicosyl, 2-chloroethyl, 2-cyanoethyl, or 2-ethylhexyl), a cycloalkyl group (preferably a substituted or unsubstituted cycloalkyl group having 3 to 30 carbon atoms, for example, cyclohexyl, cyclopentyl, or 4-n-dodecylcyclohexyl), a bicycloalkyl group (preferably a substituted or unsubstituted bicycloalkyl group having 5 to 30 carbon atoms, that is, a monovalent group formed as a result of removing one hydrogen atom from bicycloalkane having 5 to 30 carbon atoms, for example, bicyclo[1.2.2]pentan-2-yl or bicyclo[2.2.2]octan-3-yl), a tricyclo structure having a large number of cyclic structures, and the like; an alkyl group (for example, an alkyl group in an alkylthio group) in a substituent which will be described below also represents the alkyl group having the concept described above], an alkenyl group [a substituted or unsubstituted linear, branched, or cyclic alkenyl group; these include an alkenyl group (preferably a substituted or unsubstituted alkenyl group having 2 to 30 carbon atoms, for example, vinyl, allyl, prenyl, geranyl, or oleyl), a cycloalkenyl group (preferably a substituted or unsubstituted cycloalkenyl group having 3 to 30 carbon atoms, that is, a monovalent group formed as a result of removing one hydrogen atom of cycloalkene having 3 to 30 carbon atoms, for example, 2-cyclopenten-1-yl or 2-cyclohexen-1-yl), and a bicycloalkenyl group (a substituted or unsubstituted bicycloalkenyl group, preferably, a substituted or unsubstituted bicycloalkenyl group having 5 to 30 carbon atoms, that is, a monovalent group formed as a result of removing one hydrogen atom of bicycloalkene having one double bond, for example, bicyclo[2.2.1]hept-2-en-1-yl or bicyclo[2.2.2]oct-2-en-4-yl)], an alkynyl group (preferably a substituted or unsubstituted alkynyl group having 2 to 30 carbon atoms, for example, ethynyl, propargyl, or a trimethylsilylethynyl group), an aryl group (preferably a substituted or unsubstituted aryl group having 6 to 30 carbon atoms, for example, phenyl, p-tolyl, naphthyl, m-chlorophenyl, or o-hexadecanoylaminophenyl), a heterocyclic group (preferably a monovalent group which is formed as a result of removing one hydrogen atom from a 5-membered or 6-membered substituted or unsubstituted aromatic or non-aromatic heterocyclic compound, more preferably, a 5-membered or 6-membered aromatic heterocyclic group having 3 to 30 carbon atoms, for example, 2-furanyl, 2-thienyl, 2-pyrimidinyl, or 2-benzothiazolinyl), alkyl and aryl sulfinyl groups (preferably a substituted or unsubstituted alkyl sulfinyl group having 1 to 30 carbon atoms and a substituted or unsubstituted aryl sulfinyl group having 6 to 30 carbon atoms, for example, methyl sulfinyl, ethyl sulfinyl, phenyl sulfinyl, and p-methylphenyl sulfinyl), alkyl and aryl sulfonyl groups (preferably a substituted or unsubstituted alkyl sulfonyl group having 1 to 30 carbon atoms and a substituted or unsubstituted aryl sulfonyl group having 6 to 30 carbon atoms, for example, methyl sulfonyl, ethyl sulfonyl, phenyl sulfonyl, and p-methylphenyl sulfonyl), an acyl group (preferably a formyl group, a substituted or unsubstituted alkyl carbonyl group having 2 to 30 carbon atoms, a substituted or unsubstituted aryl carbonyl group having 7 to 30 carbon atoms, or a substituted or unsubstituted heterocyclic carbonyl group having 4 to 30 carbon atoms that is bonded to a carbonyl group through carbon atoms, for example, acetyl, pivaloyl, 2-chloroacetyl, stearoyl, benzoyl, p-n-octyloxyphenyl carbonyl, 2-pyridyl carbonyl, or 2-furyl carbonyl), an aryloxycarbonyl group (preferably a substituted or unsubstituted aryloxycarbonyl group having 7 to 30 carbon atoms, for example, phenoxycarbonyl, o-chlorophenoxycarbonyl, m-nitrophenoxycarbonyl, or p-t-butylphenoxycarbonyl), an alkoxycarbonyl group (preferably a substituted or unsubstituted alkoxycarbonyl group having 2 to 30 carbon atoms, for example, methoxycarbonyl, ethoxycarbonyl, t-butoxycarbonyl, or n-octadecyloxycarbonyl), a carbamoyl group (preferably substituted or unsubstituted carbamoyl having 1 to 30 carbon atoms, for example, carbamoyl, N-methyl carbamoyl, N,N-dimethyl carbamoyl, N,N-di-n-octyl carbamoyl, or N-(methylsulfonyl)carbamoyl), a phosphino group (preferably a substituted or unsubstituted phosphino group having 2 to 30 carbon atoms, for example, dimethylphosphino, diphenylphosphino, or methylphenoxyphosphino), and a phosphinyl group (preferably a substituted or unsubstituted phosphinyl group having 2 to 30 carbon atoms, for example, phosphinyl, dioctyloxyphosphinyl, or diethoxyphosphinyl).

Among the aforementioned functional groups, those having a hydrogen atom may be further substituted after the hydrogen atom is removed.

The alkyl group represented by R$_2$ and R$_3$ represents a substituted or unsubstituted linear, branched, or cyclic alkyl group. The alkyl group preferably has 1 to 50 carbon atoms, more preferably has 1 to 30 carbon atoms, and particularly preferably has 1 to 20 carbon atoms.

Preferred examples of the alkyl group include methyl, ethyl, n-propyl, isopropyl, cyclopropyl, butyl, isobutyl, t-butyl, sec-butyl, pentyl, isopentyl, neopentyl, t-pentyl, hexyl, cyclohexyl, heptyl, cyclopentyl, octyl, 2-ethylhexyl, nonyl, decyl, dodecyl, tetradecyl, hexadecyl, octadecyl, eicosyl, docosyl, triacontyl, and the like. Among these, methyl, ethyl, n-propyl, isopropyl, butyl, isobutyl, t-butyl, sec-butyl, pentyl, isopentyl, neopentyl, hexyl, cyclohexyl, octyl, 2-ethylhexyl, dodecyl, hexadecyl, and octadecyl are more preferable, and methyl, ethyl, n-propyl, isopropyl, butyl, t-butyl, pentyl, isopentyl, hexyl, cyclohexyl, octyl, 2-ethylhexyl, dodecyl, hexadecyl, and octadecyl are particularly preferable.

The alkyl group may contain a linking group such as —CO—, —NH—, —O—, —S—, or a group obtained by combining these. When the alkyl group contains such a linking group, the position of the linking group is not particularly limited, and the linking group may be positioned at the terminal of the alkyl group. For example, the alkyl group may be in the form of —S—R$_x$ (R$_x$: alkyl group).

The alkyl group represented by R$_2$ and R$_3$ may further have a substituent.

Examples of the substituent include the halogen atom, an alkyl group (including a cycloalkyl group), an alkenyl group (including a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, aryloxycarbonyloxy, an amino group (including an anilino group), an acylamino group, an aminocarbonylamino group, an alkoxycarbonylamino group, an aryloxycarbonylamino group, a sulfamoylamino group, alkyl and aryl sulfonylamino groups, a mercapto group, an alkylthio group, an arylthio group, a heterocyclic thio group, a sulfamoyl group, a sulfo group, alkyl and aryl sulfinyl groups, alkyl and aryl sulfonyl groups, an acyl group, an aryloxycarbonyl group, an alkoxycarbonyl group, a carbamoyl group, aryl and heterocyclic azo groups, an imide group, a phosphino group, a phosphinyl group, a phosphinyloxy group, a phosphinylamino group, a silyl group, and a combination of these.

More specifically, the substituent represents a halogen atom (for example, a fluorine atom, a chlorine atom, a bromine atom, or an iodine atom), an alkyl group [the alkyl group represents a substituted or unsubstituted linear, branched, or cyclic alkyl group; these also include an alkyl group (preferably an alkyl group having 1 to 30 carbon atoms, for example, methyl, ethyl, n-propyl, isopropyl, t-butyl, n-octyl, eicosyl, 2-chloroethyl, 2-cyanoethyl, or 2-ethylhexyl), a cycloalkyl group (preferably a substituted or unsubstituted cycloalkyl group having 3 to 30 carbon atoms, for example, cyclohexyl, cyclopentyl, or 4-n-dodecylcyclohexyl), a bicycloalkyl group (preferably a substituted or unsubstituted bicycloalkyl group having 5 to 30 carbon atoms, that is, a monovalent group formed as a result of removing one hydrogen atom from bicycloalkane having 5 to 30 carbon atoms, for example, bicyclo[1.2.2]heptan-2-yl or bicyclo[2.2.2]octan-3-yl), a tricyclo structure having a large number of cyclic structures, and the like; an alkyl group (for example, an alkyl group in an alkylthio group) in a substituent which will be described below also represents the alkyl group having the concept described above], an alkenyl group [the alkenyl group represents a substituted or unsubstituted linear, branched, or cyclic alkenyl group; these include an alkenyl group (preferably a substituted or unsubstituted alkenyl group having 2 to 30 carbon atoms, for example, vinyl, allyl, prenyl, geranyl, or oleyl), a cycloalkenyl group (preferably a substituted or unsubstituted cycloalkenyl group having 3 to 30 carbon atoms, that is, a monovalent group formed as a result of removing one hydrogen atom of cycloalkene having 3 to 30 carbon atoms, for example, 2-cyclopenten-1-yl or 2-cyclohexen-1-yl), and a bicycloalkenyl group (a substituted or unsubstituted bicycloalkenyl group, preferably, a substituted or unsubstituted bicycloalkenyl group having 5 to 30 carbon atoms, that is, a monovalent group formed as a result of removing one hydrogen atom of bicycloalkene having one double bond, for example, bicyclo[2.2.1]hept-2-en-1-yl or bicyclo[2.2.2]oct-2-en-4-yl)], an alkynyl group (preferably a substituted or unsubstituted alkynyl group having 2 to 30 carbon atoms, for example, ethynyl, propargyl, or a trimethylsilyl ethynyl group), an aryl group (preferably a substituted or unsubstituted aryl group having 6 to 30 carbon atoms, for example, phenyl, p-tolyl, naphthyl, m-chlorophenyl, or o-hexadecanoylaminophenyl), a heterocyclic group (preferably a monovalent group which is formed as a result of removing one hydrogen atom from a 5-membered or 6-membered substituted or unsubstituted aromatic or non-aromatic heterocyclic compound, more preferably, a 5-membered or 6-membered aromatic heterocyclic group having 3 to 30 carbon atoms, for example, 2-furanyl, 2-thienyl, 2-pyrimidinyl, or 2-benzothiazolinyl), a cyano group, a hydroxyl group, a nitro group, a carboxyl group, an alkoxy group (preferably a substituted or unsubstituted alkoxy group having 1 to 30 carbon atoms, for example, methoxy, ethoxy, isopropoxy, t-butoxy, n-octyloxy, or 2-methoxyethoxy), an aryloxy group (preferably a substituted or unsubstituted aryloxy group having 6 to 30 carbon atoms, for example, phenoxy, 2-methylphenoxy, 4-t-butylphenoxy, 3-nitrophenoxy, or 2-tetradecanoylaminophenoxy), a silyloxy group (preferably a silyloxy group having 3 to 20 carbon atoms, for example, trimethylsilyloxy or t-butyldimethylsilyloxy), a heterocyclic oxy group (preferably a substituted or unsubstituted heterocyclic oxy group having 2 to 30 carbon atoms, for example, 1-phenyltetrazol-5-oxy or 2-tetrahydropyranyloxy), an acyloxy group (preferably a formyloxy group, a substituted or unsubstituted alkylcarbonyloxy group having 2 to 30 carbon atoms, or a substituted or unsubstituted arylcarbonyloxy group having 6 to 30 carbon atoms, for example, formyloxy, acetyloxy, pivaloyloxy, stearoyloxy, benzoyloxy, or p-methoxyphenylcarbonyloxy), a carbamoyloxy group (preferably a substituted or unsubstituted carbamoyloxy group having 1 to 30 carbon atoms, for example, N,N-dimethylcarbamoyloxy, N,N-diethylcarbamoyloxy, morpholinocarbonyloxy, N,N-di-n-octylaminocarbonyloxy, or N-n-octylcarbamoyloxy), an alkoxycarbonyloxy group (preferably a substituted or unsubstituted alkoxycarbonyloxy group having 2 to 30 carbon atoms, for example, methoxycarbonyloxy, ethoxycarbonyloxy, t-butoxycarbonyloxy, or n-octylcarbonyloxy), an aryloxycarbonyloxy group (preferably a substituted or unsubstituted aryloxycarbonyloxy group having 7 to 30 carbon atoms, for example, phenoxycarbonyloxy, p-methoxyphenoxycarbonyloxy, or p-n-hexadecyloxyphenoxycarbonyloxy), an amino group (preferably an amino group, a substituted or unsubstituted alkylamino group having 1 to 30 carbon atoms, or a substituted or unsubstituted anilino group having 6 to 30 carbon atoms, for example, amino, methylamino, dimethylamino, anilino, N-methyl-anilino, or diphenylamino), an acylamino group (preferably a formylamino group, a substituted or unsubstituted alkylcarbonylamino group having 1 to 30 carbon atoms, or a substituted or unsubstituted arylcarbonylamino group having 6 to 30 carbon atoms, for example, formylamino, acetylamino, pivaloylamino, lauroylamino, benzoylamino, 3,4,5-tri-n-octyloxyphenylcarbonylamino), an aminocarbonylamino group (preferably substituted or unsubstituted aminocarbonylamino having 1 to 30 carbon atoms, for example, carbamoylamino, N,N-dimethylaminocarbonylamino, N,N-diethylaminocarbonylamino, or morpholinocarbonylamino), an alkoxycarbonylamino group (preferably a substituted or unsubstituted alkoxycarbonylamino group having 2 to 30 carbon atoms, for example, methoxycarbonylamino, ethoxycarbonylamino, t-butoxycarbonylamino, n-octadecyloxycarbonylamino, or N-methyl-methoxycarbonylamino), an aryloxycarbonylamino group (preferably a substituted or unsubstituted aryloxycarbonylamino group having 7 to 30 carbon atoms, for example, phenoxycarbonylamino, p-chlorophenoxycarbonylamino, or m-n-octyloxyphenoxycarbonylamino), a sulfamoylamino group (preferably a substituted or unsubstituted sulfamoylamino group having 0 to 30 carbon atoms, for example, sulfamoylamino, N,N-dimethylaminosulfonylamino, or N-n-octylaminosulfonylamino), alkyl and aryl sulfonylamino groups (preferably substituted or unsubstituted alkylsulfonylamino having 1 to 30 carbon atoms and substituted or unsubstituted arylsulfonylamino having 6 to 30 carbon atoms, for example, methylsulfonylamino, butylsulfonylamino, phenylsulfonylamino, 2,3,5-trichlorophenylsulfonylamino, or p-methylphenylsulfonylamino), a mercapto group, an alkylthio group (preferably a substituted or unsubstituted alkylthio group having 1 to 30 carbon atoms, for example, methylthio, ethylthio, or n-hexadecylthio), an arylthio group (preferably substituted or unsubstituted arylthio having 6 to 30 carbon atoms, for example, phenylthio, p-chlorophenylthio, or m-methoxyphenylthio), a heterocyclic thio group (preferably a substituted or unsubstituted heterocyclic thio group having 2 to 30 carbon atoms, for example, 2-benzothiazolylthio or 1-phenyltetrazol-5-ylthio), a sulfamoyl group (preferably a substituted or unsubstituted sulfamoyl group having 0 to 30 carbon atoms, for example, N-ethylsulfamoyl, N-(3-dodecyloxypropyl)sulfamoyl, N,N-dimethylsulfamoyl, N-acetylsulfamoyl, N-benzoylsulfamoyl, or N—(N'-phenylcarbamoyl)sulfamoyl), a sulfo group, alkyl and aryl sulfinyl groups (preferably a substituted or unsubstituted alkylsulfinyl group having 1 to 30 carbon atoms and a substituted or unsubstituted arylsulfinyl group having 6 to 30 carbon atoms, for example, methylsulfinyl, ethylsulfinyl, phenylsulfinyl, or p-methylphenylsulfinyl), alkyl and aryl sulfonyl groups (preferably a substituted or unsubstituted alkylsulfonyl group having 1 to 30 carbon atoms and a substituted or unsubstituted arylsulfonyl group having 6 to 30 carbon atoms, for example, methylsulfonyl, ethylsulfonyl, phenylsulfonyl, and p-methylphenylsulfonyl), an acyl group (preferably a formyl group, a substituted or unsubstituted alkylcarbonyl group having 2 to 30 carbon atoms, a substituted or unsubstituted arylcarbonyl group having 7 to 30 carbon atoms, or a substituted or unsubstituted heterocyclic carbonyl group having 4 to 30 carbon atoms that is bonded to a carbonyl group through carbon atoms, for example, acetyl, pivaloyl, 2-chloroacetyl, stearoyl, benzoyl, p-n-octyloxyphenylcarbonyl, 2-pyridylcarbonyl, or 2-furylcarbonyl), an aryloxycarbonyl group (preferably a substituted or unsubstituted aryloxycarbonyl group having 7 to 30 carbon atoms, for example, phenoxycarbonyl, o-chlorophenoxycarbonyl, m-nitrophenoxycarbonyl, or p-t-butylphenoxycarbonyl), an alkoxycarbonyl group (preferably a substituted or unsubstituted alkoxycarbonyl group having 2 to 30 carbon atoms, for example, methoxycarbonyl, ethoxycarbonyl, t-butoxycarbonyl, or n-octadecyloxycarbonyl), a carbamoyl group (preferably substituted or unsubstituted carbamoyl having 1 to 30 carbon atoms, for example, carbamoyl, N-methylcarbamoyl, N,N-dimethylcarbamoyl, N,N-di-n-octylcarbamoyl, or N-(methylsulfonyl)carbamoyl), aryl and heterocyclic azo groups (preferably a substituted or unsubstituted arylazo group having 6 to 30 carbon atoms and a substituted or unsubstituted heterocyclic azo group having 3 to 30 carbon atoms, for example, phenylazo, p-chlorophenylazo, and 5-ethylthio-1,3,4-thiadiazol-2-ylazo), an imide group (preferably N-succinimide or N-phthalimide), a phosphino group (preferably a substituted or unsubstituted phosphino group having 2 to 30 carbon atoms, for example, dimethylphosphino, diphenylphosphino, or methylphenoxyphosphino), a phosphinyl group (preferably a substituted or unsubstituted phosphinyl group having 2 to 30 carbon atoms, for example, phosphinyl, dioctyloxyphosphinyl, or diethoxyphosphinyl), a phosphinyloxy group (preferably a substituted or unsubstituted phosphinyloxy group having 2 to 30 carbon atoms, for example, diphenoxyphosphinyloxy or dioctyloxyphosphinyloxy), a phosphinylamino group (preferably a substituted or unsubstituted phosphinylamino group having 2 to 30 carbon atoms, for example, dimethoxyphosphinylamino or dimethylaminophosphinylamino), or a silyl group (preferably a substituted or unsubstituted silyl group having 3 to 30 carbon atoms, for example, trimethylsilyl, t-butyldimethylsilyl, or phenyldimethylsilyl).

Among the aforementioned functional groups, those having a hydrogen atom may be further substituted with the aforementioned groups after the hydrogen atom is removed. Examples of such functional groups include an alkylcarbonylaminosulfonyl group, an arylcarbonylaminosulfonyl group, an alkylsulfonylaminocarbonyl group, an arylsulfonylaminocarbonyl group, and the like. Examples of these functional groups include methylsulfonylaminocarbonyl, p-methylphenylsulfonylaminocarbonyl, acetylaminosulfonyl, a benzoylaminosulfonyl group, and the like.

The alkenyl group represented by $R_2$ and $R_3$ represents a substituted or unsubstituted linear, branched, or cyclic alkenyl group. Such an alkenyl group preferably has 2 to 50 carbon atoms, more preferably has 2 to 30 carbon atoms, and particularly preferably has 2 to 20 carbon atoms. Preferred examples of the alkenyl group include vinyl, allyl, prenyl, geranyl, oleyl, 2-cyclopenten-1-yl, 2-cyclohexen-1-yl, bicyclo[2.2.1]hept-2-en-1-yl, bicyclo[2.2.2]oct-2-en-4-yl, and the like. Among these, vinyl, allyl, prenyl, geranyl, oleyl, 2-cyclopenten-1-yl, and 2-cyclohexen-1-yl are more preferable.

The alkenyl group represented by $R_2$ and $R_3$ may further have a substituent. Examples of the substituent include the substituents of the alkyl group represented by $R_2$ and $R_3$ described above.

Just like the aforementioned alkyl group, the alkenyl group may contain a linking group such as —CO—, —NH—, —O—, —S—, or a group obtained by combining these.

The alkynyl group represented by $R_2$ and $R_3$ represents a substituted or unsubstituted linear, branched, or cyclic alkynyl group. The alkynyl group preferably has 2 to 50 carbon atoms, more preferably has 2 to 30 carbon atoms, and particularly preferably has 2 to 20 carbon atoms. Preferred examples of the alkynyl group include ethynyl, propargyl, and the like.

The alkynyl group represented by $R_2$ and $R_3$ may further have a substituent. Examples of the substituent include the substituents of the alkyl group represented by $R_2$ and $R_3$ described above.

Just like the aforementioned alkyl group, the alkynyl group may contain a linking group such as —CO—, —NH—, —O—, —S—, or a group obtained by combining these.

The aryl group represented by $R_2$ and $R_3$ represents a substituted or unsubstituted aryl group. The aryl group preferably has 6 to 50 carbon atoms, more preferably has 6 to 30 carbon atoms, and particularly preferably has 6 to 20 carbon atoms. Preferred examples of the aryl group include phenyl, 2-methylphenyl, 3-methylphenyl, 4-methylphenyl, 2-ethylphenyl, 4-ethylphenyl, 2,4-dimethylphenyl, 2,6-dimethylphenyl, 2,4,6-trimethylphenyl, 1-naphthyl, 2-naphthyl, 2-chlorophenyl, 3-chlorophenyl, 4-chlorophenyl, 2-methoxyphenyl, 3-methoxyphenyl, 4-methoxyphenyl, 2-benzylphenyl, 4-benzylphenyl, 2-methylcarbonylphenyl, 4-methylcarbonylphenyl, and the like.

Among these, phenyl, 2-methylphenyl, 4-methylphenyl, 2-ethylphenyl, 4-ethylphenyl, 2,4-dimethylphenyl, 2,6-dimethylphenyl, 2,4,6-trimethylphenyl, 1-naphthyl, 2-naphthyl, 2-chlorophenyl, 4-chlorophenyl, 2-methoxyphenyl, 3-methoxyphenyl, 4-methoxyphenyl, 2-benzylphenyl, 4-benzylphenyl, and the like are more preferable, and phenyl, 2-methylphenyl, 4-methylphenyl, 2,4-dimethylphenyl, 2,6-dimethylphenyl, 2,4,6-trimethylphenyl, 1-naphthyl, 2-naphthyl, 2-chlorophenyl, 4-chlorophenyl, 2-methoxyphenyl, 4-methoxyphenyl, 2-benzylphenyl, 4-benzylphenyl, and the like are particularly preferable.

The aryl group represented by $R_2$ and $R_3$ may further have a substituent. Examples of the substituent include the substituents of the alkyl group represented by $R_2$ and $R_3$ described above.

Each of $R_4$ and $R_5$ independently represents a hydrogen atom or a substituent.

Examples of the substituent represented by $R_4$ and $R_5$ include the substituents of the alkyl group represented by $R_2$ and $R_3$ described above. The substituent is preferably an alkyl group, an alkenyl group, an alkynyl group, an aryl group, or a group obtained by combining these. Preferred examples of each of these substituents include the groups exemplified as $R_2$ and $R_3$ described above.

The group represented by $R_4$ and $R_5$ may further have a substituent. Examples of the substituent include the substituents of the alkyl group represented by $R_2$ and $R_3$ described above.

Each of $R_1$ and $R_6$ independently represents a hydrogen atom or a substituent.

Examples of the substituent represented by $R_1$ and $R_6$ include the substituents of the alkyl group represented by $R_2$ and $R_3$ described above. The substituent is preferably an alkyl group, an alkenyl group, an alkynyl group, an aryl group, or a group obtained by combining these. Preferred examples of each of these substituents include the groups exemplified as $R_2$ and $R_3$ described above.

The group represented by $R_1$ and $R_6$ may further have a substituent. Examples of the substituent include the substituents of the alkyl group represented by $R_2$ and $R_3$ described above.

n represents an integer of 0 to 5. Here, when n is 0, P and Q do not represent OH at the same time and do not represent $CHR_4R_5$ at the same time. When n is an integer of equal to or greater than 2, a plurality of atomic groups represented by $(CR_1=Y)$ may be the same as or different from each other.

The compound represented by Formula (1) may be linear or cyclic. When the compound is cyclic, at least two out of the groups represented by $R_1$, $R_2$, $R_3$, $R_4$, $R_5$, or $R_6$ may form a ring by being bonded to each other.

When the two groups are bonded to each other, they may be bonded to each other through any of a single bond, a double bond, or a triple bond.

The compound represented by Formula (1) is preferably a compound selected from the group consisting of compounds represented by the following Formulae (1-6) to (1-21).

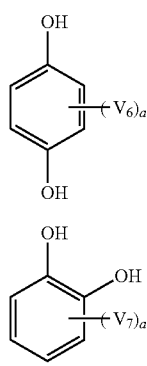

Formula (1-6)

Formula (1-7)

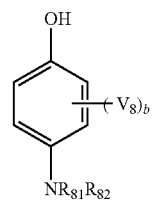

Formula (1-8)

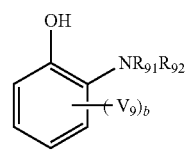

Formula (1-9)

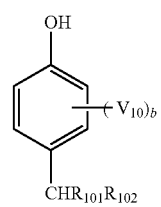

Formula (1-10)

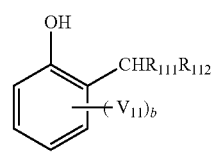

Formula (1-11)

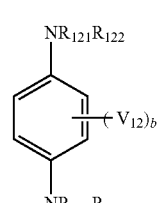

Formula (1-12)

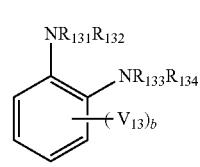

Formula (1-13)

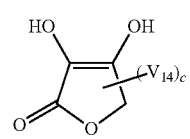

Formula (1-14)

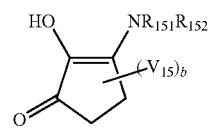

Formula (1-15)

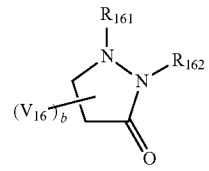

Formula (1-16)

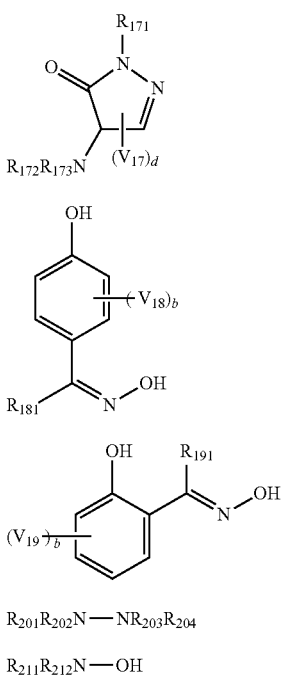

Formula (1-17)

Formula (1-18)

Formula (1-19)

Formula (1-20)

Formula (1-21)

The compound represented by Formula (1-6) is a compound formed in a case in which in Formula (1), each of P and Q represents OH; Y represents $CR_6$; n represents 2; and $R_1$ on a carbon atom adjacent to P and $R_6$ on a carbon atom adjacent to Q form a ring by forming a double bond by being bonded to each other.

In Formula (1-6), $V_6$ represents a substituent, and a represents an integer of 1 to 4 (preferably represents an integer of 1 or 2 and more preferably represents 1).

Examples of the substituent represented by $V_6$ include the substituents of the alkyl group represented by $R_2$ and $R_3$ in Formula (1) described above. When there is a plurality of groups represented by $V_6$ in Formula (1-6), the groups may be the same as or different from each other, or may form a ring by being bonded to each other.

Specific examples of the compound represented by Formula (1-6) are shown below, but the present invention is not limited thereto.

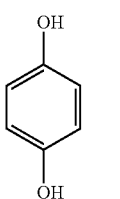

1-6-1

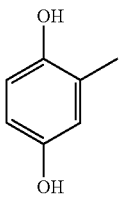

1-6-2

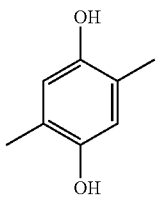

1-6-3

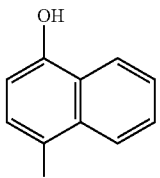

1-6-4

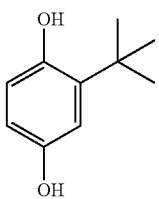

1-6-5

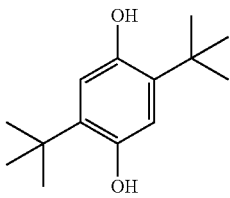

1-6-6

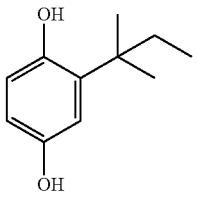

1-6-7

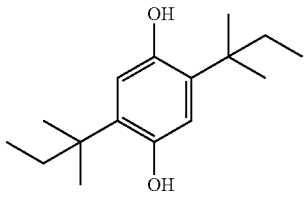

1-6-8

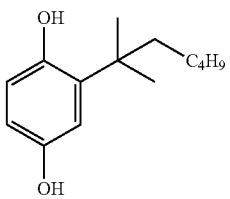

1-6-9

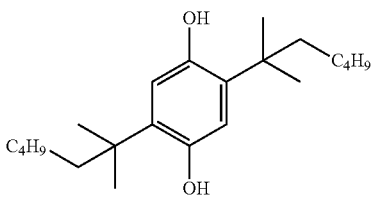

1-6-10

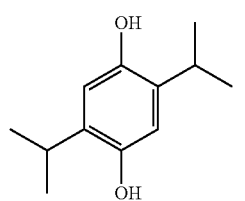 1-6-11
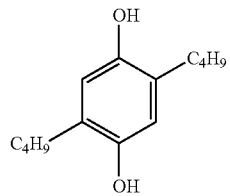 1-6-12
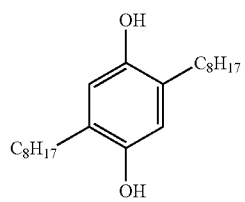 1-6-13
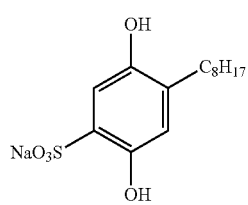 1-6-14
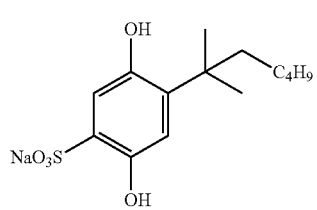 1-6-15
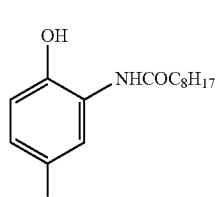 1-6-16
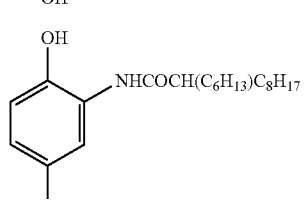 1-6-17
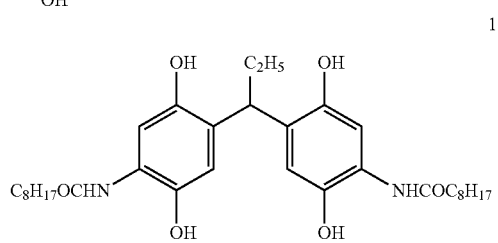 1-6-18
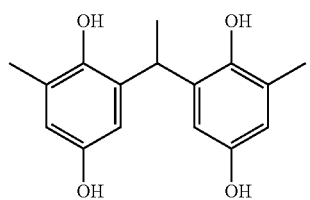 1-6-19
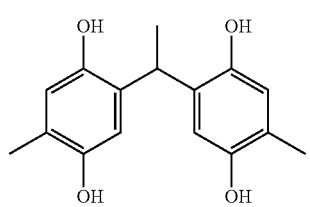 1-6-20
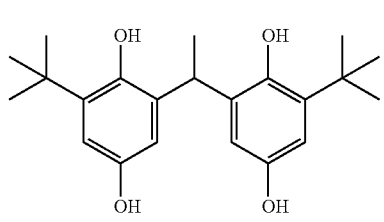 1-6-21
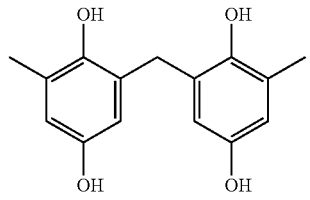 1-6-22
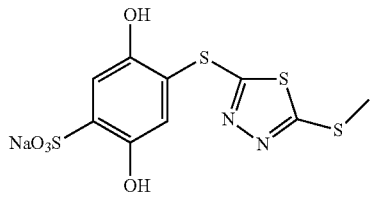 1-6-23
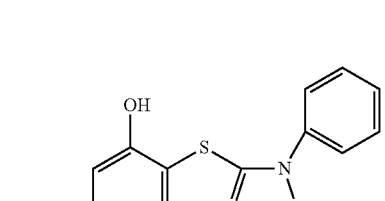 1-6-24
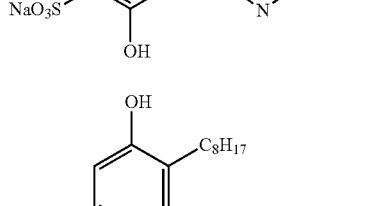 1-6-25

-continued

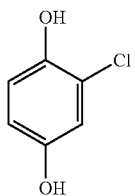
1-6-26

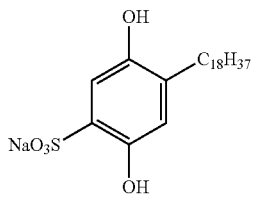
1-6-27

The compound represented by Formula (1-7) is an example of a compound formed in a case in which in Formula (1), each of P and Q represents OH; Y represents CR$_6$; n represents 1; and R$_1$ on a carbon atom adjacent to P and R$_6$ on a carbon atom adjacent to Q form a ring by being bonded to each other.

In Formula (1-7), V$_7$ represents a substituent, and a represents an integer of 1 to 4 (preferably represents an integer of 1 or 2 and more preferably represents 1).

Examples of the substituent represented by V$_7$ include the substituents of the alkyl group represented by R$_2$ and R$_3$ in Formula (1) described above. When there is a plurality of groups represented by V$_7$ in Formula (1-7), the groups may be the same as or different from each other, or may form a ring by being bonded to each other.

Specific examples of the compound represented by Formula (1-7) will be shown below, but the present invention is not limited thereto.

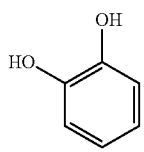
1-7-1

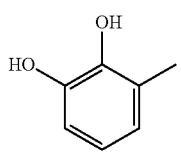
1-7-2

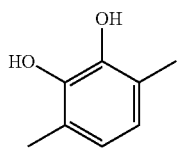
1-7-3

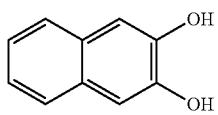
1-7-4

-continued

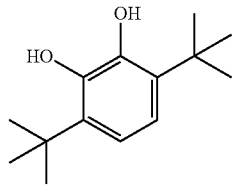
1-7-5

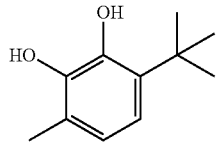
1-7-6

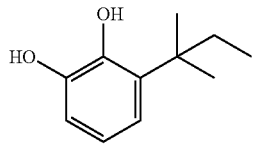
1-7-7

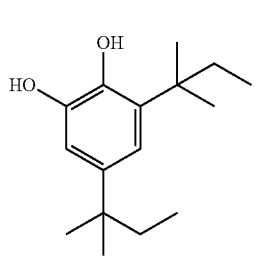
1-7-8

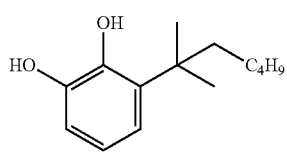
1-7-9

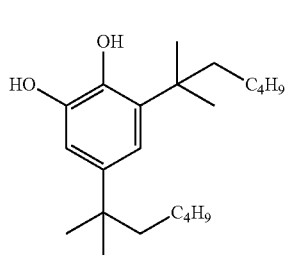
1-7-10

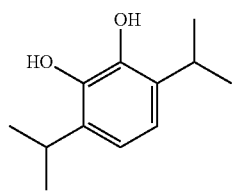
1-7-11

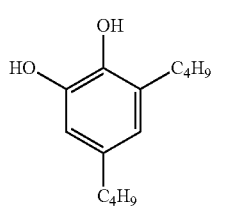
1-7-12

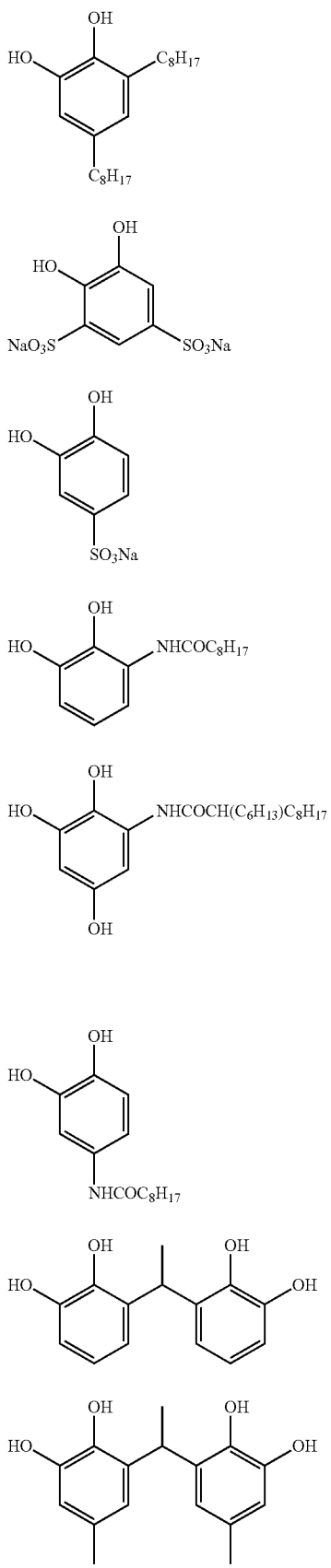
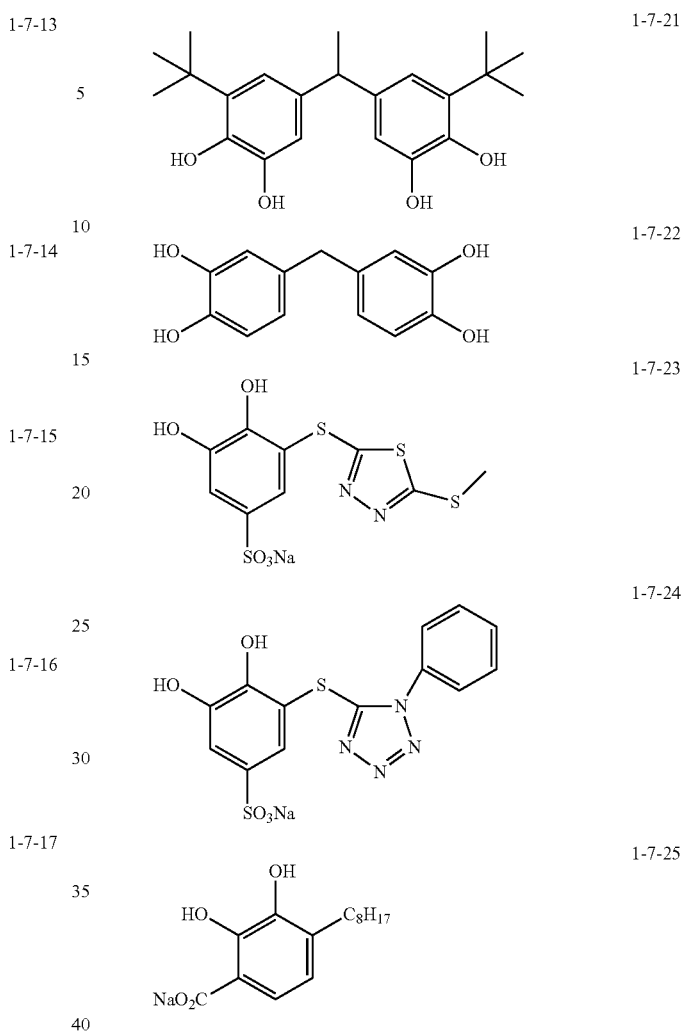

The compound represented by Formula (1-8) is an example of a compound formed in a case in which in Formula (1), P represents OH; Q represents $NR_2R_3$; Y represents $CR_6$; n represents 2; and $R_1$ on a carbon atom adjacent to P and $R_6$ on a carbon atom adjacent to Q form a ring by forming a double bond by being bonded to each other.

In Formula (1-8), $V_8$ represents a substituent, and b represents an integer of 0 to 4 (preferably represents an integer of 1 or 2 and more preferably represents 1). Examples of the substituent represented by $V_8$ include the substituents of the alkyl group represented by $R_2$ and $R_3$ in Formula (1) described above. When there is a plurality of groups represented by $V_8$ in Formula (1-8), the groups may be the same as or different from each other, or may form a ring by being bonded to each other.

Each of $R_{81}$ and $R_{82}$ independently represents a hydrogen atom or a group which can be substituted with a nitrogen atom. Examples of the group which can be substituted with a nitrogen atom preferably include the groups exemplified as $R_2$ and $R_3$ in Formula (1) described above.

Specific examples of the compound represented by Formula (1-8) will be shown below, but the present invention is not limited thereto.

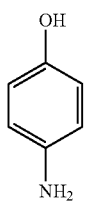 1-8-1
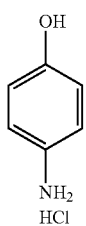 1-8-2
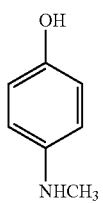 1-8-3
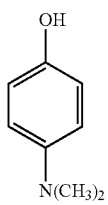 1-8-4
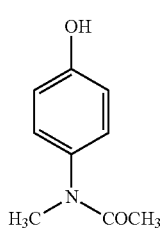 1-8-5
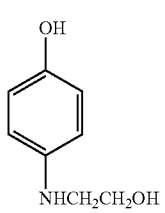 1-8-6
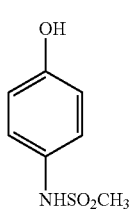 1-8-7
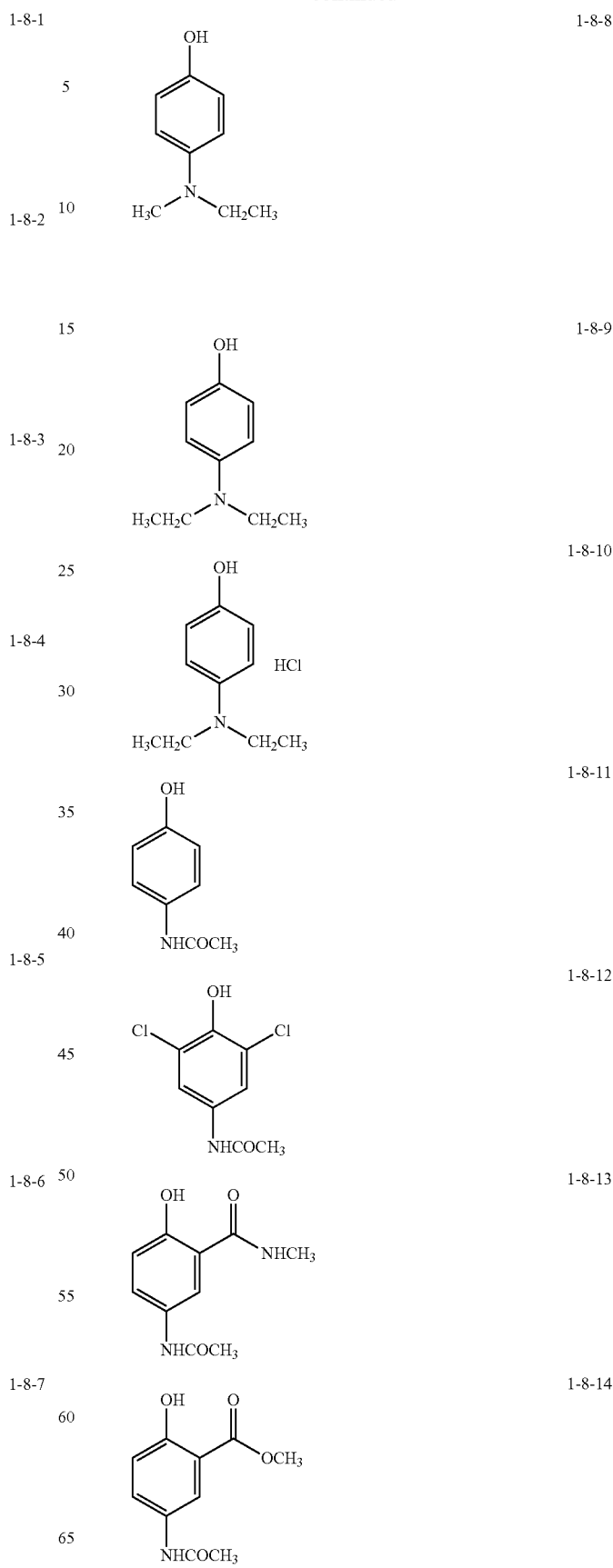

1-8-15
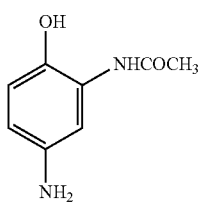
1-8-16
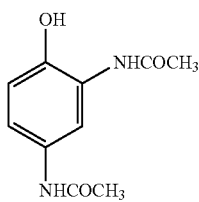
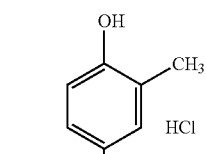
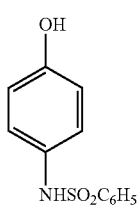
1-8-19
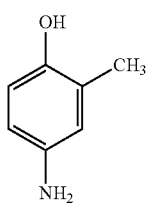
1-8-20
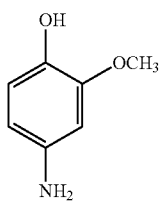
1-8-21
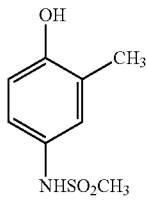
1-8-22
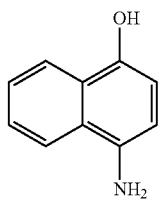
1-8-23
1-8-24
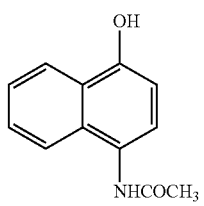
1-8-25
1-8-26
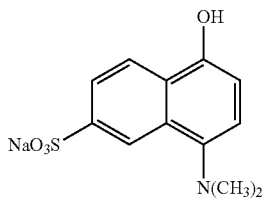
1-8-27
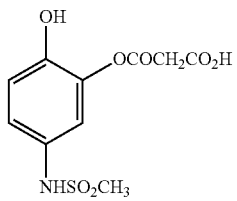
1-8-28
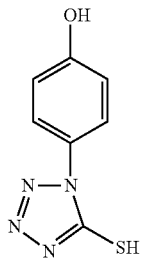

The compound represented by Formula (1-9) is an example of a compound formed in a case in which in Formula (1), P represents OH; Q represents $NR_2R_3$; Y represents $CR_6$; n represents 1; and $R_1$ on a carbon atom adjacent to P and $R_6$ on a carbon atom adjacent to Q form a ring by being bonded to each other.

In Formula (1-9), $V_9$ represents a substituent, and b represents an integer of 0 to 4 (preferably represents an integer of 1 or 2 and more preferably represents 1). Examples of the substituent represented by $V_9$ include the substituents of the alkyl group represented by $R_2$ and $R_3$ in Formula (1) described above. When there is a plurality of groups represented by $V_9$ in Formula (1-9), the groups may be the same as or different from each other, or may form a ring by being bonded to each other.

Each of $R_{91}$ and $R_{92}$ independently represents a hydrogen atom or a group which can be substituted with a nitrogen atom. Examples of the group which can be substituted with a nitrogen atom preferably include the groups exemplified as $R_2$ and $R_3$ in Formula (1) described above.

Specific examples of the compound represented by Formula (1-9) will be shown below, but the present invention is not limited thereto.

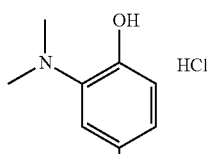
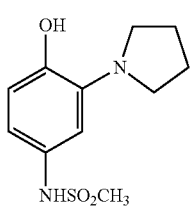
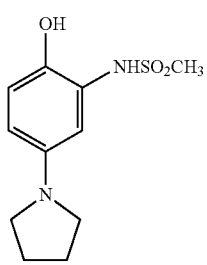
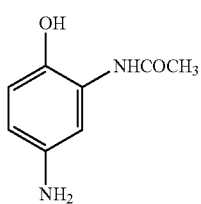
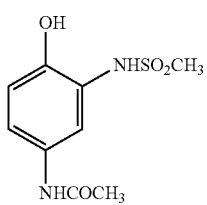
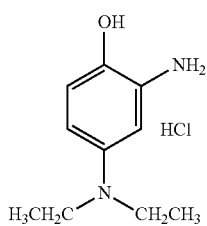
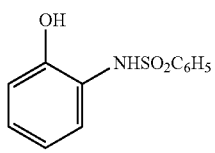
1-9-12 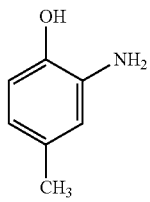
1-9-13 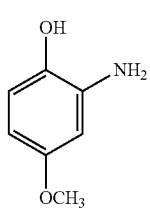
1-9-14 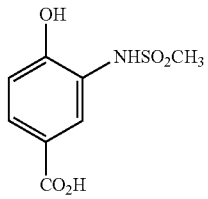
1-9-15 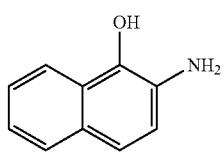
1-9-16 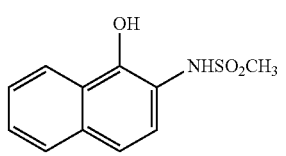
1-9-17 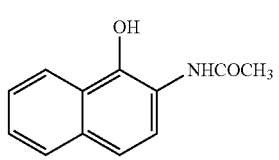
1-9-18 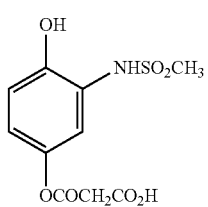
1-9-19
1-9-20
1-9-21
1-9-22
1-9-23
1-9-24
1-9-25 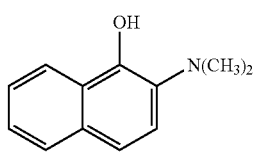
1-9-26 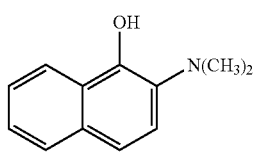
1-9-27 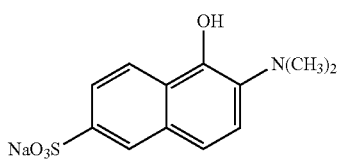

1-9-28

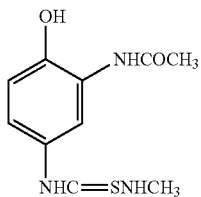

1-9-29

The compound represented by Formula (1-10) is an example of a compound formed in a case in which in Formula (1), P represents OH; Q represents $CHR_4R_5$; Y represents $CR_6$; n represents 2; $R_1$ on a carbon atom adjacent to P and $R_6$ on a carbon atom adjacent to Q form a ring by forming a double bond by being bonded to each other.

In Formula (1-10), $V_{10}$ represents a substituent, and b represents an integer of 0 to 4 (preferably represents an integer of 1 or 2 and more preferably represents 1). Examples of the substituent represented by $V_{10}$ include the substituents of the alkyl group represented by $R_2$ and $R_3$ in Formula (1) described above. When there is a plurality of groups represented by $V_{10}$ in Formula (1-10), the groups may be the same as or different from each other, or may form a ring by being bonded to each other.

Each of $R_{101}$ and $R_{102}$ independently represents a hydrogen atom or a substituent.

Examples of the substituent represented by $R_{101}$ and $R_{102}$ include the substituents of the alkyl group represented by $R_2$ and $R_3$ described above. The substituent is an alkyl group, an alkenyl group, an alkynyl group, or an aryl group. Preferred examples of each of these substituents include the groups exemplified as $R_2$ and $R_3$ described above.

When $R_{101}$ and $R_{102}$ represent substituents, these substituents may further have a substituent. Examples of the substituent include the substituents of the alkyl group represented by $R_2$ and $R_3$ in Formula (1) described above.

Specific examples of the compound represented by Formula (1-10) will be shown below, but the present invention is not limited thereto.

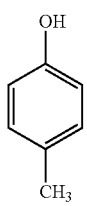

1-10-1

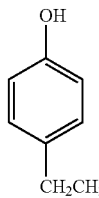

1-10-2

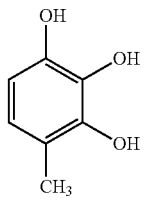

1-10-3

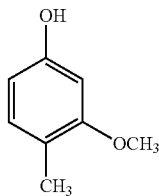

1-10-4

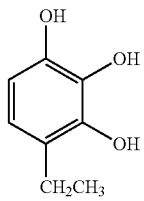

1-10-5

1-10-6

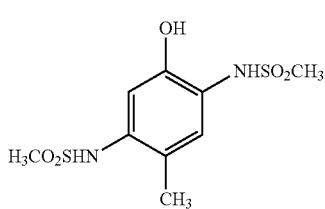

1-10-7

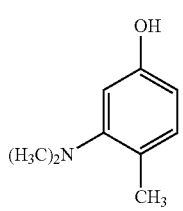

1-10-8

-continued 1-10-9

1-10-10

1-10-11

1-10-12

1-10-13

1-10-14

1-10-15

1-10-16

1-10-17

1-10-18

1-10-19

1-10-20

1-10-21

1-10-22

1-10-23

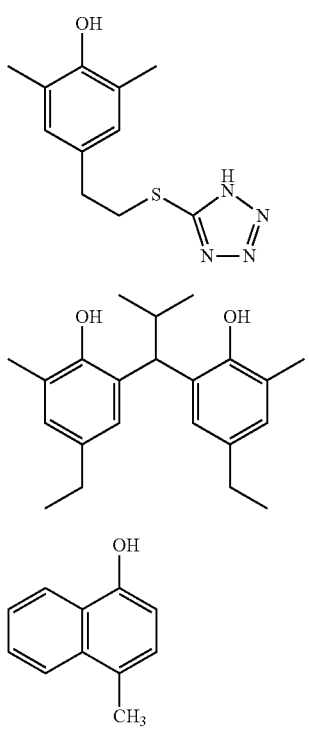

1-10-24

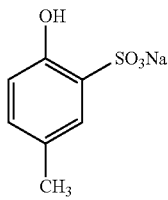

1-10-25

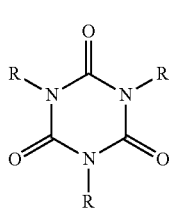

1-10-26

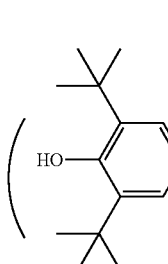

1-10-27

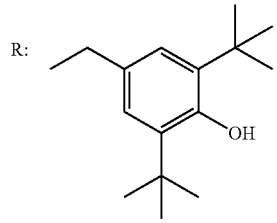

1-10-28

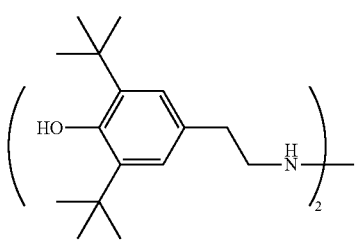

1-10-29

The compound represented by Formula (1-11) is an example of a compound formed in a case in which in Formula (1), P represents OH; Q represents $CHR_4R_5$; Y represents $CR_6$; n represents 1; and $R_1$ on a carbon atom adjacent to P and $R_6$ on a carbon atom adjacent to Q form a ring by being bonded to each other.

In Formula (1-11), $V_{11}$ represents a substituent, and b represents an integer of 0 to 4 (preferably represents an integer of 1 or 2 and more preferably represents 1).

Examples of the substituent represented by $V_{11}$ include the substituents of the alkyl group represented by $R_2$ and $R_3$ in Formula (1) described above. When there is a plurality of groups represented by $V_{11}$ in Formula (1-11), the groups may be the same as or different from each other, or may form a ring by being bonded to each other.

Each of $R_{111}$ and $R_{112}$ independently represents a hydrogen atom or a substituent.

Examples of the substituent represented by $R_{111}$ and $R_{112}$ include the substituents of the alkyl group represented by $R_2$ and $R_3$ described above. The substituent is preferably an alkyl group, an alkenyl group, an alkynyl group, or an aryl group. Preferred examples of each of these substituents include the groups exemplified as $R_2$ and $R_3$ described above.

When $R_{111}$ and $R_{112}$ represent substituents, these substituents may further have a substituent. Examples of the substituent include the substituents of the alkyl group represented by $R_2$ and $R_3$ in Formula (1) described above.

Specific examples of the compound represented by Formula (1-11) will be shown below, but the present invention is not limited thereto.

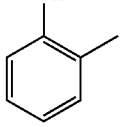

1-11-1

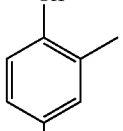

1-11-2

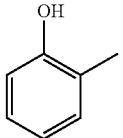

1-11-3

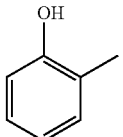

1-11-4

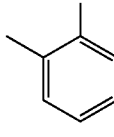

1-11-5

1-11-6
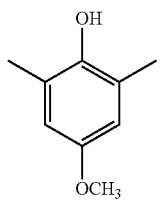

1-11-7
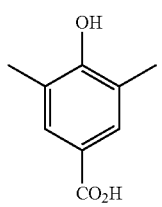

1-11-8
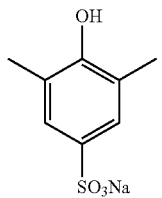

1-11-9
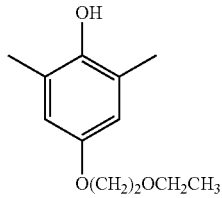

1-11-10
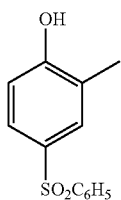

1-11-11
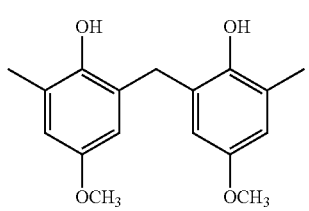

1-11-12
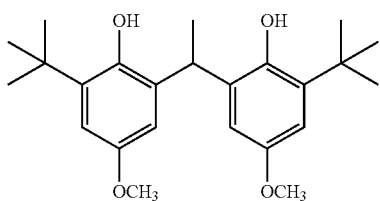

1-11-13
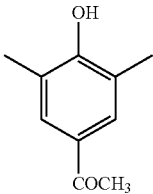

1-11-14
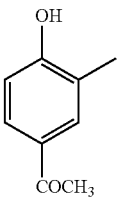

1-11-15
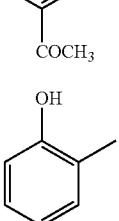

1-11-16
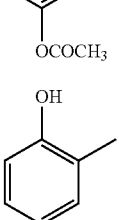

1-11-17
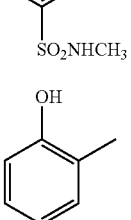

The compound represented by Formula (1-12) is an example of a compound formed in a case in which in Formula (1), each of P and Q represents $NR_2R_3$; Y represents $CR_6$; n represents 2; and $R_1$ on a carbon atom adjacent to P and $R_6$ on a carbon atom adjacent to Q form a ring by forming a double bond by being bonded to each other.

In Formula (1-12), $V_{12}$, represents a substituent, and b represents an integer of 0 to 4 (preferably represents an integer of 1 or 2 and more preferably represents 1). Examples of the substituent represented by $V_{12}$ include the substituents of the alkyl group represented by $R_2$ and $R_3$ in Formula (1) described above. When there is a plurality of groups represented by $V_{12}$ in Formula (1-12), the groups may be the same as or different from each other, or may form a ring by being bonded to each other.

Each of $R_{121}$, $R_{122}$, $R_{123}$, and $R_{124}$ independently represents a hydrogen atom or a group which can be substituted with a nitrogen atom. Examples of the group which can be substituted with a nitrogen atom preferably include the groups exemplified as $R_2$ and $R_3$ in Formula (1) described above.

Specific examples of the compound represented by Formula (1-12) will be shown below, but the present invention is not limited thereto.

1-12-1 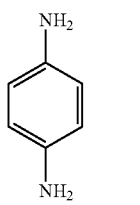
1-12-2 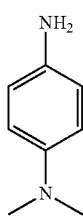
1-12-3 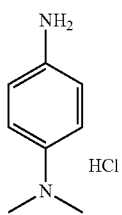
1-12-4 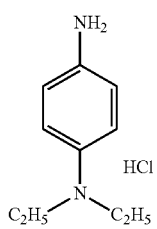
1-12-5 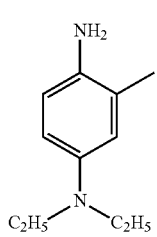
1-12-6 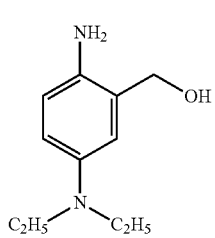
1-12-7 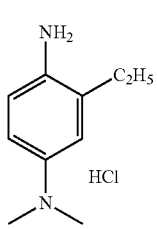
1-12-8 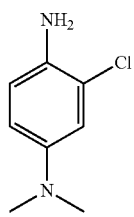
1-12-9 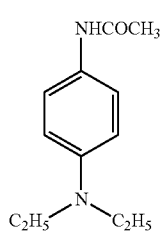
1-12-10 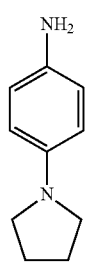
1-12-11 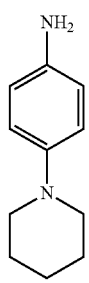
1-12-12 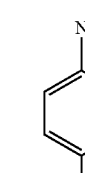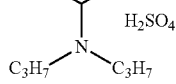
1-12-13 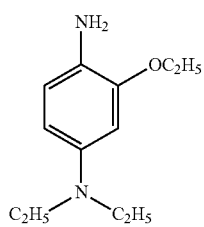

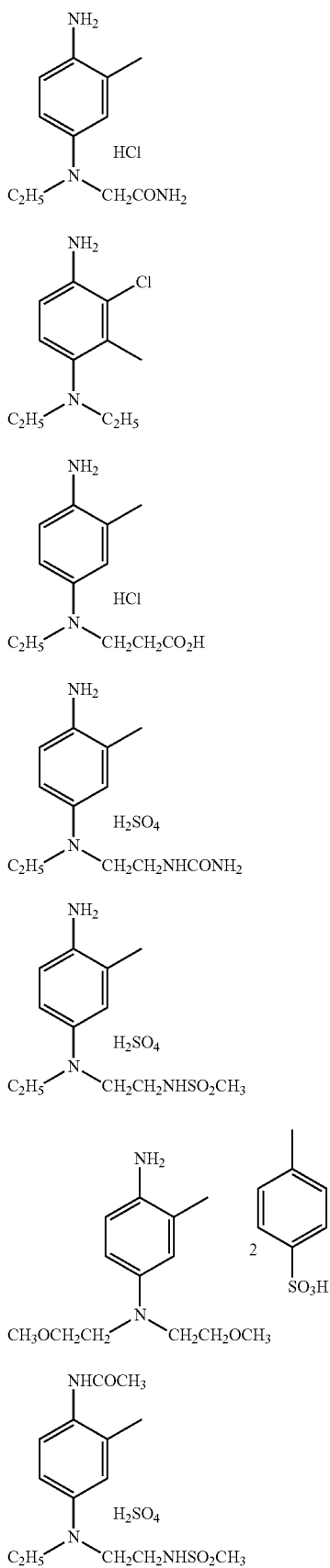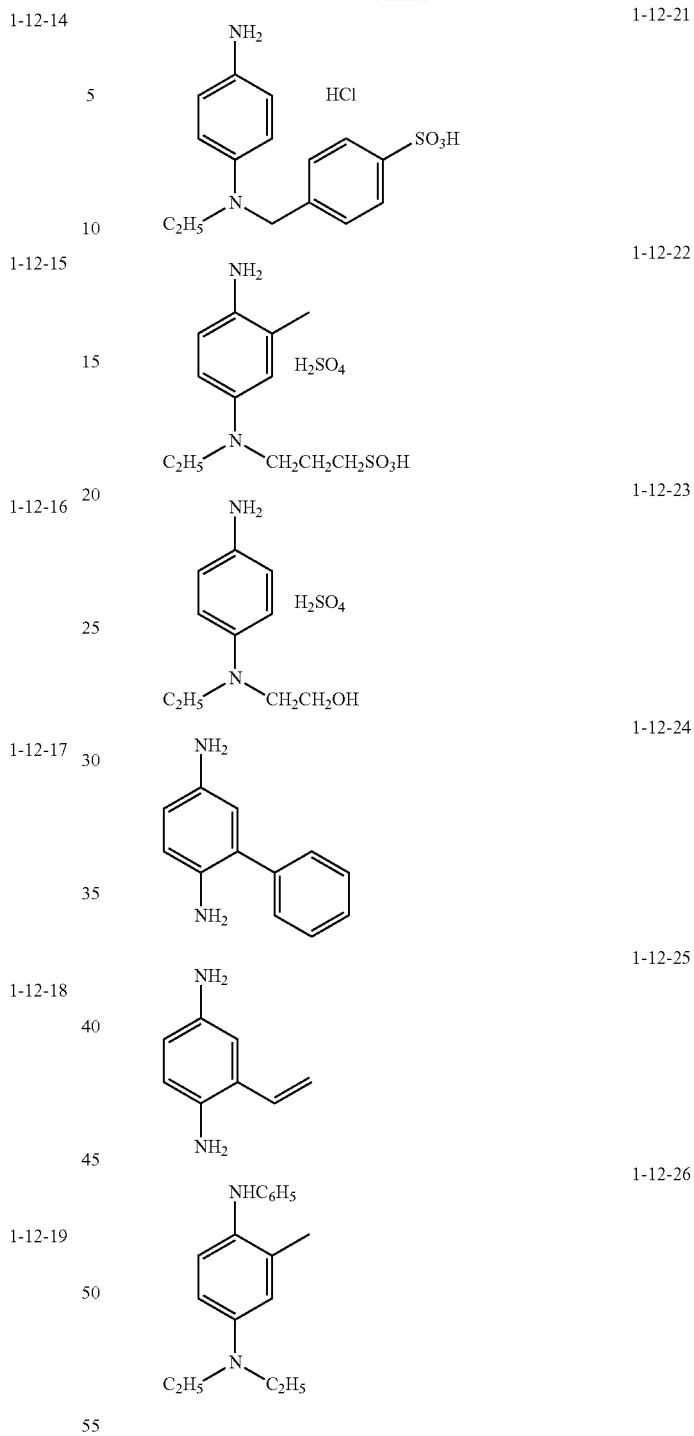

The compound represented by Formula (1-13) is an example of a compound formed in a case in which in Formula (1), each of P and Q represents $NR_2R_3$; Y represents $CR_6$; n represents 1; and $R_1$ on a carbon atom adjacent to P and $R_6$ on a carbon atom adjacent to Q form a ring by being bonded to each other.

In Formula (1-13), $V_{13}$ represents a substituent, and b represents an integer of 0 to 4 (preferably represents an integer of 1 or 2 and more preferably represents 1). Examples of the substituent represented by $V_{13}$ include the substituents of the alkyl group represented by $R_2$ and $R_3$ in Formula (1) described above. When there is a plurality of groups represented by $V_{13}$ in Formula (1-13), the groups may be the same as or different from each other, or may form a ring by being bonded to each other.

Each of $R_{131}$, $R_{132}$, $R_{133}$, and $R_{134}$ independently represents a hydrogen atom or a group which can be substituted with a nitrogen atom. Examples of the group which can be substituted with a nitrogen atom preferably include the groups exemplified as $R_2$ and $R_3$ in Formula (1) described above.

Specific examples of the compound represented by Formula (1-13) will be shown below, but the present invention is not limited thereto.

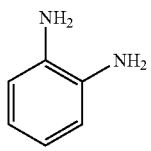
1-13-1

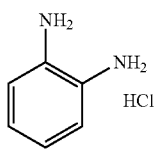
1-13-2

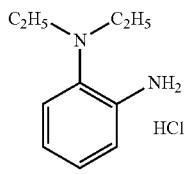
1-13-3

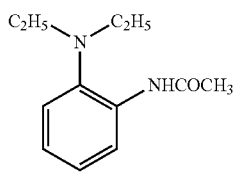
1-13-4

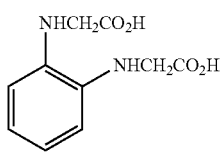
1-13-5

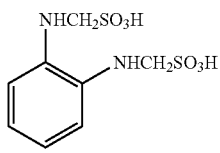
1-13-6

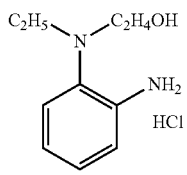
1-13-7

-continued

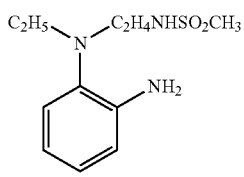
1-13-8

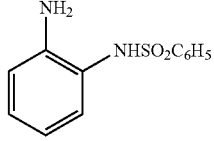
1-13-9

The compound represented by Formula (1-14) is an example of a compound formed in a case in which in Formula (1), each of P and Q represents OH; Y represents $CR_6$; n represents 1; and $R_1$ on a carbon atom adjacent to P and $R_6$ on a carbon atom adjacent to Q form a ring by being bonded to each other.

In Formula (1-14), $V_{14}$ represents a substituent, and c represents an integer of 1 or 2 (preferably represents 1).

Examples of the substituent represented by $V_{14}$ include the substituents of the alkyl group represented by $R_2$ and $R_3$ in Formula (1) described above. When there is a plurality of groups represented by $V_{14}$ in Formula (1-14), the groups may be the same as or different from each other, or may form a ring by being bonded to each other.

Specific examples of the compound represented by Formula (1-14) will be shown below, but the present invention is not limited thereto.

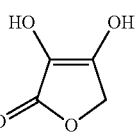
1-14-1

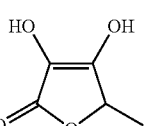
1-14-2

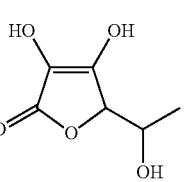
1-14-3

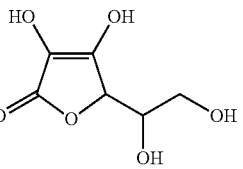
1-14-4

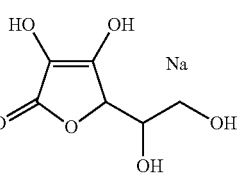
1-14-5

-continued 1-14-6
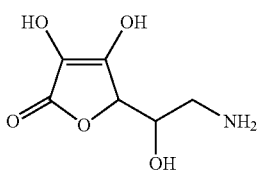

1-14-7
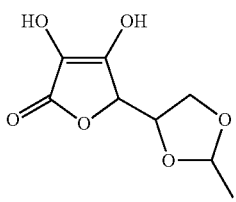

1-14-8
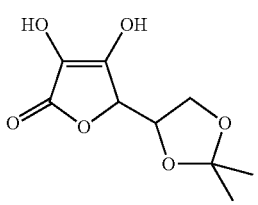

1-14-9
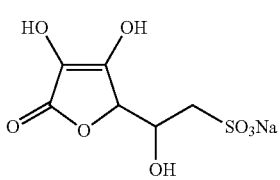

1-14-10
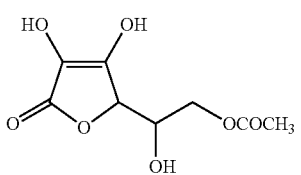

1-14-11
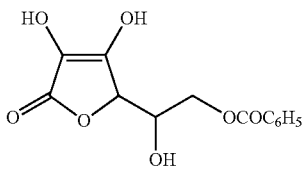

1-14-12
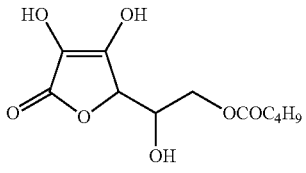

1-14-13
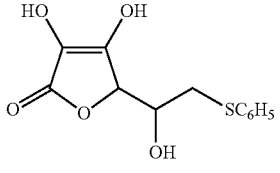

1-14-14
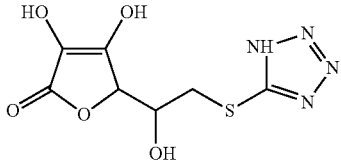

-continued 1-14-15
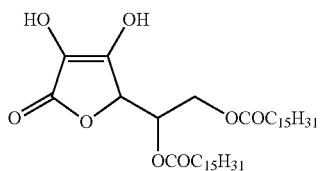

The compound represented by Formula (1-15) is an example of a compound formed in a case in which in Formula (1), P represents OH; Q represents $NR_2R_3$; Y represents $CR_6$; n represents 1; and $R_1$ on a carbon atom adjacent to P and $R_6$ on a carbon atom adjacent to Q form a ring by being bonded to each other.

In Formula (1-15), $V_{15}$ represents a substituent, and b represents an integer of 0 to 4 (preferably represents an integer of 1 or 2 and more preferably represents 1). Examples of the substituent represented by $V_{15}$ include the substituents of the alkyl group represented by $R_2$ and $R_3$ in Formula (1) described above. When there is a plurality of groups represented by $V_{15}$ in Formula (1-15), the groups may be the same as or different from each other, or may form a ring by being bonded to each other.

Each of $R_{151}$ and $R_{152}$ independently represents a hydrogen atom or a group which can be substituted with a nitrogen atom. Examples of the group which can be substituted with a nitrogen atom preferably include the groups exemplified as $R_2$ and $R_3$ in Formula (1) described above.

Specific examples of the compound represented by Formula (1-15) will be shown below, but the present invention is not limited thereto.

1-15-1
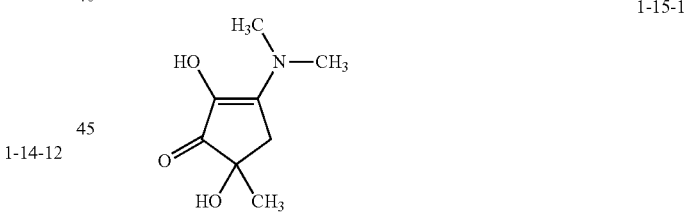

1-15-2
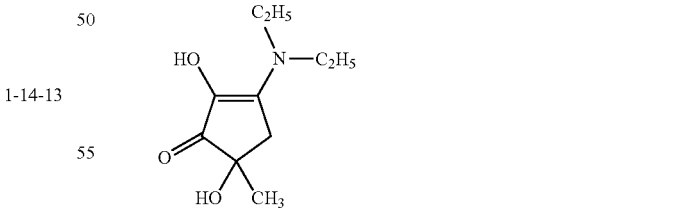

1-15-3
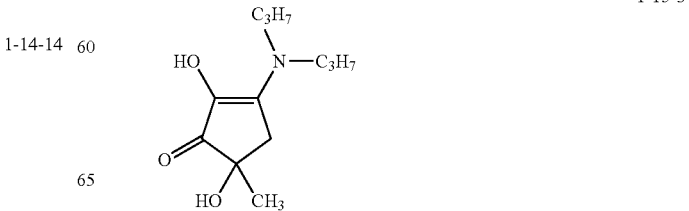

1-15-4 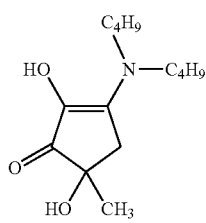

1-15-5 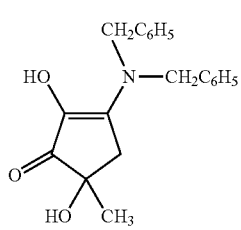

1-15-6 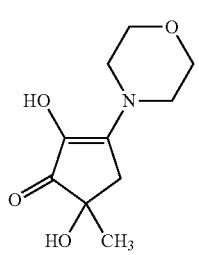

1-15-7 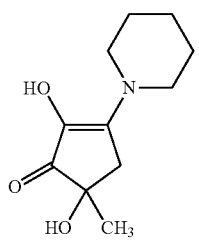

1-15-8 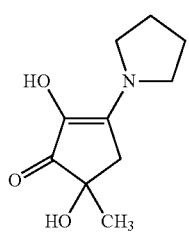

1-15-9 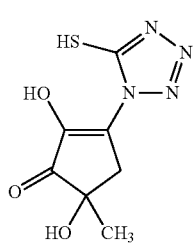

1-15-10 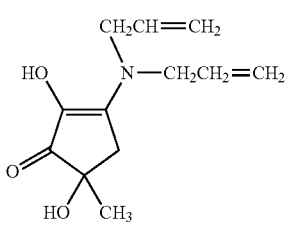

The compound represented by Formula (1-16) is an example of a compound formed in a case in which in Formula (1), each of P and Q represents $NR_2R_3$; n represents 0; and $R_2$ and $R_3$ form a ring by being bonded to each other.

In Formula (1-16), $V_{16}$ represents a substituent, and b represents an integer of 0 to 4 (preferably represents an integer of 1 or 2 and more preferably represents 1). Examples of the substituent represented by $V_{16}$ include the substituents of the alkyl group represented by $R_2$ and $R_3$ in Formula (1) described above. When there is a plurality of groups represented by $V_{16}$ in Formula (1-16), the groups may be the same as or different from each other, or may form a ring by being bonded to each other.

Each of $R_{161}$ and $R_{162}$ independently represents a hydrogen atom or a group which can be substituted with a nitrogen atom. Examples of the group which can be substituted with a nitrogen atom preferably include the groups exemplified as $R_2$ and $R_3$ in Formula (1) described above.

Specific examples of the compound represented by Formula (1-16) will be shown below, but the present invention is not limited thereto.

1-16-1 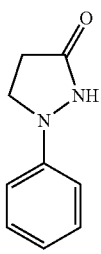

1-16-2 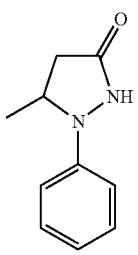

1-16-4 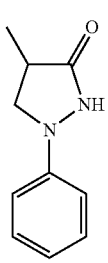

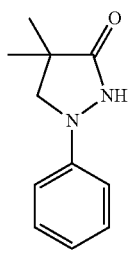
1-16-5
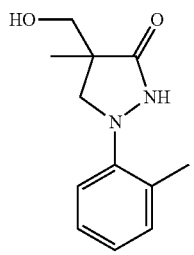
1-16-11
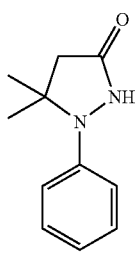
1-16-6
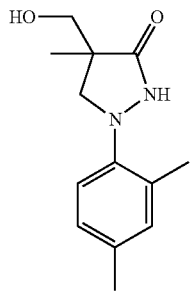
1-16-12
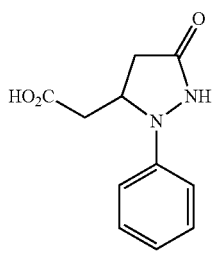
1-16-7
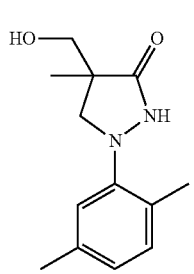
1-16-13
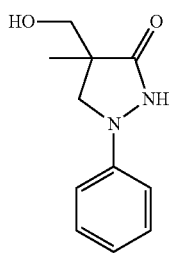
1-16-8
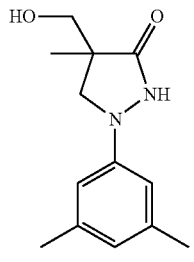
1-16-14
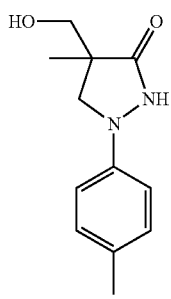
1-16-9
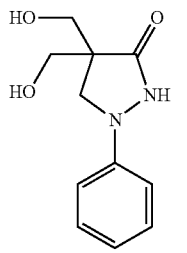
1-16-15
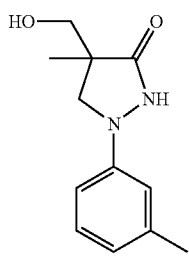
1-16-10
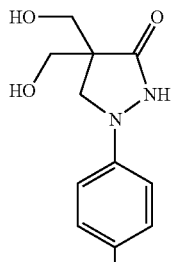
1-16-16

1-16-17

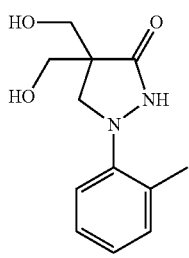

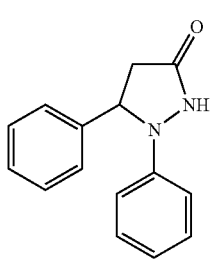

1-16-18

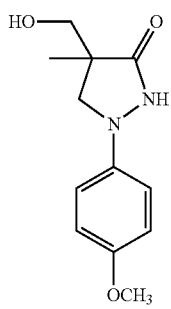

1-16-19

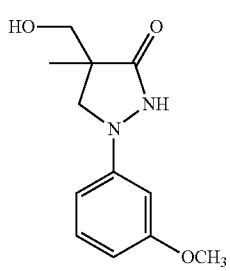

1-16-20

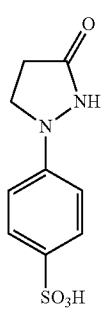

1-16-21

1-16-22

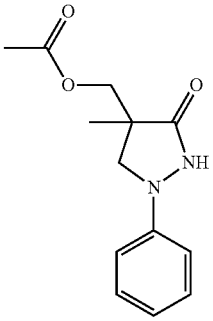

1-16-23

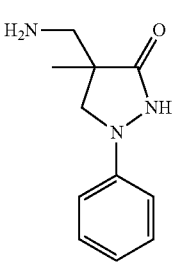

1-16-24

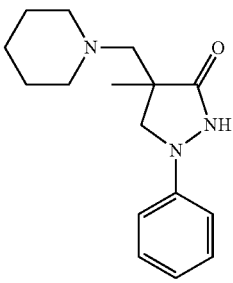

1-16-25

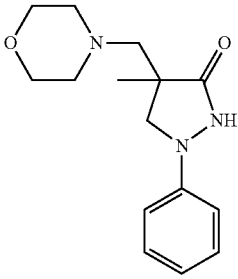

1-16-26

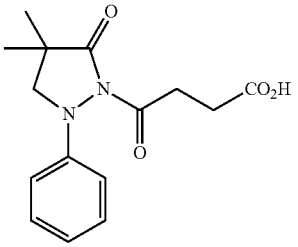

The compound represented by Formula (1-17) is an example of a compound formed in a case in which in Formula (1), each of P and Q represents $NR_2R_3$; n represents 0; and $R_2$ and $R_3$ form a ring by being bonded to each other.

In Formula (1-17), $V_{17}$ represents a substituent, and d represents 0 or 1. Examples of the substituent represented by $V_{17}$ include the substituents of the alkyl group represented by $R_2$ and $R_3$ in Formula (1) described above. When there is a plurality of groups represented by $V_{17}$ in Formula (1-17), the groups may be the same as or different from each other, or may form a ring by being bonded to each other.

Each of $R_{171}$, $R_{172}$, and $R_{173}$ independently represents a hydrogen atom or a group which can be substituted with a nitrogen atom. Examples of the group which can be substituted with a nitrogen atom preferably include the groups exemplified as $R_2$ and $R_3$ in Formula (1) described above.

Specific examples of the compound represented by Formula (1-17) will be shown below, but the present invention is not limited thereto.

1-17-1
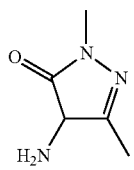

1-17-2
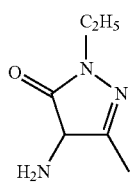

1-17-3
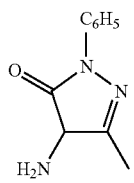

1-17-4
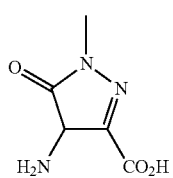

1-17-5
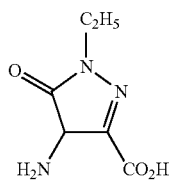

1-17-6
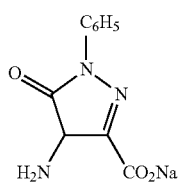

1-17-7
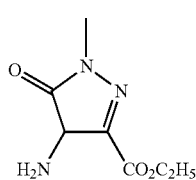

1-17-8
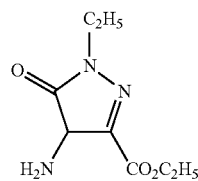

1-17-9
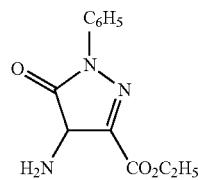

1-17-10
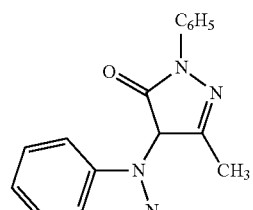

The compound represented by Formula (1-18) is an example of a compound formed in a case in which in Formula (1), each of P and Q represents OH; Y represents $CR_6$ or a nitrogen atom; n represents 3; and $R_1$ and $R_6$ form a ring by being bonded to each other.

In Formula (1-18), Vi represents a substituent, and b represents an integer of 0 to 4 (preferably represents an integer of 1 or 2 and more preferably represents 1). Examples of the substituent represented by $V_{18}$ include the substituents of the alkyl group represented by $R_2$ and $R_3$ in Formula (1) described above. When there is a plurality of groups represented by $V_{18}$ in Formula (1-18), the groups may be the same as or different from each other, or may form a ring by being bonded to each other.

$R_{181}$ represents a hydrogen atom or a substituent. Examples of the substituent represented by $R_{181}$ include the substituents of the alkyl group represented by $R_2$ and $R_3$ described above. The substituent is preferably an alkyl group, an alkenyl group, an alkynyl group, or an aryl group, and preferred examples of each of these substituents include the groups exemplified as $R_2$ and $R_3$ described above.

When $R_{181}$ represents a substituent, the substituent may further have a substituent. Examples of the substituent include the substituents of the alkyl group represented by $R_2$ and $R_3$ in Formula (1) described above.

Specific examples of the compound represented by Formula (1-18) will be shown below, but the present invention is not limited thereto.

1-18-1
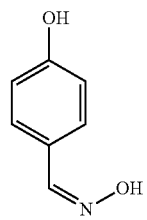

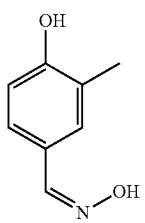
1-18-2
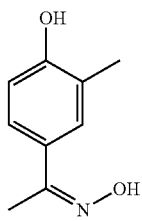
1-18-9
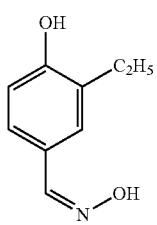
1-18-3
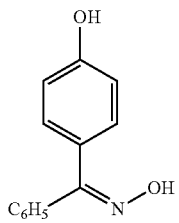
1-18-10
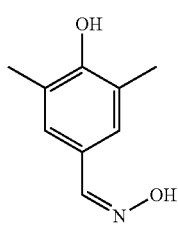
1-18-4
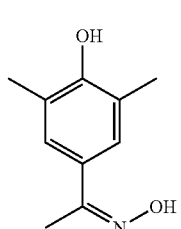
1-18-11
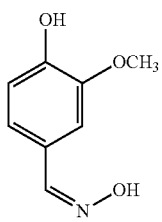
1-18-5
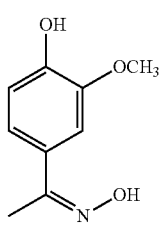
1-18-12
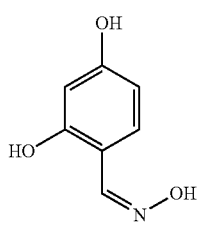
1-18-6
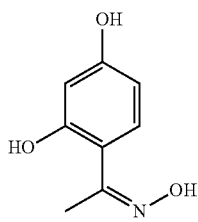
1-18-13
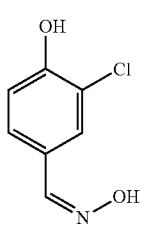
1-18-7
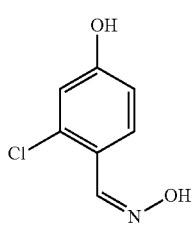
1-18-14
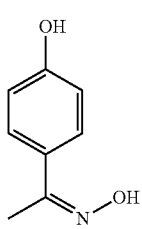
1-18-8
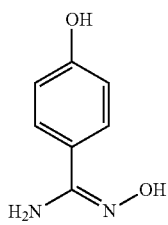
1-18-15

-continued 1-18-16
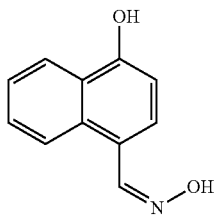

1-18-17
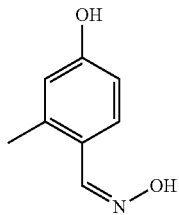

1-18-18
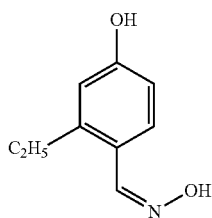

1-18-19
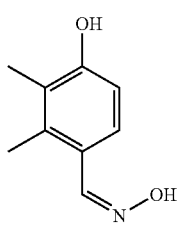

1-18-20
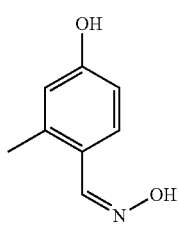

1-18-21
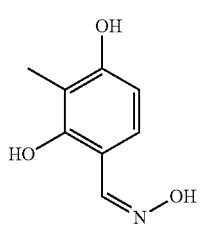

The compound represented by Formula (1-19) is an example of a compound formed in a case in which in Formula (1), each of P and Q represents OH; Y represents $CR_6$ or a nitrogen atom; n represents 2; and $R_1$ and $R_6$ form a ring by being bonded to each other.

In Formula (1-19), $V_{19}$ represents a substituent, and b represents an integer of 0 to 4 (preferably represents an integer of 1 or 2 and more preferably represents 1). Examples of the substituent represented by $V_{19}$ include the substituents of the alkyl group represented by $R_2$ and $R_3$ in Formula (1) described above. When there is a plurality of groups represented by $V_{19}$ in Formula (1-19), the groups may be the same as or different from each other, or may form a ring by being bonded to each other.

$R_{191}$ represents a hydrogen atom or a substituent. Examples of the substituent represented by $R_{191}$ include the substituents of the alkyl group represented by $R_2$ and $R_3$ described above. The substituent is preferably an alkyl group, an alkenyl group, an alkynyl group, or an aryl group, and preferred examples of each of these substituents include the groups exemplified as $R_2$ and $R_3$ described above.

When $R_{191}$ represents a substituent, the substituent may further have a substituent. Examples of the substituent include the substituents of the alkyl group represented by $R_2$ and $R_3$ in Formula (1) described above.

Specific examples of the compound represented by Formula (1-19) will be shown below, but the present invention is not limited thereto.

1-19-7 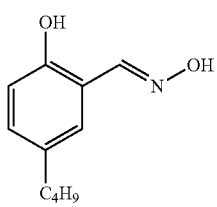

1-19-8 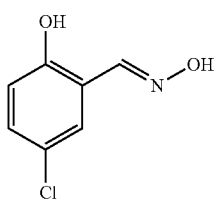

1-19-9 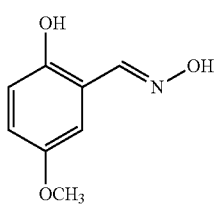

1-19-10 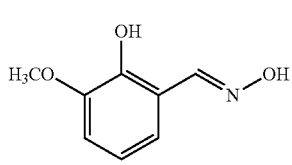

1-19-11 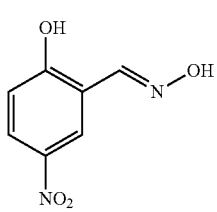

1-19-12 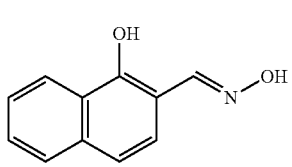

1-19-13 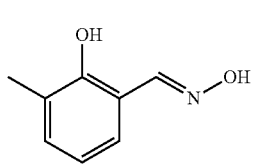

1-19-14 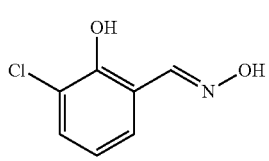

1-19-15 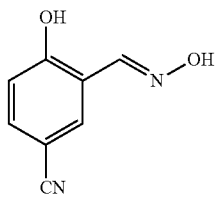

1-19-16 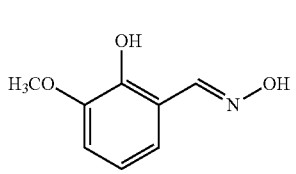

1-19-17 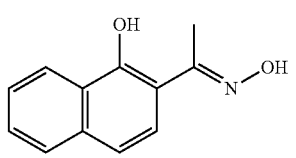

1-19-18 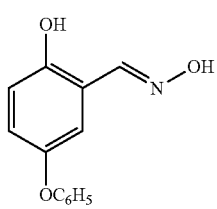

1-19-19 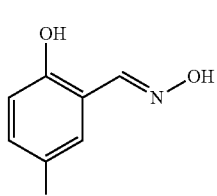

1-19-20 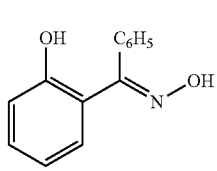

The compound represented by Formula (1-20) is an example of a compound formed in a case in which in Formula (1), each of P and Q represents $NR_2R_3$, and n represents 0.

In Formula (1-20), each of $R_{201}$, $R_{202}$, $R_{203}$, and 8204 independently represents a hydrogen atom or a group which can be substituted with a nitrogen atom. Examples of the group which can be substituted with a nitrogen atom preferably include the groups exemplified as $R_2$ and $R_3$ in Formula (1) described above.

Specific examples of the compound represented by Formula (1-20) will be shown below, but the present invention is not limited thereto.

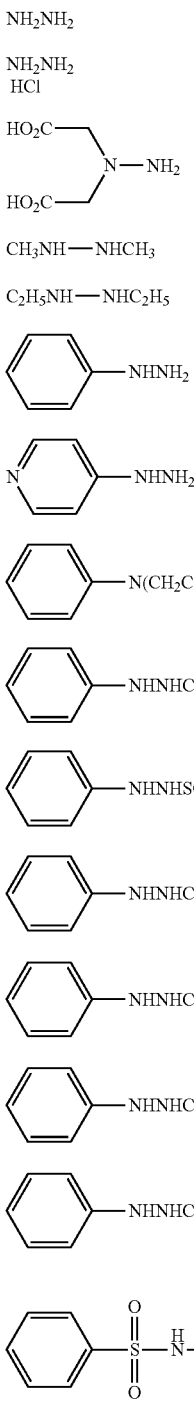

1-20-1
1-20-2
1-20-3
1-20-4
1-20-5
1-20-6
1-20-7
1-20-8
1-20-9
1-20-10
1-20-11
1-20-12
1-20-13
1-20-14
1-20-15

The compound represented by Formula (1-21) is an example of a compound formed in a case in which in Formula (1), P represents $NR_2R_3$; Q represents OH; and n represents 0.

In Formula (1-21), each of $R_{211}$ and $R_{212}$ independently represents a hydrogen atom or a group which can be substituted with a nitrogen atom. Examples of the group which can be substituted with a nitrogen atom preferably include the groups exemplified as $R_2$ and $R_3$ in Formula (1) described above.

Specific examples of the compound represented by Formula (1-21) will be shown below, but the present invention is not limited thereto.

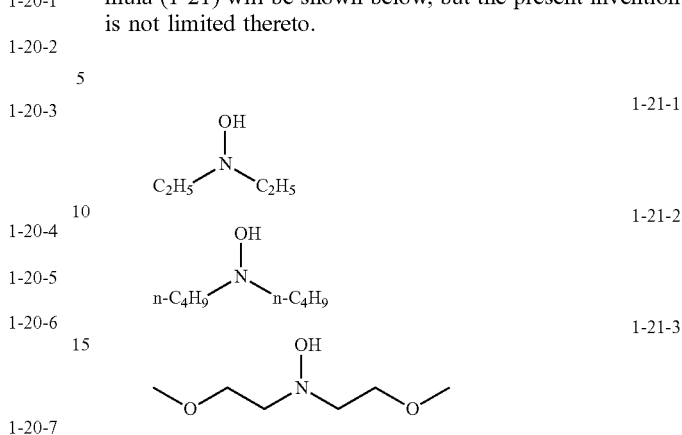

1-21-1
1-21-2
1-21-3

(Compound Represented by Formula (2))

Next, a compound represented by Formula (2) will be described.

$$R_7-C(=O)-H \qquad \text{Formula (2)}$$

The compound represented by Formula (2) also contains a compound (aldose or the like), which exhibits reducing properties due to the equilibrium established between an aldehyde group and a hemiacetal group, or a compound (fructose or the like) which can form an aldehyde group through the aldose-ketose isomerization that results from a Lobry de Bruyn-Van Ekenstein transformation reaction.

In Formula (2), $R_7$ represents an alkyl group, an alkenyl group, an alkynyl group, an aryl group, a heterocyclic group, or a group obtained by combining these groups.

When $R_7$ represents an alkyl group, an alkenyl group, an alkynyl group, or an aryl group, preferred examples of each of these groups include the groups exemplified as $R_2$ and $R_3$ described above.

When $R_7$ represents a heterocyclic group, the heterocyclic group is preferably a monovalent group which is formed as a result of removing one hydrogen atom from a 5-membered or 6-membered substituted or unsubstituted aromatic or non-aromatic heterocyclic compound. The heterocyclic group is more preferably a 5-membered or 6-membered aromatic or non-aromatic heterocyclic group having 3 to 30 carbon atoms. Preferred examples of such a heterocyclic group include 2-furanyl, 2-thienyl, 2-pyrimidinyl, 2-benzothiazolyl, 2-benzoxazolyl, 2-imidazolyl, 4-imidazolyl, triazolyl, benzotriazolyl, thiadiazolyl, pyrrolidinyl, piperidinyl, imidazolidinyl, pyrazolidinyl, morpholinyl, tetrahydrofuranyl, tetrahydrothienyl, and the like.

$R_7$ is more preferably an alkyl group, an alkenyl group, an alkynyl group, or an aryl group, and particularly preferably an alkyl group or an aryl group.

The alkyl group, the alkenyl group, the alkynyl group, the aryl group, or the heterocyclic group represented by $R_7$ may further have a substituent. Examples of the substituent include the substituents of the alkyl group represented by $R_2$ and $R_3$ in Formula (1) described above.

The group represented by $R_7$ may contain a hydroxyl group or a group represented by —COO—.

Specific examples of the compound represented by Formula (2) will be shown below, but the present invention is not limited thereto.

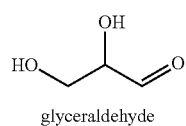
glyceraldehyde
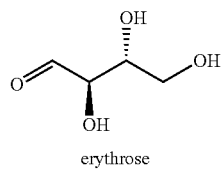
erythrose
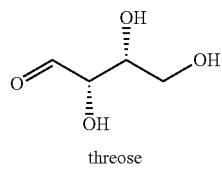
threose
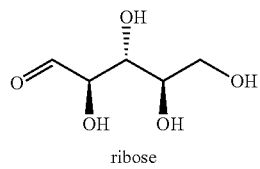
ribose
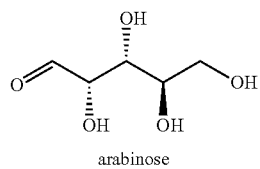
arabinose
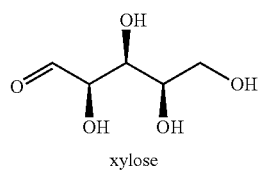
xylose
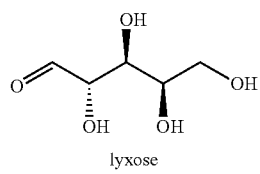
lyxose
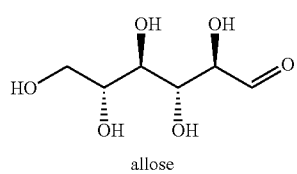
allose
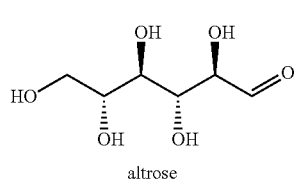
altrose
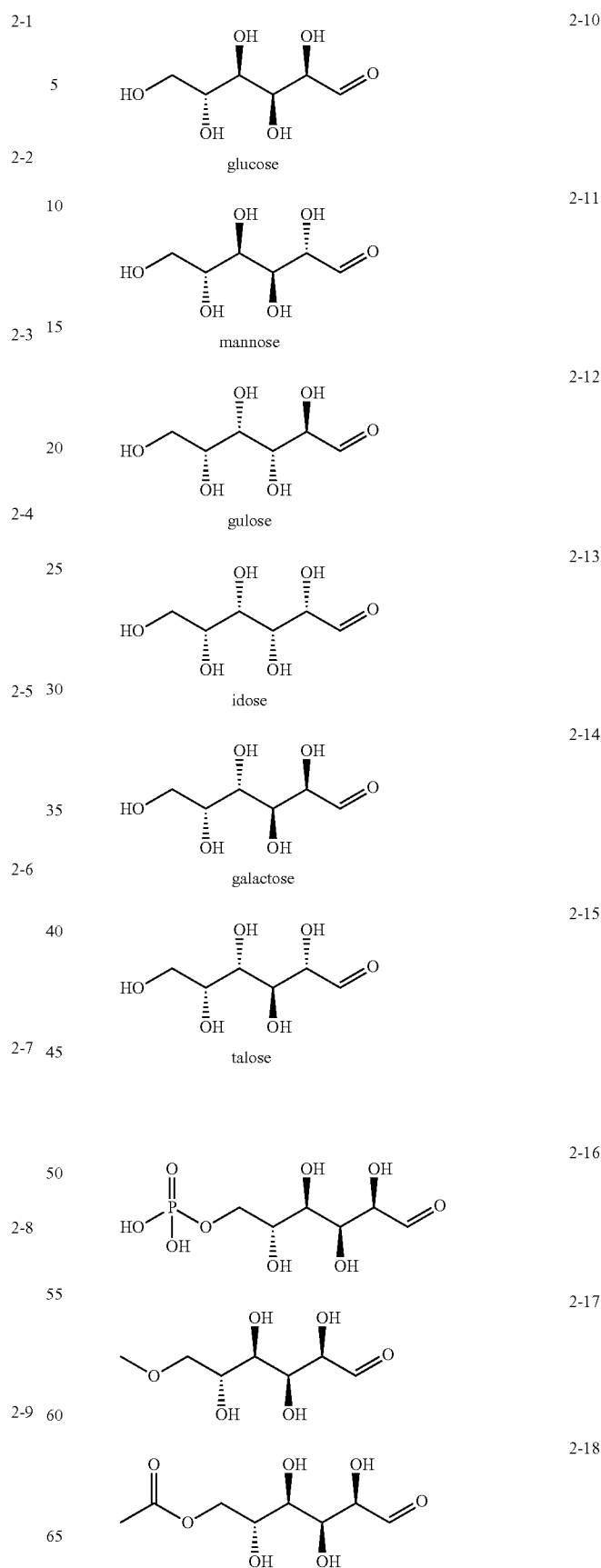

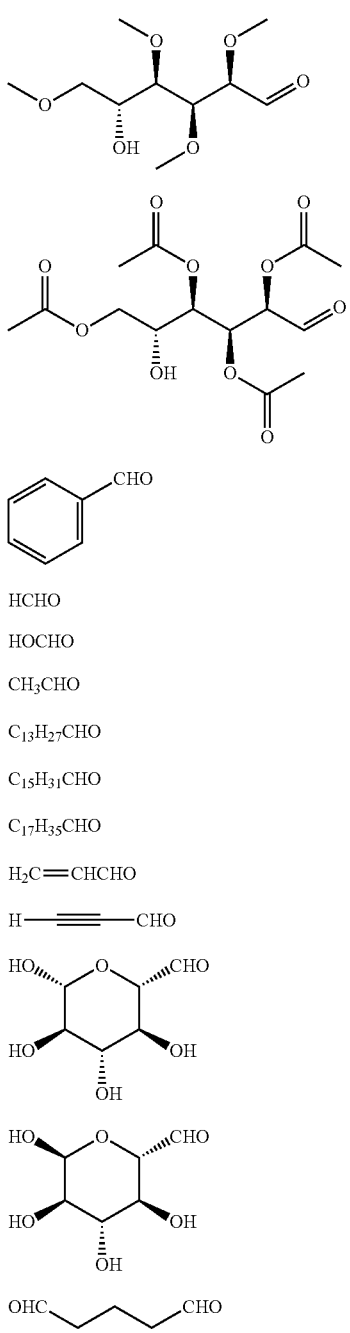

HCHO 2-22
HOCHO 2-23
CH₃CHO 2-24
C₁₃H₂₇CHO 2-25
C₁₅H₃₁CHO 2-26
C₁₇H₃₅CHO 2-27
H₂C=CHCHO 2-28
H—≡—CHO 2-29

(2-30)
(2-31)
OHC—CH₂CH₂CH₂—CHO 2-32

(Compound Represented by Formula (3))

Next, a compound represented by Formula (3) will be described.

Formula (3)

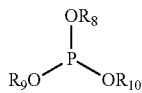

In Formula (3), each of $R_8$, $R_9$, and $R_{10}$ independently represents an alkyl group, an alkenyl group, an alkynyl group, an aryl group, a heterocyclic group, or a group obtained by combining these groups. Preferred examples of the alkyl group, the alkenyl group, the alkynyl group, the aryl group, and the heterocyclic group include the groups exemplified as $R_2$ and $R_3$ in Formula (1) described above.

The groups represented by $R_8$, $R_9$, and $R_{10}$ may further have a substituent. Examples of the substituent include the substituents of the alkyl group represented by $R_2$ and $R_3$ in Formula (1) described above.

Specific examples of the compound represented by Formula (3) will be shown below, but the present invention is not limited thereto.

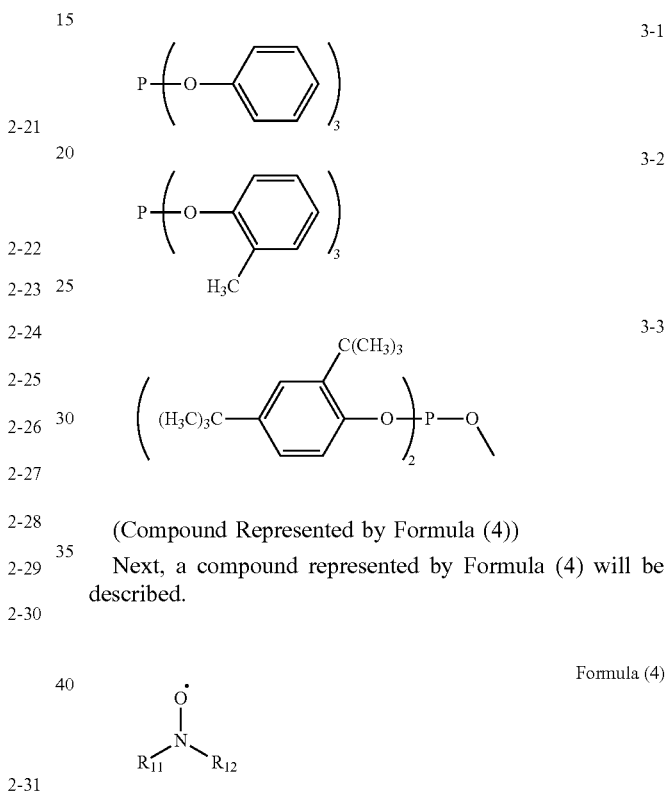

(Compound Represented by Formula (4))

Next, a compound represented by Formula (4) will be described.

Formula (4)

In Formula (4), each of $R_{11}$ and $R_{12}$ independently represents an alkyl group, an alkenyl group, an alkynyl group, an aryl group, a heterocyclic group, or a group obtained by combining these groups. Preferred examples of the alkyl group, the alkenyl group, the alkynyl group, the aryl group, and the heterocyclic group include the groups exemplified as $R_2$ and $R_3$ in Formula (1) described above.

The groups represented by $R_{11}$ and $R_{12}$ may further have a substituent. Examples of the substituent include the substituents of the alkyl group represented by $R_2$ and $R_3$ in Formula (1) described above.

$R_{11}$ and $R_{12}$ may form a ring by being bonded to each other, and the formed ring may contain a substituent. Examples of the substituent include the substituents of the alkyl group represented by $R_2$ and $R_3$ in Formula (1) described above.

Specific examples of the compound represented by Formula (4) will be shown below, but the present invention is not limited thereto. Herein, Me represents a methyl group.

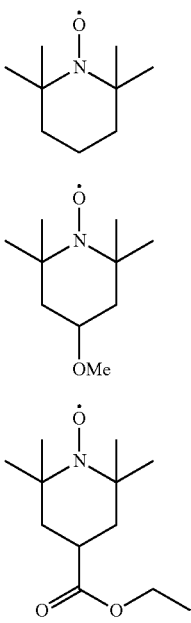

(Compound Represented by Formula (5))

Next, a compound represented by Formula (5) will be described.

$$Z-SH \qquad \text{Formula (5)}$$

In Formula (5), Z represents an alkyl group, an alkenyl group, an alkynyl group, an aryl group, a heterocyclic group, or a group obtained by combining these groups. Preferred examples of the alkyl group, the alkenyl group, the alkynyl group, the aryl group, and the heterocyclic group include the groups exemplified as $R_2$ and $R_3$ in Formula (1) described above.

The group represented by Z may further have a substituent. Examples of the substituent include the substituents of the alkyl group represented by $R_2$ and $R_3$ in Formula (1) described above.

The compound represented by Formula (5) is preferably one of the compounds represented by the following Formulae (51) to (54).

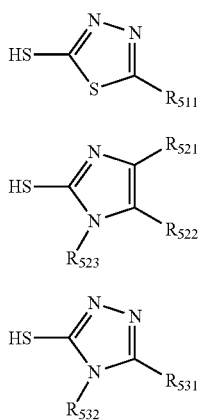

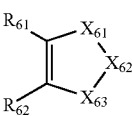

In Formula (51), $R_{511}$ represents a substituent.

Examples of the substituent include the substituents of the alkyl group represented by $R_2$ and $R_3$ in Formula (1) described above. The group represented by $R_{511}$ may further have a substituent. Examples of the substituent include the substituents of the alkyl group represented by $R_2$ and $R_3$ in Formula (1) described above.

In Formula (52), each of $R_{521}$ and $R_{522}$ independently represents a hydrogen atom or a substituent. Examples of the substituent include the substituents of the alkyl group represented by $R_2$ and $R_3$ in Formula (1) described above. $R_{521}$ and $R_{522}$ may form a ring by being bonded to each other.

$R_{523}$ represents a hydrogen atom or a group which can be substituted with a nitrogen atom. Examples of the group which can be substituted with a nitrogen atom preferably include the groups exemplified as $R_2$ and $R_3$ in Formula (1) described above.

In Formula (53), $R_{531}$ represents a hydrogen atom or a substituent. Examples of the substituent include the substituents of the alkyl group represented by $R_2$ and $R_3$ in Formula (1) described above.

$R_{532}$ represents a hydrogen atom or a group which can be substituted with a nitrogen atom. Examples of the group which can be substituted with a nitrogen atom preferably include the groups exemplified as $R_2$ and $R_3$ in Formula (1) described above.

In Formula (54), $R_{541}$ represents a group which can be substituted with a nitrogen atom. Examples of the group which can be substituted with a nitrogen atom preferably include the groups exemplified as $R_2$ and $R_3$ in Formula (1) described above.

(Compound Represented by Formula (6))

Next, a compound represented by Formula (6) will be described.

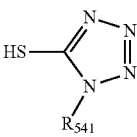

In Formula (6), each of $X_{61}$, $X_{62}$, and $X_{63}$ independently represents —NH—, —N=, =N—, —$CR_x$=, =$CR_x$—, or —S—. $R_x$ represents a hydrogen atom, —$NH_2$, or a linear or branched alkyl group having 1 to 15 carbon atoms. In the alkyl group, one carbon atom or two or more carbon atoms which are not adjacent to each other may be substituted with —O—, —S—, —$NR_0$—, —CO—, —CO—O—, —O—CO—, —O—CO—O—, —$CR_0$=$CR_{00}$—, or —C≡C—. Furthermore, one or more hydrogen atoms in the alkyl group may be substituted with a fluorine atom, a chlorine atom, a bromine atom, an iodine atom, or —CN. Each of $R_0$ and $R_{00}$ independently represents a hydrogen atom or a carbyl or hydrocarbyl group which may have a substituent and one or more heteroatoms. Specific examples and preferred embodiments of the substituent are the same as those of the substituents of the alkyl group represented by $R_2$ and $R_3$ described above. The heteroatom is not particularly limited, and examples thereof include an oxygen atom, a nitrogen atom, a sulfur atom, a phosphorus atom, and the like. At least one of $X_{61}$, $X_{62}$, and $X_{63}$ is not —$CR_x$= or =$CR_x$—.

Each of $R_{61}$ and $R_{62}$ independently represents a fluorine atom, a chlorine atom, -Sp-P, a linear or branched alkyl group having 1 to 15 carbon atoms, or an aryl group, a heteroaryl group, an aryloxy group, a heteroaryloxy group, an arylcarbonyl group, a heteroarylcarbonyl group, an arylcarbonyloxy group, a heteroarylcarbonyloxy group, an aryloxycarbonyl group, or a heteroaryloxycarbonyl group which has 2 to 30 carbon atoms and may have a substituent (specific examples and preferred embodiments of the substituent are the same as those of the substituents of the alkyl group represented by $R_2$ and $R_3$ described above). In the alkyl group, one carbon atom or two or more carbon atoms which are not adjacent to each other may be substituted with —O—, —S—, —$NR_0$—, —CO—, —CO—O—, —O—CO—, —O—CO—O—, —$CR_0$=$CR_{00}$—, or —C≡C—. Furthermore, one or more hydrogen atoms in the alkyl group may be substituted with a fluorine atom, a chlorine atom, a bromine atom, an iodine atom, or —CN. Each of $R_0$ and $R_{00}$ independently represents a hydrogen atom or a carbyl or hydrocarbyl group which may have a substituent and one or more heteroatoms. Specific examples and preferred embodiments of the substituent are the same as those of the substituents of the alkyl group represented by $R_2$ and $R_3$ described above. Sp represents a single bond or a divalent organic group. Specific examples and preferred embodiments of the divalent organic group are the same as those of LB described above. P represents a polymerizable group or a cross-linking group. Specific examples of the polymerizable group and the cross-linking group include a methacryloyl group, an acryloyl group, an itaconic acid ester group, a crotonic acid ester group, an isocrotonic acid ester group, a maleic acid ester group, a styryl group, a vinyl group, an acrylamide group, a methacrylamide group, and the like. $R_{61}$ and $R_{62}$ may form an aromatic ring or an aromatic heterocyclic ring having 5 to 7 ring atoms by being bonded to each other. The aromatic ring and the aromatic heterocyclic ring may have 1 to 6 substituents. Specific examples and preferred embodiments of the substituents are the same as those of the substituents of the alkyl group represented by $R_2$ and $R_3$ described above.

The "carbyl group" refers to any monovalent or polyvalent organic group portion (for example, —C≡C—) not containing a non-carbon atom or refers to any monovalent or polyvalent organic group portion (for example, carbonyl) containing at least one carbon atom optionally bonded to at least one of the non-carbon atoms including N, O, S, P, Si, Se, As, Te, and Ge. The "hydrocarbyl group" refers to a carbyl group which additionally contains one or more H atoms and optionally contains any one or more heteroatoms including N, O, S, P, Si, Se, As, Te, and Ge.

The compound represented by Formula (6) is preferably a compound represented by the following Formula (22).

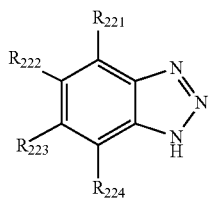

Formula (22)

In Formula (22), each of $R_{221}$, $R_{222}$, $R_{223}$, and $R_{224}$ independently represents a hydrogen atom or a substituent. Specific examples of the substituent include the substituents of the alkyl group represented by $R_2$ and $R_3$ described above.

Specific examples of the compound represented by Formula (22) will be shown below, but the present invention is not limited thereto.

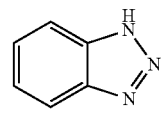

22-1

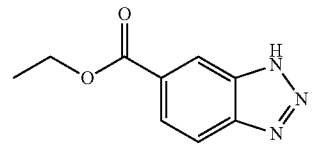

22-2

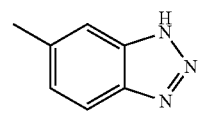

22-3

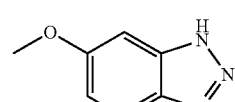

22-4

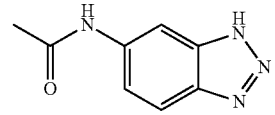

22-5

(Compound Represented by Formula (7))

Next, a compound represented by Formula (7) will be described.

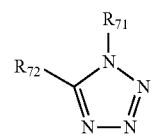

Formula (7)

In Formula (7), each of $R_{71}$ and $R_{72}$ independently represents a hydrogen atom, an alkyl group, an alkenyl group, an alkynyl group, an aryl group, a heteroaryl group, or a group obtained by combining these. Among these, a hydrogen atom, an alkyl group, or an aryl group is preferable as $R_{71}$.

(Compound Represented by Formula (8))

Next, a compound represented by Formula (8) will be described.

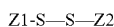

Z1-S—S—Z2      Formula (8)

In Formula (8), each of Z1 and Z2 independently represents an alkyl group, an alkenyl group, an alkynyl group, an aryl group, a heteroaryl group, or a group obtained by combining these groups. Among these, an aryl group and a heteroaryl group are preferable. Z1 and Z2 may contain a substituent. Specific examples and preferred embodiments of the substituent are the same as those of the alkyl group represented by $R_2$ and $R_3$ described above.

The compound represented by Formula (8) is preferably a compound selected from the group consisting of the following Formulae (23a) to (23d).

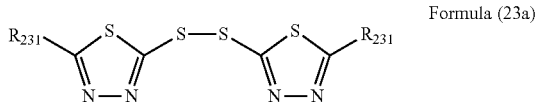
Formula (23a)

In Formula (23a), $R_{231}$ represents a substituent. Specific examples and preferred embodiments of the substituent are the same as those of the substituents of the alkyl group represented by $R_2$ and $R_3$ described above. The group represented by $R_{231}$ may further have a substituent. Examples of the substituent include the substituents of the alkyl group represented by $R_2$ and $R_3$ in Formula (1) described above. A plurality of groups represented by $R_{231}$ may be the same as or different from each other.

Specific examples of the compound represented by Formula (23a) will be shown below, but the present invention is not limited thereto.

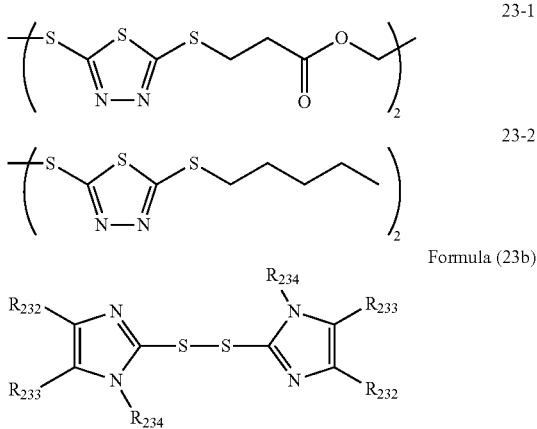

23-1

23-2

Formula (23b)

In Formula (23b), each of $R_{232}$ and $R_{233}$ independently represents a hydrogen atom or a substituent. Specific examples and preferred embodiments of the substituent are the same as those of the substituents of the alkyl group represented by $R_2$ and $R_3$ described above. $R_{232}$ and $R_{233}$ may form a ring by being bonded to each other.

$R_{234}$ represents a hydrogen atom or a group which can be substituted with a nitrogen atom. Examples of the substituent which can be substituted with a nitrogen atom preferably include the groups exemplified as $R_2$ and $R_3$ in Formula (1) described above. A plurality of groups represented by each of $R_{232}$, $R_{233}$, and $R_{234}$ may be the same as or different from each other.

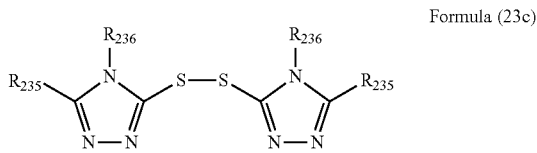
Formula (23c)

In Formula (23c), $R_{235}$ represents a hydrogen atom or a substituent. Specific examples and preferred embodiments of the substituent are the same as those of the substituents of the alkyl group represented by $R_2$ and $R_3$ described above. $R_{236}$ represents a hydrogen atom or a group which can be substituted with a nitrogen atom. Examples of the group which can be substituted with a nitrogen atom include the groups exemplified as $R_2$ and $R_3$ in Formula (1) described above. A plurality of groups represented by each of $R_{235}$ and $R_{236}$ may be the same as or different from each other.

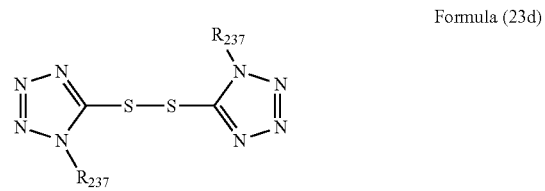
Formula (23d)

In Formula (23d), $R_{237}$ represents a group which can be substituted with a nitrogen atom. Examples of the group which can be substituted with a nitrogen atom preferably include the groups exemplified as $R_2$ and $R_3$ in Formula (1) described above. A plurality of groups represented by $R_{237}$ may be the same as or different from each other.

(Group Represented by Formula (25))

Next, a group represented by Formula (25) will be described.

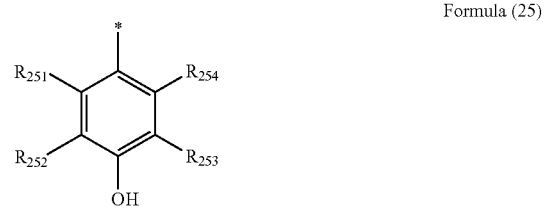
Formula (25)

In Formula (25), each of $R_{251}$, $R_{252}$, $R_{253}$, and $R_{254}$ independently represents a hydrogen atom or a substituent. Examples of the substituent include the substituents of the alkyl group represented by $R_2$ and $R_3$ described above. Among the substituents, an alkyl group, an alkoxy group, and a hydroxy group are preferable as the substituent because these exert a small influence on the mobility and further improve the mobility. Particularly, either or both of $R_{252}$ and $R_{253}$ preferably represent an alkyl group or an alkoxy group. As the alkyl group, a methyl group, an ethyl group, an isopropyl group, a t-butyl group, a t-amyl group, or the like is preferable. As the alkoxy group, a methoxy group, an ethoxy group, or the like is particularly preferable. Either or both of $R_{252}$ and $R_{253}$ more preferably represent an alkyl group having 2 to 5 carbon atoms, even more preferably represent an ethyl group, an i-propyl group, a t-butyl group, or a t-amyl group, and most preferably represent a t-butyl group.

Each of $R_{251}$ and $R_{254}$ preferably represents a hydrogen atom.

* represents a binding position.

The hydrogen atom removed from the compounds represented by the Formulae (1) to (8) described above is not particularly limited. However, from the viewpoint of further improving the migration inhibition ability, it is preferable to remove any of the hydrogen atoms contained in the groups represented by $R_1$ to $R_{12}$ in the compounds represented by Formulae (1) to (4), any of the hydrogen atoms contained in the group represented by Z in the compound represented by Formula (5), any of the hydrogen atoms contained in the group represented by $R_{61}$ or $R_{62}$ in the compound represented by Formula (6), any of the hydrogen atoms contained in the group represented by $R_{71}$ or $R_{72}$ in the compound represented by Formula (7), and any of the hydrogen atoms contained in the group represented by Z1 or Z2 in Formula (8).

The molecular weight of the polymer compound (B) is not particularly limited. However, Mw of the polymer compound (B) is preferably equal to or greater than 5,000, and more preferably 50,000 to 1,000,000. Furthermore, Mn of the polymer compound (B) is preferably 30,000 to 500,000. Herein, Mw means a weight average molecular weight, and Mn means a number average molecular weight. The value of the molecular weight is a value which is measured by a gel permeation chromatography (GPC) method and expressed in terms of polystyrene. The weight average molecular weight and the number average molecular weight are measured by the GPC method by dissolving the polymer in tetrahydrofuran and by using high-speed GPC apparatus (HLC-8220GPC) manufactured by TOSOH CORPORATION, TSKgel SuperHZ4000 (manufactured by TOSOH CORPORATION, 4.6 mm I. D.×15 cm) as a column, and tetrahydrofuran (THF) as an eluant.

(Synthesis Method of Polymer Compound (B))

Hereinafter, the synthesis method of the polymer compound (B) of the present invention that has a specific group (B in Formula (B)), which has an anti-migration site, on a side chain will be described.

Examples of the synthesis method include the following methods i) and ii).

i) A method of polymerizing a monomer that is represented by the following Formula (B1) and has a specific group (B in Formula (B1)), which has an anti-migration site, on a side chain

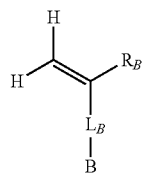

Formula (B1)

In Formula (B1), the definition, the specific examples, and the preferred embodiments of each of $R_B$, $L_B$, and B are the same as those of each of $R_B$, $L_B$, and B in Formula (B) described above.

ii) A method of reacting a polymer compound having a reactive group with a compound, which has a group that can react with the reactive group in the polymer compound and a specific group (B in Formula (B)) that has an anti-migration site, such that the specific group having the anti-migration site is introduced into the polymer compound Among these, from the viewpoint of synthesis suitability, the method i) is preferable.

As described above, the specific group that has an anti-migration site may be introduced into the polymer compound by polymerizing a monomer, which contains the specific group having an anti-migration site in the form of a pendant, or may be introduced into the polymer compound by being added to or substituting a portion of the reactive group-containing polymer synthesized in advance.

In the method i), a monomer other than the monomer represented by Formula (B1) may be used as a copolymerization component. It is possible to use any monomer as long as the effects of the present invention are not impaired.

Specific examples of the usable monomer include unsubstituted (meth)acrylic acid esters such as methyl(meth)acrylate, butyl(meth)acrylate, hexyl(meth)acrylate, 2-ethylhexyl (meth)acrylate, cyclohexyl(meth)acrylate, benzyl(meth) acrylate, and stearyl(meth)acrylate, halogen-substituted (meth)acrylic acid esters such as 2,2,2-trifluoroethyl(meth) acrylate, 3,3,3-trifluoropropyl(meth)acrylate, 2-(perfluorohexyl)ethyl acrylate, and 2-chloroethyl (meth)acrylate, (meth)acrylamides such as butyl(meth)acrylamide, isopropyl (meth)acrylamide, octyl(meth)acrylamide, 2-ethylhexyl acrylamide, and dimethyl (meth)acrylamide, styrenes such as styrene and α-methylstyrene, vinyl compounds such as N-vinylcarbazole, vinyl acetate, N-vinylacetamide, and N-vinylcaprolactam, dimethylaminoethyl(meth)acrylate, diethylaminoethyl(meth)acrylate, 2-ethylthio-ethyl (meth)acrylate, (meth)acrylic acid, 2-hydroxyethyl(meth)acrylate, and the like. Furthermore, macromonomers obtained by using the aforementioned monomers can also be used.

Among these, a monomer represented by the following Formula (C1) can be preferably used because the monomer exerts a small influence on the mobility and further improves the mobility.

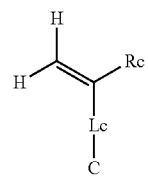

Formula (C1)

In Formula (C1), the definition, the specific examples, and the preferred embodiments of $R_c$ are the same as those of $R_B$ in Formula (B) described above. $L_c$ represents a single bond, —$CO_2$—, —$CONR_{261}$—, —$NR_{261}$—, or —O—. $R_{261}$ represents a hydrogen atom or an alkyl group having 1 to 5 carbon atoms. C represents an alkyl group, an alkenyl group, an alkynyl group, or an aryl group. Examples of the alkyl group, the alkenyl group, the alkynyl group, and the aryl group include the groups exemplified as $R_2$ and $R_3$ in Formula (1) described above.

The polymer compound having a reactive group that is used in the synthesis method ii) is synthesized by radically polymerizing a monomer having a reactive group for introducing the specific group having an anti-migration site. Examples of the monomer having a reactive group for introducing the specific group having an anti-migration site include monomers having a carboxyl group, a hydroxyl group, an epoxy group, or an isocyanate group as the reactive group.

Examples of the monomer containing a carboxyl group include (meth)acrylic acid, itaconic acid, vinyl benzoate, Aronix M-5300, M-5400, and M-5600 manufactured by TOAGOSEI CO., LTD., acrylesters PA and HH manufactured by Mitsubishi Rayon Co., Ltd., light acrylate HOA-HH manufactured by KYOEISHA CHEMICAL Co., LTD., NK esters SA and A-SA manufactured by SHIN-NAKAMURA CHEMICAL CO., LTD., and the like.

As the monomer containing a hydroxyl group, it is possible to use 2-hydroxyethyl (meth)acrylate, 4-hydroxybutyl(meth)acrylate, 2-hydroxypropyl(meth)acrylate, 2-hydroxybutyl(meth)acrylate, 1-(meth)acryloyl-3-hydroxy-adamantane, hydroxymethyl (meth)acrylamide, 2-(hydroxymethyl)-(meth)acrylate, methyl ester of 2-(hydroxymethyl)-(meth)acrylate, 3-chloro-2-hydroxypropyl (meth)acrylate, 3,5-dihydroxypentyl(meth)acrylate, 1-hydroxymethyl-4-(meth)acryloylmethyl-cyclohexane, 2-hydroxy-3-phenoxypropyl(meth)acrylate, 1-methyl-2-acryloyloxypropyl phthalate, 2-acryloyloxyethyl-2-hydroxyethyl phthalate, 1-methyl-2-acryloyloxyethyl-2-hydroxypropyl phthalate, 2-acryloyloxyethyl-2-hydroxy-3-chloropropyl phthalate, Aronix M-554, M-154, M-555, M-155, and M-158 manufactured by TOAGOSEI CO., LTD., Blemmer PE-200, PE-350, PP-500, PP-800, PP-1000, 70PEP-350B, and 55PET800 manufactured by NOF CORPORATION, and lactone-modified acrylate having the following structure. $CH_2=CRCOOCH_2CH_2[OC(=O)C_5H_{10}]_n OH$ (R=H or Me, n=1 to 5)

As the monomer having an epoxy group, it is possible to use glycidyl(meth)acrylate, Cyclomer A and M manufactured by DAICEL CORPORATION, and the like.

As the monomer having an isocyanate group, it is possible to use Karenz AOI and MOI manufactured by SHOWA DENKO K.K.

The polymer compound having a reactive group used in the synthesis method ii) may contain, as a copolymerization component, a monomer other than the aforementioned "monomer having a reactive group for introducing the specific group having an anti-migration site". It is possible to use any monomer as long as the effects of the present invention are not impaired.

Specific examples and preferred embodiments of the usable monomers are the same as those of the aforementioned "monomer other than the monomer represented by Formula (B1) that may be used as a copolymerization component in the method i)".

As the combination of the reactive group of the polymer compound and the group which can react with the reactive group in the polymer compound in the synthesis method ii), the following combinations are exemplified.

That is, examples of the combination of (the reactive group of the polymer compound, the group which can react with the reactive group in the polymer compound) include combinations of (a carboxyl group, a carboxyl group), (a carboxyl group, an epoxy group), (a carboxyl group, an isocyanate group), (a carboxyl group, a benzyl halide group), (a hydroxyl group, a carboxyl group), (a hydroxyl group, an epoxy group), (a hydroxyl group, an isocyanate group), (a hydroxyl group, benzyl halide), (an isocyanate group, a hydroxyl group), (an isocyanate group, a carboxyl group), (an epoxy group, a carboxyl group), and the like.

As the monomer for synthesizing the polymer compound having the reactive group, for example, it is possible to use acrylic acid, glycidyl acrylate, Cyclomer A (manufactured by DAICEL CORPORATION), Karenz AOI (manufactured by SHOWA DENKO K.K.), methacrylic acid, glycidyl methacrylate, Cyclomer M (manufactured by DAICEL CORPORATION), and Karenz MOI (manufactured by SHOWA DENKO K.K.).

Specific examples of the polymer compound (B) in the present invention will be shown below, but the present invention is not limited thereto.

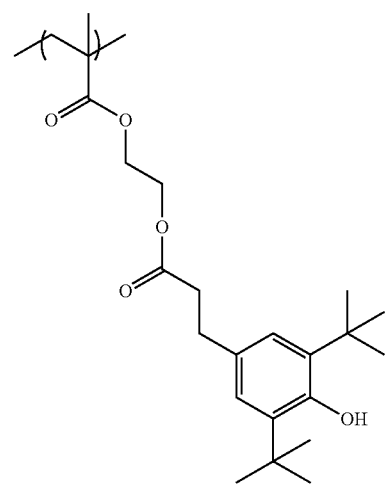

(B-1)

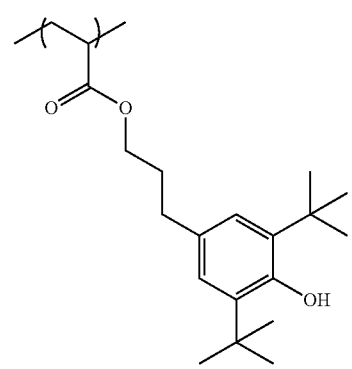

(B-2)

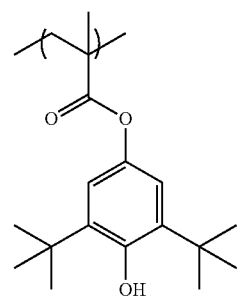

(B-3)

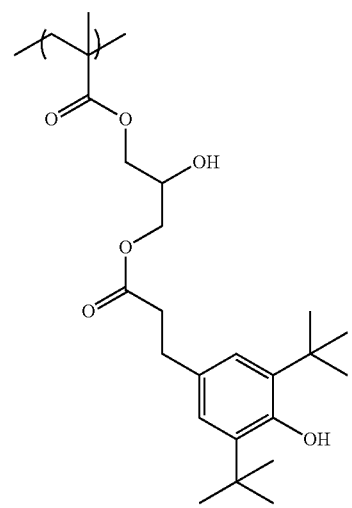

(B-4)

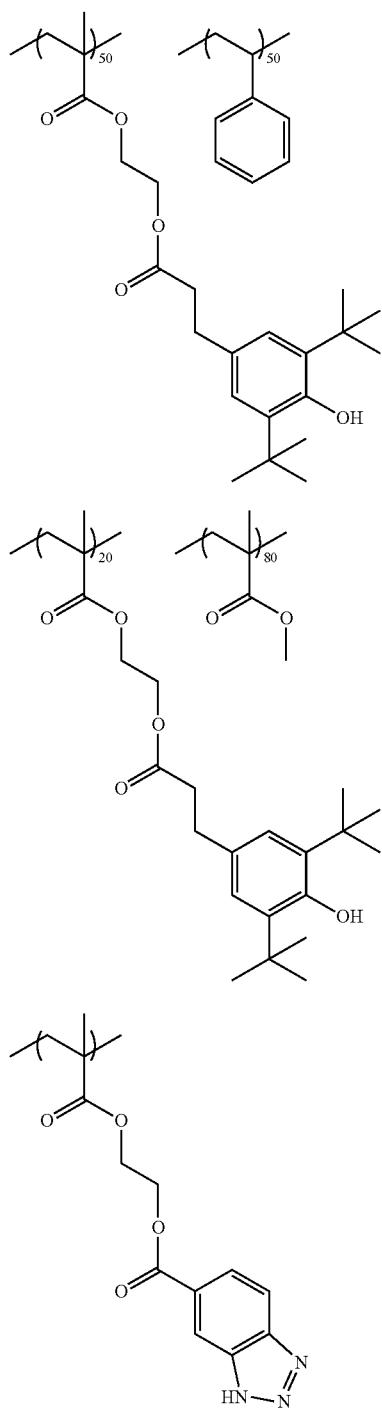
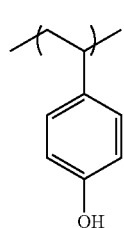
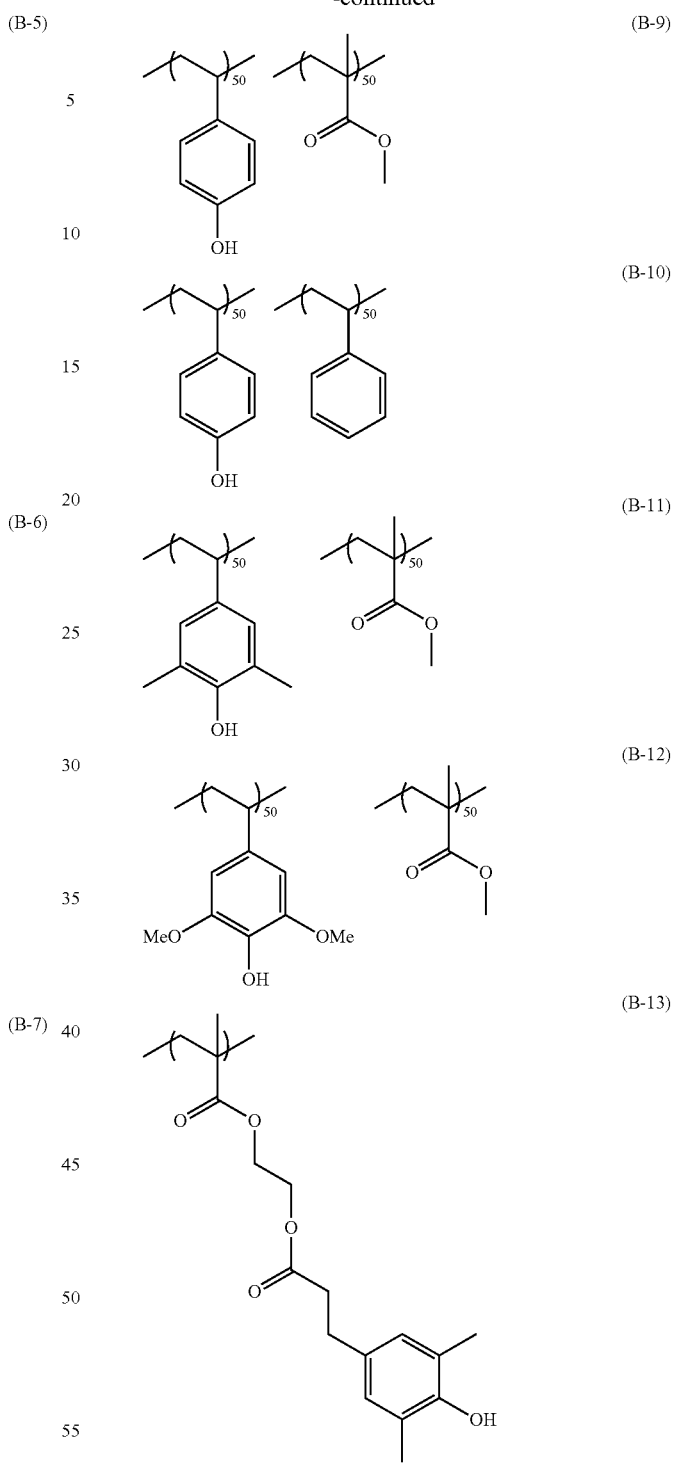

In the composition of the present invention, the content of the polymer compound (B) is not particularly limited. However, the content of the polymer compound (B) is preferably 0.1% by mass to 20% by mass, and more preferably 1% by mass to 10% by mass, with respect to the organic semiconductor material (A).

From the viewpoint of homogeneity and crystallinity of the organic semiconductor layer to be formed, the composition of the present invention preferably contains a solvent.

The solvent is not particularly limited, and preferred examples thereof include aromatic compounds such as toluene, xylene, mesitylene, 1,2,3,4-tetrahydronaphthalene (tetralin), chlorobenzene, dichlorobenzene, anisole, and the like.

As described above, the composition of the present invention exhibits excellent characteristics. Therefore, the composition of the present invention is preferable as a composition for forming an organic semiconductor layer of an organic thin-film transistor, an organic EL, and an organic thin-film solar cell. Particularly, the composition of the present invention is preferable as a composition for forming an organic semiconductor layer of an organic thin-film transistor.

[Organic Thin-film Transistor]

The organic thin-film transistor (organic semiconductor transistor) of the present invention is an organic thin-film transistor in which the composition of the present invention is used in an organic semiconductor layer. Particularly, the organic thin-film transistor of the present invention is preferably a bottom contact-type organic thin-film transistor.

An embodiment of the organic thin-film transistor of the present invention will be described with reference to a drawing.

FIG. 1 is a schematic cross-sectional view showing an embodiment of the organic thin-film transistor of the present invention.

In FIG. 1, an organic thin-film transistor 100 includes a substrate 10, a gate electrode 20, a gate insulating film 30, a source electrode 40, a drain electrode 42, an organic semiconductor layer 50, and a sealing layer 60. The organic semiconductor layer 50 is formed by using the composition of the present invention described above. The organic thin-film transistor 100 is a bottom contact-type organic thin-film transistor.

Hereinafter, the substrate, the gate electrode, the gate insulating film, the source electrode, the drain electrode, the organic semiconductor layer, and the sealing layer and methods for forming these will be specifically described.

<Substrate>

The substrate plays a role of supporting the gate electrode, the source electrode, the drain electrode, and the like which will be described later.

The type of the substrate is not particularly limited, and examples thereof include a plastic substrate, a glass substrate, a ceramic substrate, and the like. Among these, from the viewpoint of the applicability to various devices and from the viewpoint of the cost, a glass substrate or a plastic substrate is preferable.

Examples of the material of the plastic substrate include a thermosetting resin (for example, an epoxy resin, a phenol resin, a polyimide resin, or a polyester resin (for example, PET or PEN)) and a thermoplastic resin (for example, a phenoxy resin, polyethersulfone, polysulfone, or polyphenylene sulfone).

Examples of the material of the ceramic substrate include alumina, aluminum nitride, zirconia, silicon, silicon nitride, silicon carbide, and the like.

Examples of the material of the glass substrate include soda glass, potash glass, borosilicate glass, quartz glass, aluminosilicate glass, lead glass, and the like.

<Gate Electrode>

Examples of the material of the gate electrode include a metal such as gold (Au), silver, aluminum, copper, chromium, nickel, cobalt, titanium, platinum, magnesium, calcium, barium, or sodium; a conductive oxide such as $InO_2$, $SnO_2$, or ITO; a conductive polymer such as polyaniline, polypyrrole, polythiophene, polyacetylene, or polydiacetylene; a semiconductor such as silicon, germanium, or gallium arsenide; a carbon material such as fullerene, carbon nanotubes, graphite; and the like. Among these, a metal is preferable, and silver or aluminum is more preferable.

The thickness of the gate electrode is not particularly limited but is preferably 20 nm to 200 nm.

The method for forming the gate electrode is not particularly limited. Examples of the method include a method of vacuum vapor-depositing or sputtering an electrode material onto a substrate, a method of coating a substrate with a composition for forming an electrode, a method of printing a composition for forming an electrode on a substrate, and the like. Furthermore, when the electrode is patterned, examples of the patterning method include a photolithography method; a printing method such as ink jet printing, screen printing, offset printing, relief printing; a mask vapor deposition method; and the like.

<Gate Insulating Film>

Examples of the material of the gate insulating film include a polymer such as polymethyl methacrylate, polystyrene, polyvinyl phenol, polyimide, polycarbonate, polyester, polyvinyl alcohol, polyvinyl acetate, polyurethane, polysulfone, polybenzoxazole, polysilsesquioxane, an epoxy resin, or a phenol resin; an oxide such as silicon dioxide, aluminum oxide, or titanium oxide; a nitride such as silicon nitride; and the like. Among these materials, in view of compatibility with the organic semiconductor layer, a polymer is preferable.

When a polymer is used as the material of the gate insulating film, it is preferable to concurrently use a crosslinking agent (for example, melamine). If the crosslinking agent is concurrently used, the polymer is crosslinked, and therefore the durability of the gate insulating film to be formed is improved.

The film thickness of the gate insulating film is not particularly limited but is preferably 100 nm to 1,000 nm.

The method for forming the gate insulating film is not particularly limited. Examples of the method include a method of coating the substrate, on which the gate electrode has been formed, with a composition for forming a gate insulating film, a method of vapor-depositing or sputtering the material of the gate insulating film onto the substrate, and the like. The method of coating the substrate with the composition for forming a gate insulating film is not particularly limited, and a known method (a bar coating method, a spin coating method, a knife coating method, or a doctor blade method) can be used.

When the gate insulating film is formed by coating the substrate with the composition for forming a gate insulating film, for the purpose of removing the solvent, causing crosslinking, or the like, the composition may be heated (baked) after coating.

<Source Electrode and Drain Electrode>

Specific examples of the material of the source electrode and the drain electrode are the same as the examples of the material of the gate electrode described above. Among the materials, a metal is preferable, and gold is more preferable.

The method for forming the source electrode and the drain electrode is not particularly limited. Examples of the method include a method of vacuum vapor-depositing or sputtering an electrode material onto the substrate on which the gate electrode and the gate insulating film have been formed, a method of coating the substrate with a composition for forming an electrode, a method of printing the composition for forming an electrode on the substrate, and the like.

Specific examples of the patterning method are the same as the examples of the patterning method of the gate electrode described above.

The channel length of the source electrode and the drain electrode is not particularly limited but is preferably 5 µm to 30 µm.

The channel width of the source electrode and the drain electrode is not particularly limited but is preferably 10 µm to 200 µm.

<Organic Semiconductor Layer>

The organic semiconductor layer is a layer formed by using the organic semiconductor composition of the present invention described above.

The thickness of the organic semiconductor layer is not particularly limited but is preferably 10 nm to 200 nm.

The method for forming the organic semiconductor layer is not particularly limited. Examples of the method include a method of coating the substrate, on which the gate electrode, the gate insulating film, the source electrode, and the drain electrode have been formed, with the organic semiconductor composition, and the like. Specific examples of the method of coating the substrate with the organic semiconductor composition are the same as the method of coating the substrate with the composition for forming a gate insulating film. When the organic semiconductor layer is formed by coating the substrate with the organic semiconductor composition, for the purpose of removing the solvent, causing crosslinking, or the like, the composition may be heated (baked) after coating.

<Sealing Layer>

From the viewpoint of durability, the organic thin-film transistor of the present invention preferably includes a sealing layer as the outermost layer. For the sealing layer, a known sealant can be used.

The thickness of the sealing layer is not particularly limited but is preferably 0.2 µm to 10 µm.

The method for forming the sealing layer is not particularly limited. Examples of the method include a method of coating the substrate, on which the gate electrode, the gate insulating film, the source electrode, the drain electrode, and the organic semiconductor layer have been formed, with a composition for forming a sealing layer, and the like. Specific examples of the method of coating the substrate with the composition for forming a sealing layer are the same as the examples of the method of coating the substrate with the composition for forming a gate insulating film. When the organic semiconductor layer is formed by coating the substrate with the composition for forming a sealing layer, for the purpose of removing the solvent, causing crosslinking, or the like, the composition may be heated (baked) after coating.

Figure 2:
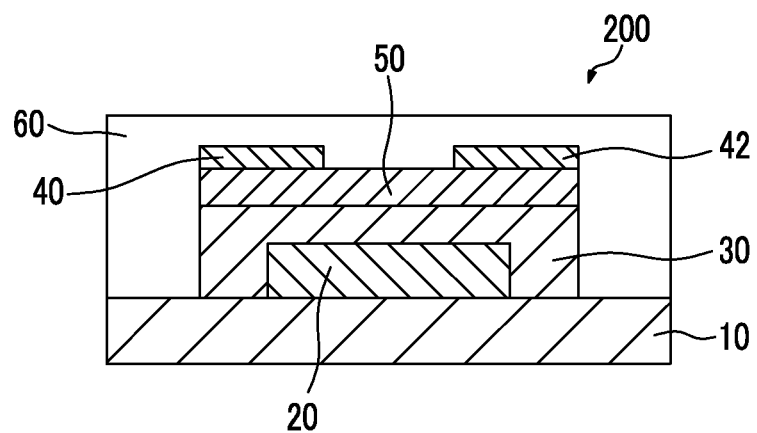
FIG. 2 is a schematic cross-sectional view showing another embodiment of the organic thin-film transistor of the present invention.

FIG. 2 is a schematic cross-sectional view showing another embodiment of the organic thin-film transistor of the present invention.

In FIG. 2, an organic thin-film transistor 200 includes the substrate 10, the gate electrode 20, the gate insulating film 30, the source electrode 40, the drain electrode 42, the organic semiconductor layer 50, and the insulating layer 60. The organic semiconductor layer 50 is formed by using the composition of the present invention described above. The organic thin-film transistor 200 is a top contact-type organic thin-film transistor.

The substrate, the gate electrode, the gate insulating film, the source electrode, the drain electrode, the organic semiconductor layer, and the sealing layer are as described above.

EXAMPLES

Examples will be described below, but the present invention is not limited thereto.

Synthesis Example 1

Migration Inhibitor b-1

First, a compound M-1 was synthesized according to the following scheme.

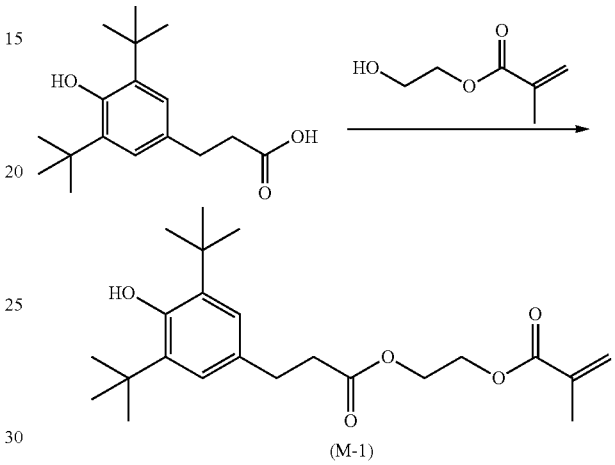

(M-1)

3-(3,5-di-tert-butyl-4-hydroxyphenyl)propionate (4.0 g, 14.4 mmol), dichloromethane (20 ml), 2-hydroxyethyl methacrylate (2.87 g, 14.4 mmol), tetrahydrofuran (10 ml), 1-ethyl-3-(3-dimethylaminopropyl)carbodiimide hydrochloride (2.75 g, 14.4 mmol), and 4-dimethylaminopyridine (0.10 g, 0.72 mmol) were put in this order into a reaction container.

After the reaction solution was stirred for 3 hours at room temperature, 1 N hydrochloric acid (50 ml) was put into the reaction container, and extraction was performed by using 100 ml of ethyl acetate. The organic phase was washed with saturated saline and dried over magnesium sulfate. The solid content was separated by filtration and concentrated under reduced pressure. The concentrate was purified by silica gel column chromatography (mobile phase: hexane/ethyl acetate=8/1), thereby obtaining 3.2 g of the compound M-1 (yield: 58%).

Thereafter, the compound M-1 (5.86 g) and 4.9 g of toluene were put into a 100 mL three-neck flask and heated to 80° C. in a nitrogen gas stream. To the resultant, 49.3 mg of azobisisobutyronitrile (manufactured by Wako Pure Chemical Industries, Ltd.) and 1.0 g of toluene were added, and the resultant was stirred for 16 hours. After the reaction ended, the resultant was cooled to room temperature and diluted with 18.0 g of toluene. After reprecipitation was performed by using hexane, a molecular weight fraction was separated by preparative chromatography, thereby obtaining 1 g of a migration inhibitor b-1 (Mw=510,000, Mn=320,000) having the following structure. Herein, Mw means a weight average molecular weight, and Mn means a number average molecular weight. The value of the molecular weight is a value measured by a gel permeation chromatography (GPC) method and expressed in terms of polystyrene. The weight average molecular weight and the number average molecular weight were measured by the GPC method by dissolving the polymer in tetrahydrofuran and by using high-speed GPC apparatus (HLC-8220GPC) manufactured by TOSOH CORPORATION, TSKgel SuperHZ4000 (manufactured by TOSOH CORPORATION, 4.6 mm I. D.×15 cm) as a column, and tetrahydrofuran (THF) as an eluant.

The migration inhibitor b-1 corresponds to the polymer compound (B) containing the repeating unit represented by Formula (B).

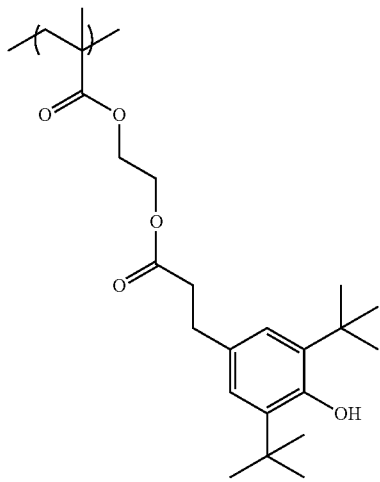

(b-1)

Synthesis Example 2

Migration Inhibitor b-2

The compound M-1 (3.51 g), 3.60 g of methyl methacrylate, and 6.1 g of toluene were put into a 100 mL three-neck flask and heated to 80° C. in a nitrogen gas stream. To the resultant, 148 mg of azobisisobutyronitrile (manufactured by Wako Pure Chemical Industries, Ltd.) and 1.0 g of toluene were added, and the resultant was stirred for 16 hours. After the reaction ended, the resultant was cooled to room temperature and diluted with 18.0 g of toluene. After reprecipitation was performed by using hexane, a molecular weight fraction was separated by preparative chromatography, thereby obtaining 4.8 g of a migration inhibitor b-2 (Mw=470,000, Mn=290,000) having the following structure. The method for measuring the weight average molecular weight (Mw) and the number average molecular weight (Mn) is as described above.

The migration inhibitor b-2 corresponds to the polymer compound (B) containing the repeating unit represented by Formula (B).

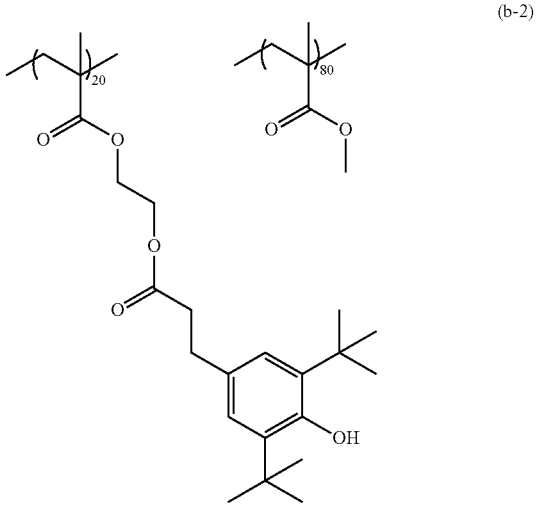

(b-2)

Synthesis Example 3

Migration Inhibitor b-3

First, a compound M-2 was synthesized according to the following scheme.

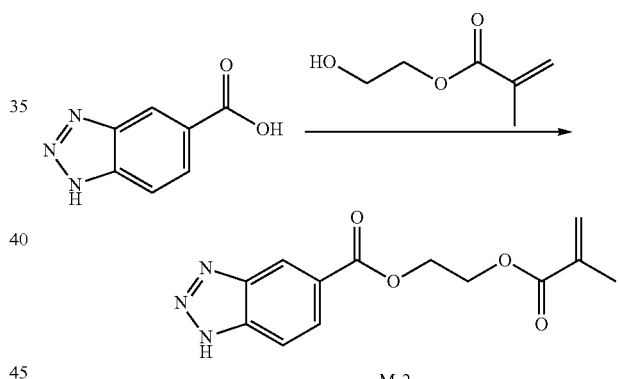

3.0 g of 1H-benzotriazole-5-carboxylic acid (18.4 mmol), 54 ml of tetrahydrofuran, 6 ml of dimethylformamide (2.39 g, 18.4 mmol), 3.54 g of 1-ethyl-3-(3-dimethylaminopropyl) carbodiimide hydrochloride (18.4 mmol), and 0.22 g of 4-dimethylaminopyridine (0.184 mmol) were put in this order into a reaction container and stirred for 24 hours at 70° C. Thereafter, 50 ml of water was added thereto, and extraction was performed by using 100 ml of ethyl acetate. The organic phase was washed with saturated saline and dried over magnesium sulfate. The solid content was separated by filtration, and then the solution was concentrated under reduced pressure. The concentrate was purified by silica gel column chromatography (mobile phase: hexane/ethyl acetate=2/1), thereby obtaining 3.0 g of the compound M-2 (yield: 59%).

The compound M-2 (2.48 g), 3.60 g of methyl methacrylate, and 5.1 g of MFG (manufactured by Wako Pure Chemical Industries, Ltd.) were put into a 100 mL three-neck flask and heated to 80° C. in a nitrogen gas stream. To the resultant, 147 mg of azobisisobutyronitrile (manufactured by Wako Pure Chemical Industries, Ltd.) and 1.0 g of methyl propylene glycol (MFG) (manufactured by Wako Pure Chemical Industries, Ltd.) were added, and the resultant was stirred for 16 hours. After the reaction ended, the resultant was cooled to room temperature and diluted with 18.0 g of MFG (manufactured by Wako Pure Chemical Industries, Ltd.). After reprecipitation was performed by using hexane, a molecular weight fraction was separated by preparative chromatography, thereby obtaining 4.8 g of a migration inhibitor b-3 (Mw=400,000, Mn=270,000) having the following structure. The method for measuring the weight average molecular weight (Mw) and the number average molecular weight (Mn) is as described above.

The migration inhibitor b-3 corresponds to the polymer compound (B) containing the repeating unit represented by Formula (B).

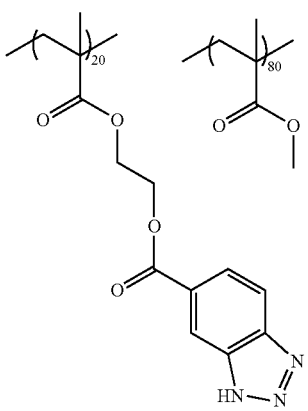

(b-3)

Synthesis Example 4

Migration Inhibitor b-5

In a 200 ml flask, 10.58 g (0.06 mol) of t-butoxystyrene and 6.49 g (0.06 mol) of methyl methacrylate were dissolved in 40 ml of tetrahydrofuran. While the resultant was being stirred in a nitrogen gas stream, 0.25 g of a polymerization initiator V-601 (manufactured by Wako Pure Chemical Industries, Ltd) was added thereto, and a reaction was performed for 3 hours at 70° C. After the reaction solution was left to cool, hexane was added to the reaction solution with stirring, thereby educing a resin. The obtained resin was washed with hexane and dried under reduced pressure. Subsequently, 15 g of the obtained resin was weighed and put into a 200 ml flask, 200 g of propylene glycol monomethyl ether and 20 ml of concentrated hydrochloric acid were added thereto, and a reaction was performed for 3 hours at 80° C. After the reaction solution was left to cool, deionized water was added to the reaction solution with stirring, thereby educing a white resin. The obtained resin was washed with deionized water and dried under reduced pressure, thereby obtaining 10 g of a migration inhibitor b-5 (Mw=25,000, Mn=11,000) having the following structure. The method for measuring the weight average molecular weight (Mw) and the number average molecular weight (Mn) is as described above.

The migration inhibitor b-5 corresponds to the polymer compound (B) containing the repeating unit represented by Formula (B).

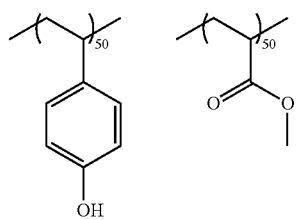

(b-5)

Synthesis Example 5

Migration Inhibitor b-6

By the same synthesis method as used in Synthesis example 4, a migration inhibitor b-6 (Mw=20,000, Mn=9,000) having the following structure was obtained. The method for measuring the weight average molecular weight (Mw) and the number average molecular weight (Mn) is as described above.

The migration inhibitor b-6 corresponds to the polymer compound (B) containing the repeating unit represented by Formula (B).

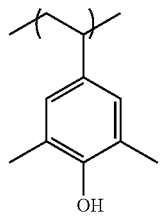

(b-6)

Synthesis Example 6

Migration Inhibitor b-7

By the same synthesis method as used in Synthesis example 4, a migration inhibitor b-7 (Mw=23,000, Mn=10,000) having the following structure was obtained. Here, Me represents a methyl group. The method for measuring the weight average molecular weight (Mw) and the number average molecular weight (Mn) is as described above.

The migration inhibitor b-7 corresponds to the polymer compound (B) containing the repeating unit represented by Formula (B).

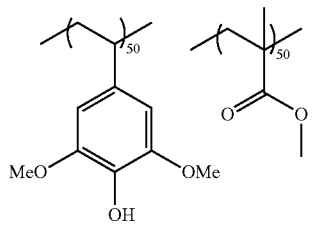

(b-7)

Synthesis Example 7

Migration Inhibitor b-8

By the same synthesis method as used in Synthesis example 4, a migration inhibitor b-8 (Mw=30,000, Mn=12,000) having the following structure was obtained. The method for measuring the weight average molecular weight (Mw) and the number average molecular weight (Mn) is as described above.

The migration inhibitor b-8 corresponds to the polymer compound (B) containing the repeating unit represented by Formula (B).

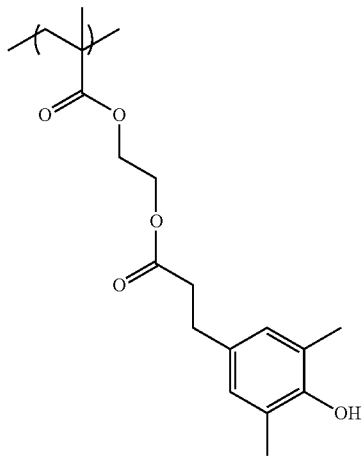

(b-8)

Example 1

Preparation of Organic Semiconductor Composition

TIPS pentacene (6,13-bis(triisopropylsilylethynyl)pentacene) and the migration inhibitor b-1 were dissolved in toluene (TIPS pentacene/migration inhibitor b-1=100/5 (w/w), solution concentration: 1% by mass), thereby preparing an organic semiconductor composition. The obtained organic semiconductor composition was named a composition 1.

(Preparation of Organic Semiconductor Transistor (Element Preparation Method 1))

Al to be a gate electrode was vapor-deposited (thickness: 50 nm) onto a glass substrate (Eagle XG: manufactured by Corning). Onto the A1, a propylene glycol monomethyl ether acetate (PGMEA) solution (solution concentration: 2% by mass) of a composition for a gate insulating film (polyvinylphenol/melamine=1/1 (w/w)) was applied by spin coating and baked for 60 minutes at 150° C., thereby forming a gate insulating film having a film thickness of 400 nm. Onto the gate insulating film, Au was vapor-deposited through a mask, thereby forming a source electrode and a drain electrode having a channel length of 20 μm and a channel width of 200 μm. Onto the source and drain electrodes, the composition 1 was applied by spin coating and baked for 15 minutes at 140° C., thereby forming an organic semiconductor layer having a thickness of 100 nm. Onto the organic semiconductor layer, Cytop CTL-107MK (manufactured by ASAHI GLASS CO., LTD.) (composition for forming a sealing layer) was applied by spin coating and baked for 30 minutes at 140° C., thereby forming a sealing layer (uppermost layer) having a thickness of 2 μm. In this way, an organic semiconductor transistor (bottom contact type) was obtained. The preparation method described above was named an element preparation method 1.

<Evaluation of Coating Properties>

According to the same procedure as used in Preparation of organic semiconductor transistor of Example 1, a gate electrode was vapor-deposited onto a glass substrate, and a gate insulating film was formed.

100 μL of the composition 1 was dropped onto the gate insulating film, and 10 seconds later, the radius of the liquid droplet was measured by using a digital microscope VHX-900 (manufactured by KEYENCE CORPORATION). The measured radius of the liquid droplet was named R1.

A composition for comparison not containing a migration inhibitor was prepared according to the same procedure as used in Preparation of organic semiconductor transistor of Example 1, except that the dissolution of a migration inhibitor was not performed. Onto the gate insulating film formed as above, 100 μL of the obtained composition for comparison was dropped, and 10 seconds later, the radius of the liquid droplet was measured by using a digital microscope VHX-900 (manufactured by KEYENCE CORPORATION). The measured radius of the liquid droplet was named R2.

From the measured R1 and R2, R1/R2 was calculated and evaluated according to the following criteria. The results are shown in Table 1. From the viewpoint of coating properties, R1/R2 is preferably A, B, or C, more preferably A or B, and even more preferably A.

A: R1/R2≥2
B: 2>R1/R2≥1.5
C: 1.5>R1/R2≥1
D: 1>R1/R2

<Evaluation of Mobility>

Each of the electrodes of the obtained organic semiconductor transistor was connected to each of the terminals of a manual prober connected to a semiconductor parameter•analyzer (4155C, manufactured by Agilent Technologies), thereby evaluating the field effect transistor (FET). Specifically, by measuring the drain current-gate voltage (Id-Vg) characteristics, a field effect mobility ([cm$^2$/V·sec]) was calculated. The calculated field effect mobility was named μ1.

According to the same procedure as used in Evaluation of coating properties described above, a composition for comparison not containing a migration inhibitor was prepared. Thereafter, an organic semiconductor transistor was prepared according to the same procedure as used in Preparation of organic semiconductor transistor of Example 1, except that the aforementioned composition for comparison was used instead of the composition 1. The field effect mobility of the obtained organic semiconductor transistor was calculated according to the same procedure as used for calculating μ1. The calculated field effect mobility was named μ2.

From the calculated μ1 and μ2, μ1/μ2 was calculated and evaluated according to the following criteria. The results are shown in Table 1. For the practical use and from the viewpoint of mobility, μ1/μ2 is preferably A, B, or C, more preferably A or B, and even more preferably A.

A: μ1/μ2≥0.8
B: 0.8>μ1/μ2≥0.5
C: 0.5>μ1/μ2≥0.1
D: 0.1>μ1/μ2

<Evaluation of Insulation Reliability>

The service life of the obtained organic semiconductor transistor was tested by using EHS-221MD (manufactured by Espec) under the following conditions, and the time taken for the value of resistance between source/drain electrodes to reach $1\times10^5\Omega$ was measured. The measured time was named T1.

Temperature: 60° C.
Humidity: RH 60%
Pressure: 1.0 atm
Drain voltage: −40 V
Voltage between source/drain electrodes: 20 V According to the same procedure as used in Evaluation of mobility described above, an organic semiconductor transistor, which used the composition for comparison not containing a migration inhibitor, was prepared. For the obtained organic semiconductor transistor, the time taken for the value of resistance between source/drain electrodes to reach $1\times10^5\Omega$ was measured according to the same procedure as used for measuring T1. The measured time was named T2.

From the calculated T1 and T2, T1/T2 was calculated and evaluated according to the following criteria. The results are shown in Table 1. From the viewpoint of insulation reliability, T1/T2 is preferably A, B, or C, more preferably A or B, and even more preferably A.

A: T1/T2≥5
B: 5>T1/T2≥2
C: 2>T1/T2>1
D: 0.1≥T1/T2

Example 2

An organic semiconductor composition was prepared according to the same procedure as used in Example 1, except that diF-TES-ADT (2,8-difluoro-5,11-bis(triethylsilylethynyl)anthradithiophene, manufactured by Sigma-Aldrich Co, LLC.) was used instead of TIPS-pentacene. The obtained organic semiconductor composition was named a composition 2.

(Preparation of Organic Semiconductor Transistor (Element Preparation Method 2))

A1 to be a gate electrode was vapor-deposited (film thickness: 50 nm) onto a glass substrate (Eagle XG: manufactured by Corning). Onto the A1, a PGMEA solution (solution concentration: 2% by mass) of a gate insulating film solution (polyvinylphenol/melamine=1/1 (w/w) mixture) was applied by spin coating and baked for 60 minutes at 150° C., thereby forming an insulating film having a film thickness of 400 nm. Onto the insulating film, the prepared composition 2 was applied by spin coating and baked for 15 minutes at 140° C., thereby forming an organic semiconductor layer having a film thickness of 100 nm. Thereafter, Ag was vapor-deposited onto the organic semiconductor layer through a mask, thereby forming a source electrode and a drain electrode having a channel length of 20 μm and a channel width of 200 μm. Onto the source and drain electrodes, Cytop CTL-107MK (manufactured by ASAHI GLASS CO., LTD.) was applied by spin coating and baked for 30 minutes at 140° C., thereby forming a sealing layer having a film thickness of 2 μm. In this way, an organic semiconductor transistor (top contact type) was prepared. The preparation method described above was named an element preparation method 2.

The obtained organic semiconductor transistor was evaluated in various ways according to the same procedure as in Example 1. The results are summarized in Table 1.

Examples 3 to 10 and Comparative Examples 1, 3, and 4>

Organic semiconductor compositions (compositions 3 to 10, X1, X3, and X4) were prepared according to the same procedure as in Example 1, except that an organic semiconductor material shown in the following Table 1 was used instead of TIPS-pentacene, and a migration inhibitor shown in the following Table 1 was used instead of the migration inhibitor b-1.

An organic semiconductor transistor was prepared and evaluated in various ways according to the same procedure as in Example 1, except that an organic semiconductor composition shown in the following Table 1 was used instead of the composition 1.

The results are summarized in Table 1.

Comparative Example 2

An organic semiconductor composition (composition X2) was prepared according to the same procedure as in Example 1, except that an organic semiconductor material shown in the following Table 1 was used instead of TIPS-pentacene, and a migration inhibitor shown in the following Table 1 was used instead of the migration inhibitor b-1.

An organic semiconductor transistor was prepared according to the same procedure as in Example 2, except that the composition X2 was used instead of the composition 2. The organic semiconductor transistor was evaluated in various ways according to the same procedure as in Example 1.

The results are summarized in Table 1.

TABLE 1

|  | Example 1 | Example 2 | Example 3 | Example 4 | Example 5 | Example 6 | Example 7 |
|---|---|---|---|---|---|---|---|
| Organic semiconductor composition | Composition 1 | Composition 2 | Composition 3 | Composition 4 | Composition 5 | Composition 6 | Composition 7 |
| Organic semiconductor material | a1 | a2 | a2 | a3 | a1 | a1 | a1 |
| Migration inhibitor | b-1 | b-1 | b-2 | b-2 | b-3 | b-4 | b-5 |
| Element preparation method | 1 | 2 | 1 | 1 | 1 | 1 | 1 |
| Coating properties | B | A | A | A | B | B | B |
| Mobility | A | A | A | B | A | C | B |
| Insulation reliability | A | A | A | B | A | B | B |

TABLE 1-continued

|  | Example 8 | Example 9 | Example 10 | Comparative example 1 | Comparative example 2 | Comparative example 3 | Comparative example 4 |
|---|---|---|---|---|---|---|---|
| Organic semiconductor composition | Composition 8 | Composition 9 | Composition 10 | Composition X1 | Composition X2 | Composition X3 | Composition X4 |
| Organic semiconductor material | a1 | a1 | a1 | a1 | a2 | a2 | a4 |
| Migration inhibitor | b-6 | b-7 | b-8 | x-1 | x-1 | x-2 | x-1 |
| Element preparation method | 1 | 1 | 1 | 1 | 2 | 1 | 2 |
| Coating properties | B | B | B | C | C | A | A |
| Mobility | B | B | B | D | D | A | D |
| Insulation reliability | B | B | A | C | C | D | C |

The details of each of the compositions shown in Table 1 are as follows.

a1: TIPS pentacene (6,13-bis(triisopropylsilylethynyl)pentacene, manufactured by Sigma-Aldrich Co, LLC.)

a2: diF-TES-ADT (2,8-difluoro-5,11-bis(triethylsilylethynyl)anthradithiophene, manufactured by Sigma-Aldrich Co, LLC.)

a3: PBTTT-C12 (poly[2,5-bis(3-dodecylthiophen-2-yl)thieno[3,2-b]thiophene], manufactured by Sigma-Aldrich Co, LLC.)

a4: P3HT (poly(3-hexylthiophene)) (manufactured by Sigma-Aldrich Co, LLC.)

b-1: migration inhibitor b-1 synthesized as described above b-2: migration inhibitor b-2 synthesized as described above b-3: migration inhibitor b-3 synthesized as described above b-4: Maruka Lyncur M (polyhydroxystyrene, weight average molecular weight of 18,000, manufactured by Maruzen Petrochemical Co., Ltd.)

b-5: migration inhibitor b-5 synthesized as described above b-6: migration inhibitor b-6 synthesized as described above b-7: migration inhibitor b-7 synthesized as described above b-8: migration inhibitor b-8 synthesized as described above x-1: IRGANOX-1076 (manufactured by BASF Corporation)

x-2: polymethyl methacrylate (weight average molecular weight: 100,000, manufactured by Wako Pure Chemical Industries, Ltd.)

As is evident from Table 1, the composition of the example of the present application that contained the polymer compound (B) improved the insulation reliability of the organic thin-film transistor without greatly reducing the mobility of the organic thin-film transistor.

From the comparison between Examples 1 and 3 to 10, it was confirmed that the compositions of Examples 1, 3, and 5 to 10, which contained pentacenes or anthradithiophenes as the organic semiconductor material, further improved the insulation reliability of the organic thin-film transistor. Particularly, the compositions of Examples 1, 3, 5, and 10, in which $L_B$ in Formula (B) represented a divalent organic group, further improved the insulation reliability of the organic thin-film transistor.

From the comparison between Examples 6 and 8, it was confirmed that the organic thin-film transistor using the composition of Example 8, in which $R_{252}$ or $R_{253}$ in Formula (25) represented an alkyl group, exhibited higher mobility.

From the comparison between Examples 1 and 10, it was confirmed that the organic thin-film transistor using the composition of Example 1, in which $R_{252}$ or $R_{253}$ in Formula (25) represented an alkyl group having 2 or more carbon atoms, exhibited higher mobility.

In contrast, the compositions of Comparative examples 1, 2, and 4 that contained IRGANOX-1076 instead of the polymer compound (B) greatly reduced the mobility of the organic thin-film transistor and improved the insulation reliability of the organic thin-film transistor only to a small extent. Furthermore, in a case in which the composition of Comparative example 3 that contained polymethyl methacrylate instead of the polymer compound (B) was used in the organic thin-film transistor, the improvement of the insulation reliability was not observed.

EXPLANATION OF REFERENCES

10: substrate
20: gate electrode
30: gate insulating film
40: source electrode
42: drain electrode
50: organic semiconductor layer
60: sealing layer
100, 200: organic thin-film transistor

What is claimed is:

1. An organic semiconductor composition comprising:
an organic semiconductor material (A); and
a polymer compound (B) containing a repeating unit represented by the following Formula (B),

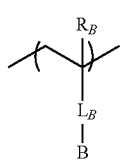

Formula (B)

(in Formula (B), $R_B$ represents a hydrogen atom or an alkyl group which has 1 to 4 carbon atoms and may have a substituent; $L_B$ represents a single bond or a divalent organic group; and B represents a monovalent group, which is formed as a result of removing one hydrogen atom (here, a hydrogen atom of a hydroxyl group is excluded) from compounds represented by the following Formulae (1), or a group represented by the following Formula (25)),

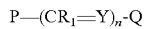    Formula (1)

(in Formula (1), each of P and Q independently represents OH, $NR_2R_3$, or $CHR_4R_5$; each of $R_2$ and $R_3$ independently represents a hydrogen atom or a group which can be substituted with a nitrogen atom; each of $R_4$ and $R_5$ independently represents a hydrogen atom or a substituent; Y represents $CR_6$ or a nitrogen atom; each of $R_1$ and $R_6$ independently represents a hydrogen atom or a substituent, at least two out of the groups represented by $R_1$, $R_2$, $R_3$, $R_4$, $R_5$, or $R_6$ may form a ring by being bonded to each other; n represents an integer of 0 to 5; when n is 0, P and Q do not represent $CHR_4R_5$ at the same time and do not represent OH at the same time; and when n represents a number which is equal to or greater than 2, a plurality of atomic groups represented by $(CR_1=Y)$ may be the same as or different from each other),

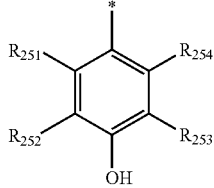    Formula (25)

(in Formula (25), each of $R_{251}$, $R_{252}$, $R_{253}$, and $R_{254}$ independently represents a hydrogen atom or a substituent wherein either or both of $R_{252}$ and $R_{253}$ represent an alkyl group or an alkoxy group; and * represents a binding position).

2. The organic semiconductor composition according to claim 1,
wherein the compound represented by Formula (6) is a compound represented by the following Formula (22),

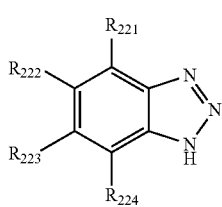    Formula (22)

(in Formula (22), each of $R_{221}$, $R_{222}$, $R_{223}$, and $R_{224}$ independently represents a hydrogen atom or a substituent).

3. The organic semiconductor composition according to claim 1,
wherein the compound represented by Formula (8) is a compound selected from the group consisting of the following Formulae (23a) to (23d),

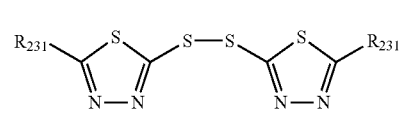    Formula (23a)

(in Formula (23a), $R_{231}$ represents a substituent, and a plurality of groups represented by $R_{231}$ may be the same as or different from each other),

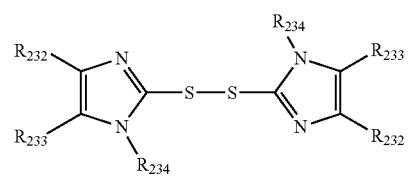    Formula (23b)

(in Formula (23b), each of $R_{232}$ and $R_{233}$ independently represents a hydrogen atom or a substituent; $R_{232}$ and $R_{233}$ may form a ring by being bonded to each other; $R_{234}$ represents a hydrogen atom or a group which can be substituted with a nitrogen atom; and a plurality of groups represented by each of $R_{232}$, $R_{233}$, and $R_{234}$ may be the same as or different from each other),

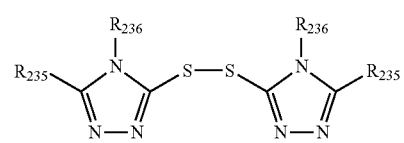    Formula (23c)

(in Formula (23c), $R_{235}$ represents a hydrogen atom or a substituent; $R_{236}$ represents a hydrogen atom or a group which can be substituted with a nitrogen atom; and a plurality of groups represented by each of $R_{235}$ and $R_{236}$ may be the same as or different from each other),

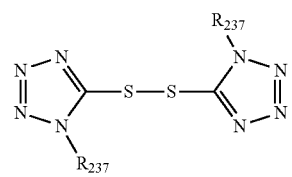    Formula (23d)

(in Formula (23d), $R_{237}$ represents a group which can be substituted with a nitrogen atom, and a plurality of groups represented by $R_{237}$ may be the same as or different from each other).

4. The organic semiconductor composition according to claim 1,
wherein the compound represented by Formula (1) is a compound selected from the group consisting of compounds represented by the following Formulae (1-6) to (1-21),

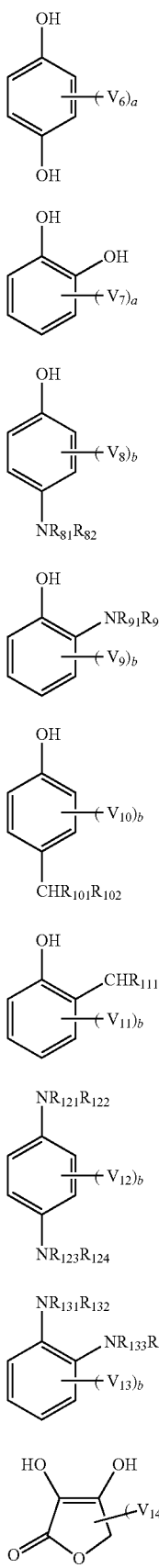

-continued

Formula (1-6)

Formula (1-7)

Formula (1-8)

Formula (1-9)

Formula (1-10)

Formula (1-11)

Formula (1-12)

Formula (1-13)

Formula (1-14)

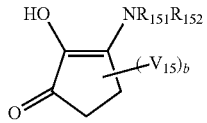

Formula (1-15)

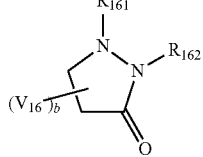

Formula (1-16)

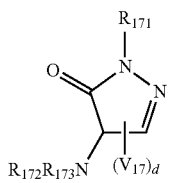

Formula (1-17)

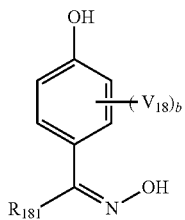

Formula (1-18)

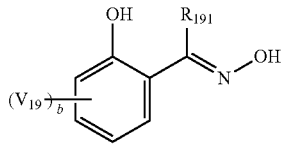

Formula (1-19)

$R_{201}R_{202}N-NR_{203}R_{204}$

Formula (1-20)

$R_{211}R_{212}N-OH$

Formula (1-21)

(in Formula (1-6), $V_6$ represents a substituent, and a represents an integer of 1 to 4, in Formula (1-7), $V_7$ represents a substituent, and a represents an integer of 1 to 4, in Formula (1-8), $V_8$ represents a substituent; each of $R_{81}$ and $R_{82}$ independently represents a hydrogen atom or a group which can be substituted with a nitrogen atom; and b represents an integer of 0 to 4, in Formula (1-9), $V_9$ represents a substituent; each of $R_{91}$ and $R_{92}$ independently represents a hydrogen atom or a group which can be substituted with a nitrogen atom; and b represents an integer of 0 to 4, in Formula (1-10), $V_{10}$ represents a substituent; each of $R_{101}$ and $R_{102}$ independently represents a hydrogen atom or a substituent; and b represents an integer of 0 to 4, in Formula (1-11), $V_{11}$ represents a substituent; each of $R_{111}$ and $R_{112}$ independently represents a hydrogen atom or a substituent; and b represents an integer of 0 to 4, in Formula (1-12), $V_{12}$ represents a substituent; each of $R_{121}$, $R_{122}$, $R_{123}$, and $R_{124}$ independently represents a hydrogen atom or a group which can be substituted with a nitrogen atom; and b represents an integer of 0 to 4, in Formula (1-13), $V_{13}$ represents a substituent; each of $R_{131}$, $R_{132}$, $R_{133}$, and $R_{134}$ independently represents a hydrogen atom or a group which can be substituted with a nitrogen atom; and b represents an integer of 0 to 4, in Formula (1-14), $V_{14}$ represents a substituent, and c represents an integer of 1 or 2, in Formula (1-15), $V_{15}$ represents a substituent; each of $R_{151}$ and $R_{152}$ independently represents a hydrogen atom or a group which can be substituted with a nitrogen atom; and b represents an integer of 0 to 4, in Formula (1-16), $V_{16}$ represents a substituent; each of $R_{161}$ and $R_{162}$ independently represents a hydrogen atom or a group which can be substituted with a nitrogen atom; and b represents an integer of 0 to 4, in Formula (1-17), $V_{17}$ represents a substituent; each of $R_{171}$, $R_{172}$, and $R_{173}$ independently represents a hydrogen atom or a group which can be substituted with a nitrogen atom; and d represents 0 or 1, in Formula (1-18), $V_{18}$ represents a substituent; $R_{181}$ represents a hydrogen atom or a substituent; and b represents an integer of 0 to 4, in Formula (1-19), $V_{19}$ represents a substituent; $R_{191}$ represents a hydrogen atom or a substituent; and b represents an integer of 0 to 4, in Formula (1-20), each of $R_{201}$, $R_{202}$, $R_{203}$, and $R_{204}$ independently represents a hydrogen atom or a group which can be substituted with a nitrogen atom, and in Formula (1-21), each of $R_{211}$ and $R_{212}$ independently represents a hydrogen atom or a group which can be substituted with a nitrogen atom).

5. The organic semiconductor composition according to claim 1,
wherein the compound represented by Formula (5) is a compound selected from the group consisting of compounds represented by the following Formulae (51) to (54),

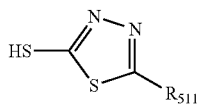
Formula (51)

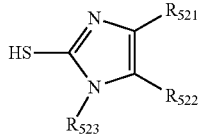
Formula (52)

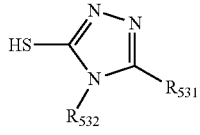
Formula (53)

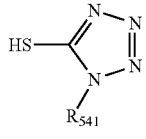
Formula (54)

(in Formula (51), $R_{511}$ represents a substituent, in Formula (52), each of $R_{521}$ and $R_{522}$ independently represents a hydrogen atom or a substituent; $R_{521}$ and $R_{522}$ may form a ring by being bonded to each other; and $R_{523}$ represents a hydrogen atom or a group which can be substituted with a nitrogen atom, in Formula (53), $R_{531}$ represents a hydrogen atom or a substituent, and $R_{532}$ represents a hydrogen atom or a group which can be substituted with a nitrogen atom, and in Formula (54), $R_{541}$ represents a group which can be substituted with a nitrogen atom).

6. The organic semiconductor composition according to claim 1,
wherein in Formula (B), B represents a monovalent group, which is formed as a result of removing one hydrogen atom (herein, a hydrogen atom of a hydroxyl group is excluded) from the compound represented by Formula (1) or (6), or the group represented by Formula (25).

7. The organic semiconductor composition according to claim 1,
wherein a weight average molecular weight of the polymer compound (B) is equal to or greater than 5,000.

8. The organic semiconductor composition according to claim 1,
wherein a molecular weight of the organic semiconductor material (A) is equal to or less than 2,000.

9. An organic thin-film transistor prepared by using the organic semiconductor composition according to claim 1.

10. Electronic paper using the organic thin-film transistor according to claim 9.

11. A display device using the organic thin-film transistor according to claim 9.

12. The organic semiconductor composition according to claim 2,
wherein the compound represented by Formula (8) is a compound selected from the group consisting of the following Formulae (23a) to (23d),

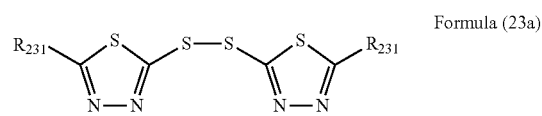
Formula (23a)

(in Formula (23a), $R_{231}$ represents a substituent, and a plurality of groups represented by $R_{231}$ may be the same as or different from each other),

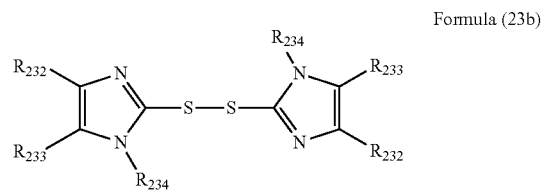
Formula (23b)

(in Formula (23b), each of $R_{232}$ and $R_{233}$ independently represents a hydrogen atom or a substituent; $R_{232}$ and $R_{233}$ may form a ring by being bonded to each other; $R_{234}$ represents a hydrogen atom or a group which can be substituted with a nitrogen atom; and a plurality of groups represented by each of $R_{232}$, $R_{233}$, and $R_{234}$ may be the same as or different from each other), Formula (23c)

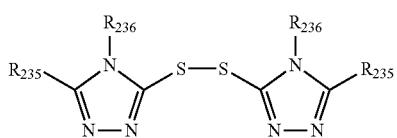

(in Formula (23c), $R_{235}$ represents a hydrogen atom or a substituent; $R_{236}$ represents a hydrogen atom or a group which can be substituted with a nitrogen atom; and a plurality of groups represented by each of $R_{235}$ and $R_{236}$ may be the same as or different from each other), Formula (23d)

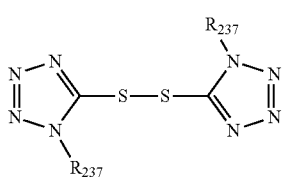

(in Formula (23d), $R_{237}$ represents a group which can be substituted with a nitrogen atom, and a plurality of groups represented by $R_{237}$ may be the same as or different from each other).

13. The organic semiconductor composition according to claim 2,
wherein the compound represented by Formula (1) is a compound selected from the group consisting of compounds represented by the following Formulae (1-6) to (1-21), Formula (1-6)

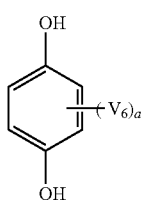

Formula (1-7)

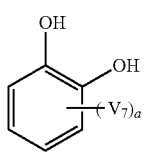

Formula (1-8)

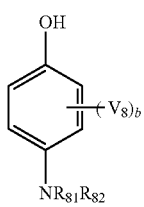

Formula (1-9)

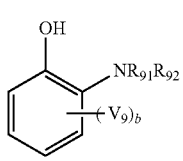

Formula (1-10)

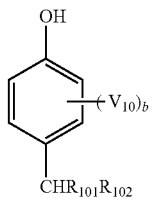

Formula (1-11)

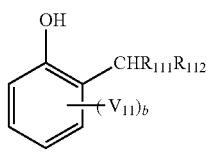

Formula (1-12)

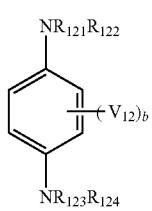

Formula (1-13)

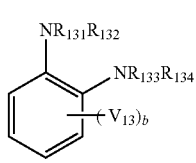

Formula (1-14)

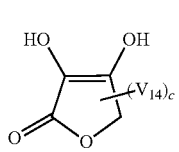

Formula (1-15)

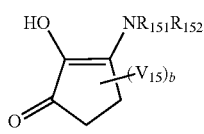

Formula (1-16)

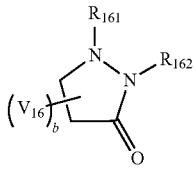

Formula (1-17)

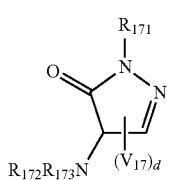

Formula (1-18)

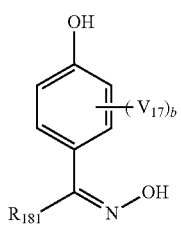

-continued

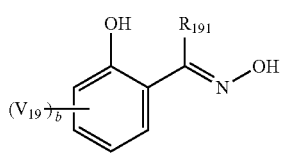
Formula (1-19)

R$_{201}$R$_{202}$N—NR$_{203}$R$_{204}$   Formula (1-20)

R$_{211}$R$_{212}$N—OH   Formula (1-21)

(in Formula (1-6), V$_6$ represents a substituent, and a represents an integer of 1 to 4, in Formula (1-7), V$_7$ represents a substituent, and a represents an integer of 1 to 4, in Formula (1-8), V$_8$ represents a substituent; each of R$_{81}$ and R$_{82}$ independently represents a hydrogen atom or a group which can be substituted with a nitrogen atom; and b represents an integer of 0 to 4, in Formula (1-9), V$_9$ represents a substituent; each of R$_{91}$ and R$_{92}$ independently represents a hydrogen atom or a group which can be substituted with a nitrogen atom; and b represents an integer of 0 to 4, in Formula (1-10), V$_{10}$ represents a substituent; each of R$_{101}$ and R$_{102}$ independently represents a hydrogen atom or a substituent; and b represents an integer of 0 to 4, in Formula (1-11), V$_{11}$ represents a substituent; each of R$_{111}$ and R$_{112}$ independently represents a hydrogen atom or a substituent; and b represents an integer of 0 to 4, in Formula (1-12), V$_{12}$ represents a substituent; each of R$_{121}$, R$_{122}$, R$_{123}$, and R$_{124}$ independently represents a hydrogen atom or a group which can be substituted with a nitrogen atom; and b represents an integer of 0 to 4, in Formula (1-13), V$_{13}$ represents a substituent; each of R$_{131}$, R$_{132}$, R$_{133}$, and R$_{134}$ independently represents a hydrogen atom or a group which can be substituted with a nitrogen atom; and b represents an integer of 0 to 4, in Formula (1-14), V$_{14}$ represents a substituent, and c represents an integer of 1 or 2, in Formula (1-15), V$_{15}$ represents a substituent; each of R$_{151}$ and R$_{152}$ independently represents a hydrogen atom or a group which can be substituted with a nitrogen atom; and b represents an integer of 0 to 4, in Formula (1-16), V$_{16}$ represents a substituent; each of R$_{161}$ and R$_{162}$ independently represents a hydrogen atom or a group which can be substituted with a nitrogen atom; and b represents an integer of 0 to 4, in Formula (1-17), V$_{17}$ represents a substituent; each of R$_{171}$, R$_{172}$, and R$_{173}$ independently represents a hydrogen atom or a group which can be substituted with a nitrogen atom; and d represents 0 or 1, in Formula (1-18), V$_{18}$ represents a substituent; R$_{181}$ represents a hydrogen atom or a substituent; and b represents an integer of 0 to 4, in Formula (1-19), V$_{19}$ represents a substituent; R$_{191}$ represents a hydrogen atom or a substituent; and b represents an integer of 0 to 4, in Formula (1-20), each of R$_{201}$, R$_{202}$, R$_{203}$, and R$_{204}$ independently represents a hydrogen atom or a group which can be substituted with a nitrogen atom, and in Formula (1-21), each of R$_{211}$ and R$_{212}$ independently represents a hydrogen atom or a group which can be substituted with a nitrogen atom).

14. The organic semiconductor composition according to claim 2, wherein a weight average molecular weight of the polymer compound (B) is equal to or greater than 5,000.

15. The organic semiconductor composition according to claim 2, wherein a molecular weight of the organic semiconductor material (A) is equal to or less than 2,000.

16. The organic semiconductor composition according to claim 3, wherein the compound represented by Formula (1) is a compound selected from the group consisting of compounds represented by the following Formulae (1-6) to (1-21),

Formula (1-6)

Formula (1-7)

Formula (1-8)

Formula (1-9)

Formula (1-10)

Formula (1-11)

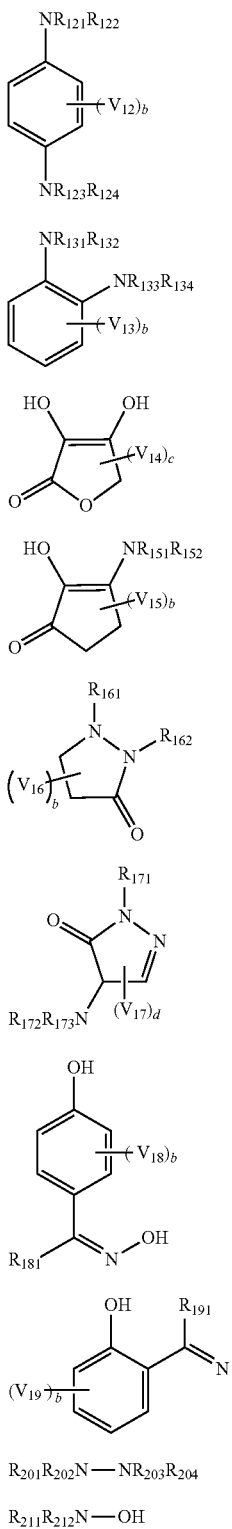

Formula (1-12)
Formula (1-13)
Formula (1-14)
Formula (1-15)
Formula (1-16)
Formula (1-17)
Formula (1-18)
Formula (1-19)
Formula (1-20)
Formula (1-21)

(in Formula (1-6), $V_6$ represents a substituent, and a represents an integer of 1 to 4, in Formula (1-7), $V_7$ represents a substituent, and a represents an integer of 1 to 4, in Formula (1-8), $V_8$ represents a substituent; each of $R_{81}$ and $R_{82}$ independently represents a hydrogen atom or a group which can be substituted with a nitrogen atom; and b represents an integer of 0 to 4, in Formula (1-9), $V_9$ represents a substituent; each of $R_{91}$ and $R_{92}$ independently represents a hydrogen atom or a group which can be substituted with a nitrogen atom; and b represents an integer of 0 to 4, in Formula (1-10), $V_{10}$ represents a substituent; each of $R_{101}$ and $R_{102}$ independently represents a hydrogen atom or a substituent; and b represents an integer of 0 to 4, in Formula (1-11), $V_{11}$ represents a substituent; each of $R_{111}$ and $R_{112}$ independently represents a hydrogen atom or a substituent; and b represents an integer of 0 to 4, in Formula (1-12), $V_{12}$ represents a substituent; each of $R_{121}$, $R_{122}$, $R_{123}$, and $R_{124}$ independently represents a hydrogen atom or a group which can be substituted with a nitrogen atom; and b represents an integer of 0 to 4, in Formula (1-13), $V_{13}$ represents a substituent; each of $R_{131}$, $R_{132}$, $R_{133}$, and $R_{134}$ independently represents a hydrogen atom or a group which can be substituted with a nitrogen atom; and b represents an integer of 0 to 4, in Formula (1-14), $V_{14}$ represents a substituent, and c represents an integer of 1 or 2, in Formula (1-15), $V_{15}$ represents a substituent; each of $R_{151}$ and $R_{152}$ independently represents a hydrogen atom or a group which can be substituted with a nitrogen atom; and b represents an integer of 0 to 4, in Formula (1-16), $V_{16}$ represents a substituent; each of $R_{161}$ and $R_{162}$ independently represents a hydrogen atom or a group which can be substituted with a nitrogen atom; and b represents an integer of 0 to 4, in Formula (1-17), $V_{17}$ represents a substituent; each of $R_{171}$, $R_{172}$, and $R_{173}$ independently represents a hydrogen atom or a group which can be substituted with a nitrogen atom; and d represents 0 or 1, in Formula (1-18), $V_{18}$ represents a substituent; $R_{181}$ represents a hydrogen atom or a substituent; and b represents an integer of 0 to 4, in Formula (1-19), $V_{19}$ represents a substituent; $R_{191}$ represents a hydrogen atom or a substituent; and b represents an integer of 0 to 4, in Formula (1-20), each of $R_{201}$, $R_{202}$, $R_{203}$, and $R_{204}$ independently represents a hydrogen atom or a group which can be substituted with a nitrogen atom, and in Formula (1-21), each of $R_{211}$ and $R_{212}$ independently represents a hydrogen atom or a group which can be substituted with a nitrogen atom).

17. The organic semiconductor composition according to claim 3,
wherein a weight average molecular weight of the polymer compound (B) is equal to or greater than 5,000.

18. The organic semiconductor composition according to claim 3,
wherein a molecular weight of the organic semiconductor material (A) is equal to or less than 2,000.

19. The organic semiconductor composition according to claim 4,
wherein a weight average molecular weight of the polymer compound (B) is equal to or greater than 5,000.

20. The organic semiconductor composition according to claim 4, wherein a molecular weight of the organic semiconductor material (A) is equal to or less than 2,000.

* * * * *